(12) United States Patent
Lin

(10) Patent No.: US 11,764,153 B1
(45) Date of Patent: Sep. 19, 2023

(54) INTERCONNECT STRUCTURE AND MANUFACTURING METHOD FOR THE SAME

(71) Applicant: Chun-Ming Lin, Hsinchu County (TW)

(72) Inventor: Chun-Ming Lin, Hsinchu County (TW)

( * ) Notice: Subject to any disclaimer, the term of this patent is extended or adjusted under 35 U.S.C. 154(b) by 63 days.

(21) Appl. No.: 17/815,613

(22) Filed: Jul. 28, 2022

(51) Int. Cl.
*H01L 23/538* (2006.01)
*H01L 23/528* (2006.01)
*H01L 23/522* (2006.01)
*H01L 21/768* (2006.01)

(52) U.S. Cl.
CPC .... *H01L 23/5283* (2013.01); *H01L 21/76816* (2013.01); *H01L 21/76834* (2013.01); *H01L 21/76877* (2013.01); *H01L 23/5226* (2013.01)

(58) Field of Classification Search
CPC .......... H01L 23/5283; H01L 21/76816; H01L 21/76834; H01L 21/76877; H01L 23/5226
See application file for complete search history.

(56) References Cited

U.S. PATENT DOCUMENTS

| 6,013,578 A | 1/2000 | Jun |
| 6,969,915 B2 | 11/2005 | Tago et al. |
| 10,529,622 B1 * | 1/2020 | Maniscalco ....... H01L 21/76858 |
| 2006/0170114 A1 | 8/2006 | Su |
| 2011/0101521 A1 | 5/2011 | Hwang |
| 2020/0411441 A1 * | 12/2020 | Darmawikarta .... H01L 23/5381 |

FOREIGN PATENT DOCUMENTS

| CN | 101361174 A | 2/2009 |
| CN | 101574663 A | 11/2009 |
| CN | 102064154 B | 10/2012 |
| CN | 103887494 B | 11/2015 |
| CN | 105895886 B | 9/2018 |
| TW | I591881 B | 7/2017 |

OTHER PUBLICATIONS

Taro Kuwano et al., "Performance enhancement of ZnSnP2 solar cells by a Cu3P back buffer layer," Solar Energy Materials and Solar Cells, vol. 221, 110891, 2021.
Taro Kuwano et al.,"Improvement of Ohmic Behavior of Back Contact in ZnSnP2 Solar Cells by Inserting Cu3P," 2019 IEEE 46th Photovoltaic Specialists Conference (PVSC), 2019, pp. 3007-3009, doi: 10.1109/PVSC40753.2019.8980788.

(Continued)

*Primary Examiner* — Karen Kusumakar
(74) *Attorney, Agent, or Firm* — WPAT, P.C., INTELLECTUAL PROPERTY ATTORNEYS; Anthony King

(57) ABSTRACT

The present disclosure provides an interconnect structure and a method for forming an interconnect structure. The interconnect structure includes a first metal line, a first interlayer dielectric (ILD) layer over the first metal line, a first conductive feature over the first metal line, wherein at least a portion of the first conductive feature is laterally surrounded by the first ILD layer, and a sidewall of the first conductive feature has a corrugated profile.

25 Claims, 57 Drawing Sheets

(56) References Cited

OTHER PUBLICATIONS

Taro Kuwano et al.,"Impact of structure on carrier transport behavior at the interface between electrode and ZnSnP2 absorber," 2018 IEEE 7th World Conference on Photovoltaic Energy Conversion (WCPEC) (A Joint Conference of 45th IEEE PVSC, 28th PVSEC & 34th EU PVSEC), 2018, pp. 2998-2999, doi: 10.1109/PVSC.2018.8547478.
Alexander Wolff et al., "Resource-Efficient High-Yield Ionothermal Synthesis of Microcrystalline Cu3—xP", Inorganic Chemistry, vol. 55(17), pp. 8844-8851, 2016.
Jennifer Ann Aitken et al., "Solvothermal syntheses of Cu3P via reactions of amorphous red phosphorus with a variety of copper sources, Journal of Solid State Chemistry", vol. 178(4), pp. 970-975, 2005.
Shuling Liu et al., "Synthesis and characterization of hollow spherical copper phosphide (Cu3P) nanopowders", vol. 148, Issues 11-12, pp. 438-440, 2009.
Nopparuj Kochaputi et al., "Roles of supports on reducibility and activities of Cu3P catalysts for deoxygenation of pleic acid: In situ XRD and XAS studies", Molecular Catalysis, Feb. 12, 2021.
Daniel Torres et al., "Electrochemical formation of copper phosphide from aqueous solutions of Cu(II) and hypophosphite ions", Electrochimica Acta, Sep. 10, 2020, vol. 354.
Shuling Liu et al., "Surfactant-assisted synthesis and electrochemical performances of Cu3P dendrites", Materials Research Bulletin, Nov. 2012, pp. 3352-3356, vol. 47, Issue 11.
B. Mauvernay et al., "Redox mechanism in the binary transition metal phosphide Cu3P", Journal of Physics and Chemistry of Solids, 2006, p. 1252-1257, vol. 67.
Heriberto Pfeiffer et al., "Synthesis, characterization and electrochemical properties of copper phosphide (Cu3P) thick films prepared by solid-state reaction at low temperature: a probable anode for lithium ion batteries", Electrochimica Acta, 2005, p. 4763-4770, vol. 50.
Subodh Kumar et al., "Three-Dimensional Graphene-Decorated Copper-Phosphide (Cu3P@3DG) Heterostructure as an Effective Electrode for a Supercapacitor", Frontiers in Materials, 2020, Article 30, vol. 7.
English Abstact of CN101574663A.
English Abstract of CN103887494B.
English Abstract of CN105895886B.
English Abstract of TWI591881B.
R. Colin Johnson, "With Alkaline Chemistry, Copper Could Be Forever", EE Times, Dec. 2017 ( https://www.eetimes.com/with-alkaline-chemistry-copper-could-be-forever/#).
L. Caillard et al., "Investigation of Cu/TaN and Co/TaN Barrier-Seed Oxidation by Acidic and Alkaline Copper Electroplating Chemistry for Damascene Applications", Journal of the Electrochemical Society, vol. 165, No. 10, Jul. 19, 2018.
Minchali Metal Industry Co., Ltd., "Minchali Metal Industry Co., Ltd. product" ( http://www.minchali.com.tw/products?id=1 ), provided with translation.
Hurricane Chemicals Co., Ltd., "520 Acid Plated Copper brightener (Acid Copper)" ( http://www.hurricane.com.tw/catalog/520.pdf), provided with translation.
Surtek, Pyrophosphate Copper Plating Process ( http://www.surtek.com.tw/new_page_51.htm , http://www.surtek.com.tw/new_page_15.htm).
Minchali Metal Industry Co., Ltd., "Minchali Product Pamphlet", Jan. 2015.
Sun Wing Technology Company, "Pyrophosphate Copper Plating", provided with translation.
Alexander Wolff et al., "Low-Temperature Tailoring of Copper-Deficient Cu3—xP—Electric Properties, Phase Transitions and Performance in Lithium-Ion Batteries", Chemistry of Materials, 2018.
Tu, "Applied Material launched new CVD PVD technology", Chinatimes CTEE, Jun. 9, 2014, provided with translation.
English Abstract of CN101361174A.
T.R. Yew et al., "Metal interconnect technology", Journal of Electronics and Materials Issue No. 24th, pp. 84-pp. 88, 2004.
Chia-Hao Cheng et al., "The Development and Constituents Analysis of Tin Palladium Solution used in Electroless Copper Nickel Plating", 2018.
Lo et al., "Effects of Additives on Filling Performance in Copper Electroplating and Conformal Copper Deposition in High-Aspect Ratio Trenches by Electroless Plating", 2007, pp. 1-32.
Lo et al., "Effects of Additives on Filling Performance in Copper Electroplating and Conformal Copper Deposition in High-Aspect Ratio Trenches by Electroless Plating", 2007, pp. 33-68.
Lo et al., "Effects of Additives on Filling Performance in Copper Electroplating and Conformal Copper Deposition in High-Aspect Ratio Trenches by Electroless Plating", 2007, pp. 33-50.
Lo et al., "Effects of Additives on Filling Performance in Copper Electroplating and Conformal Copper Deposition in High-Aspect Ratio Trenches by Electroless Plating", 2007, pp. 51-68.
Office Action and search report dated Jun. 8, 2023 by USPTO for U.S. Appl. No. 17/697,937.

\* cited by examiner

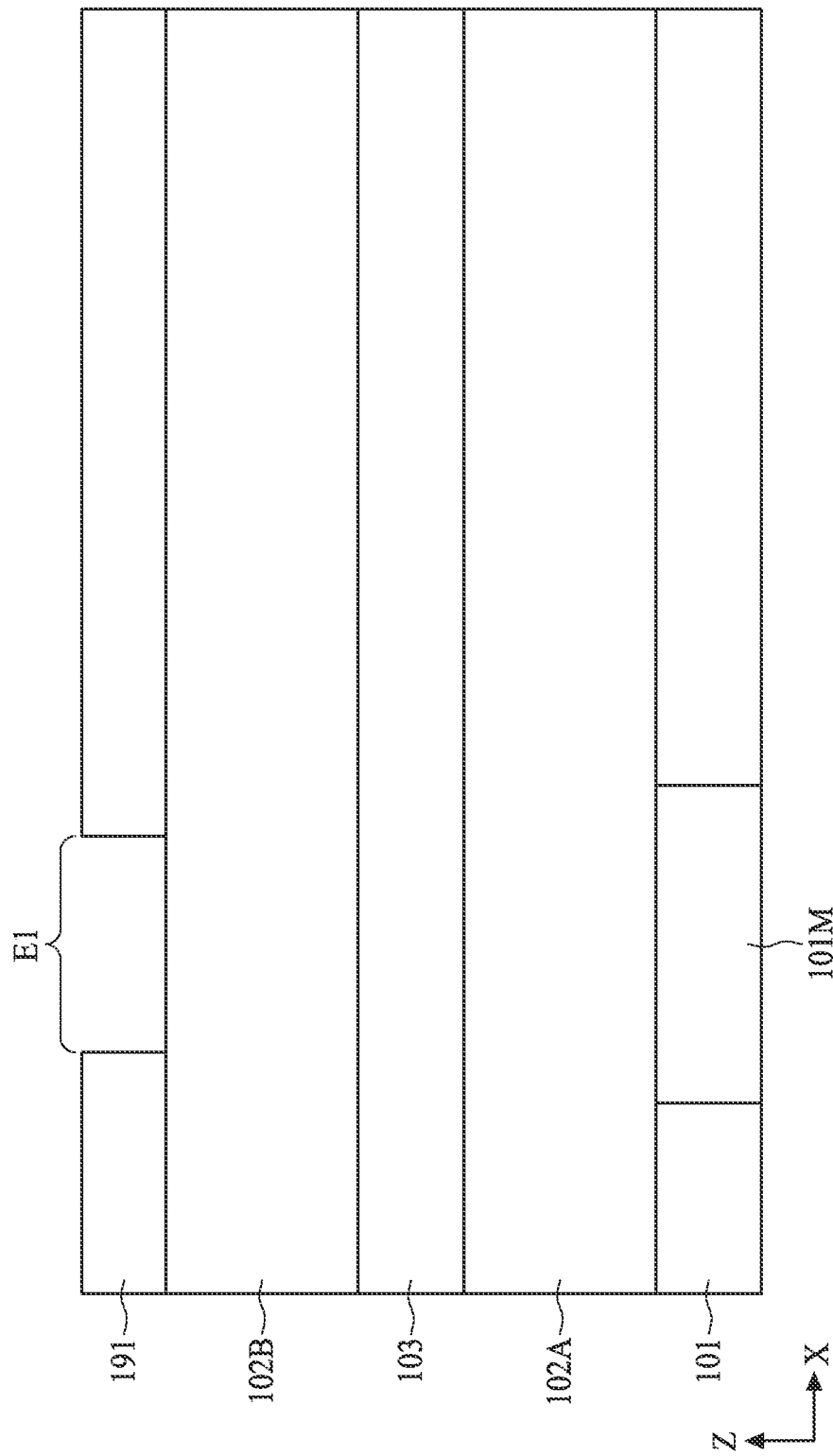

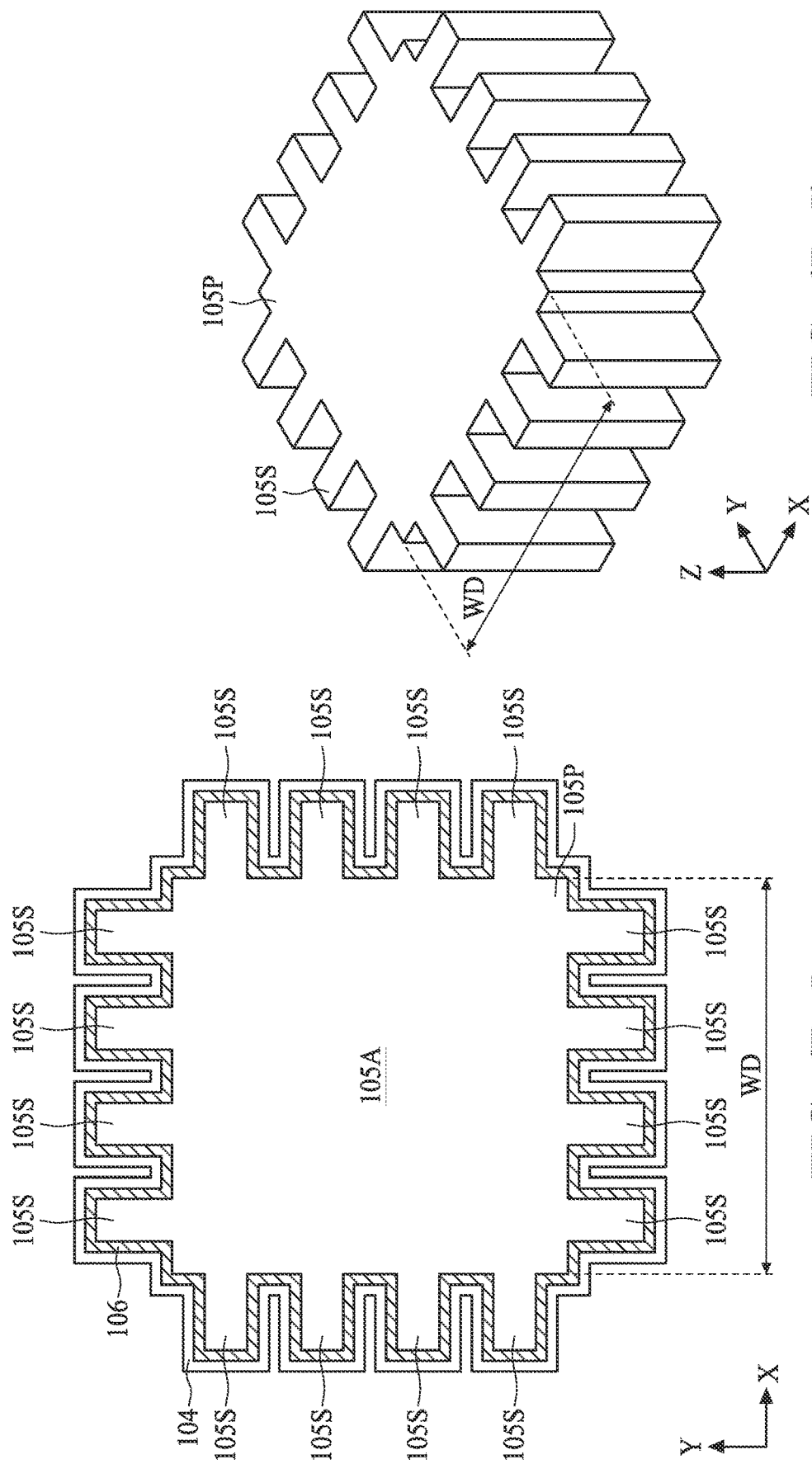

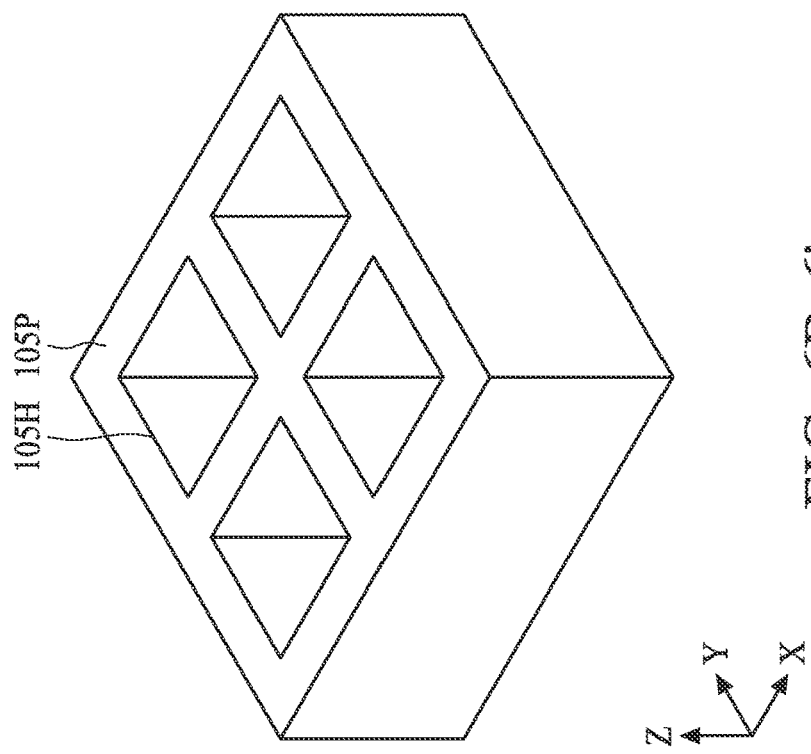
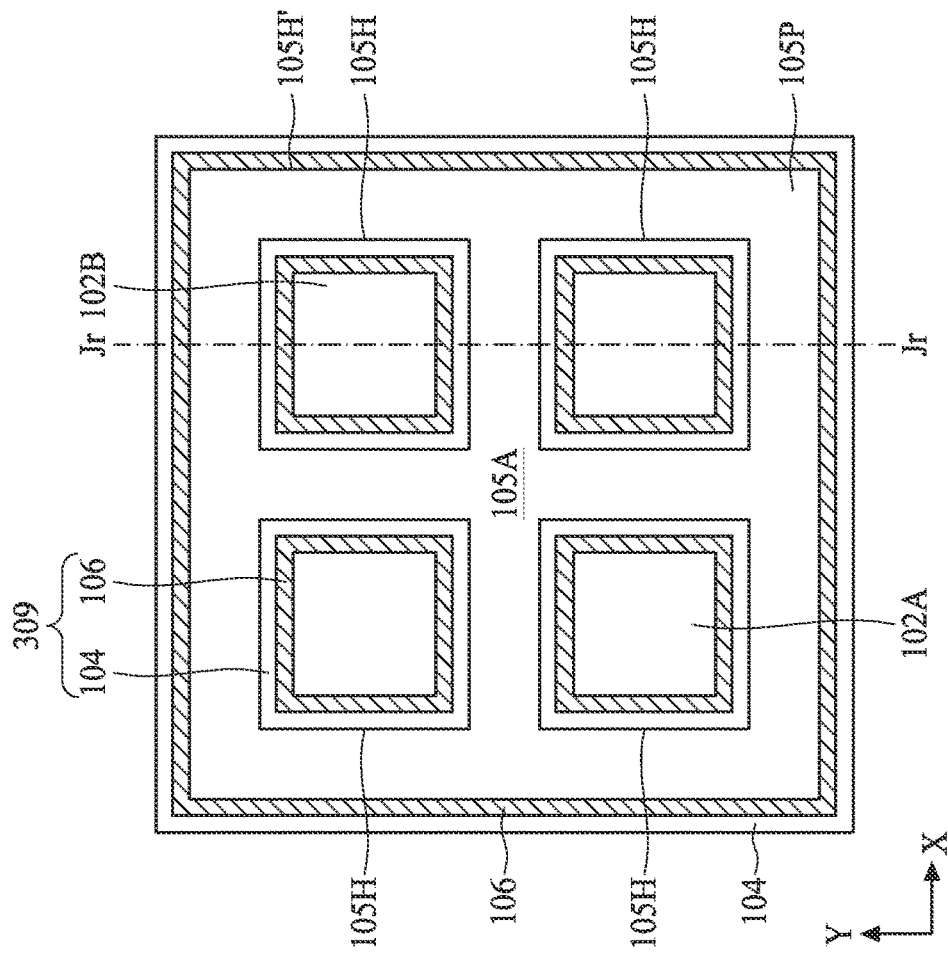
FIG. 6B-6'
FIG. 6B-6

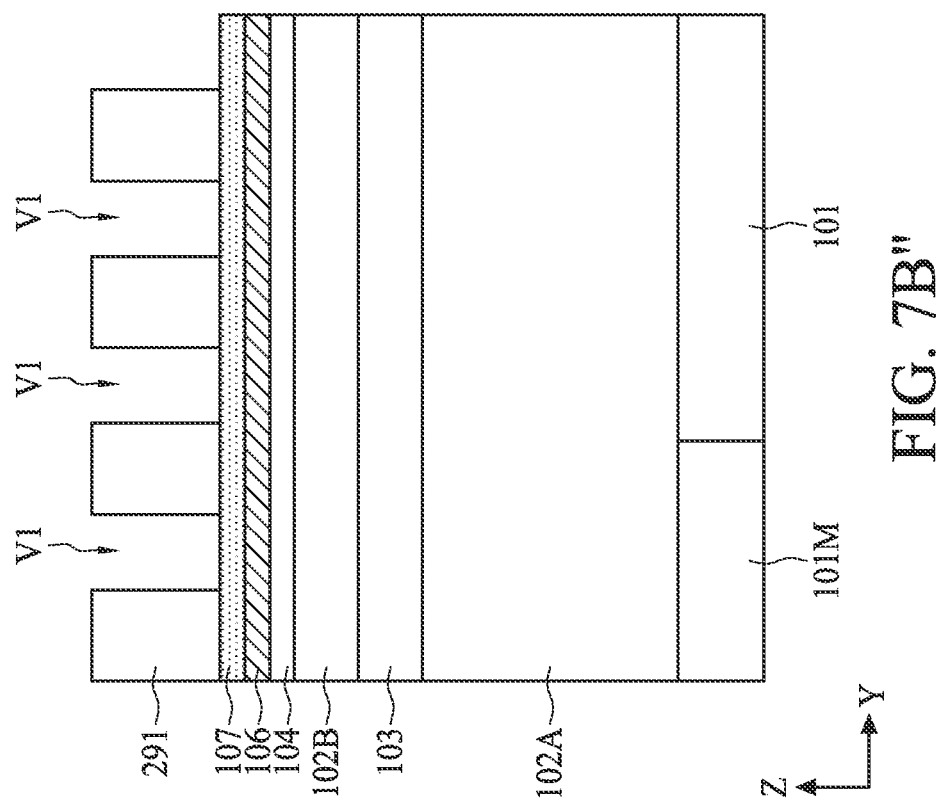
FIG. 7B"

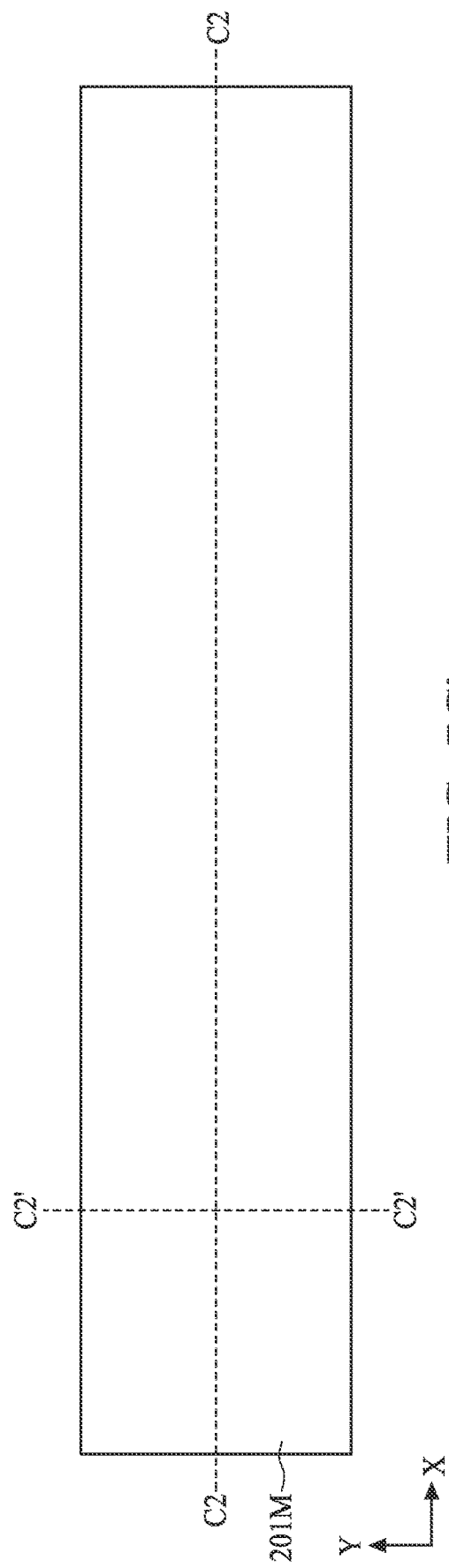

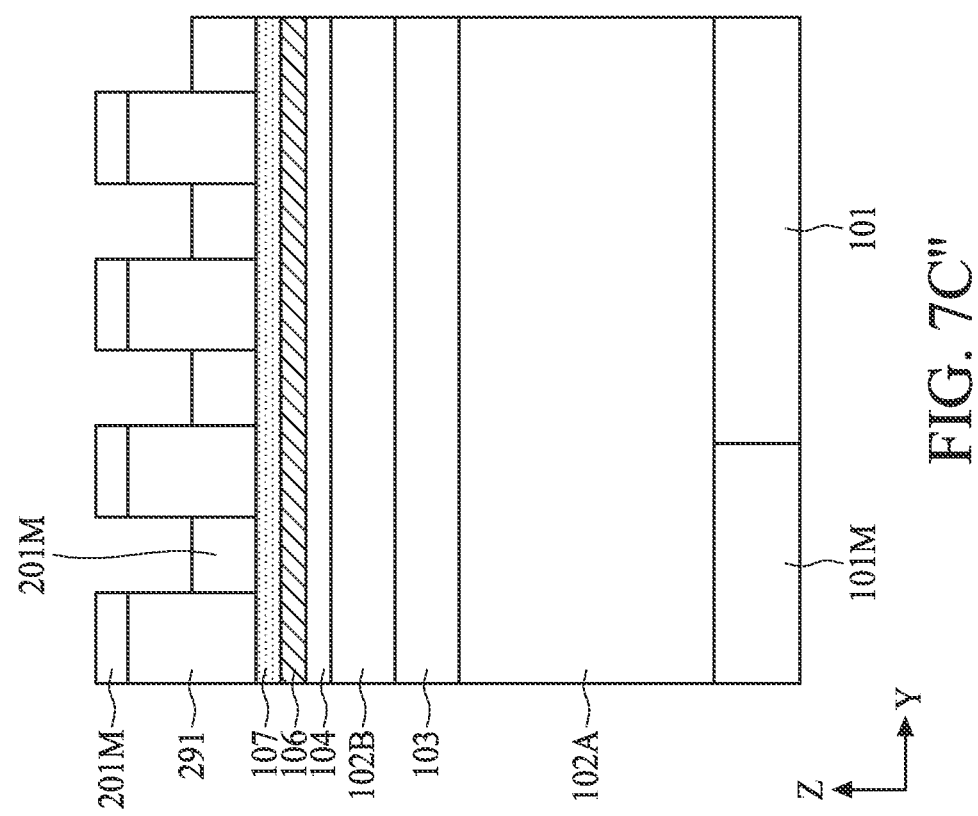
FIG. 7C"

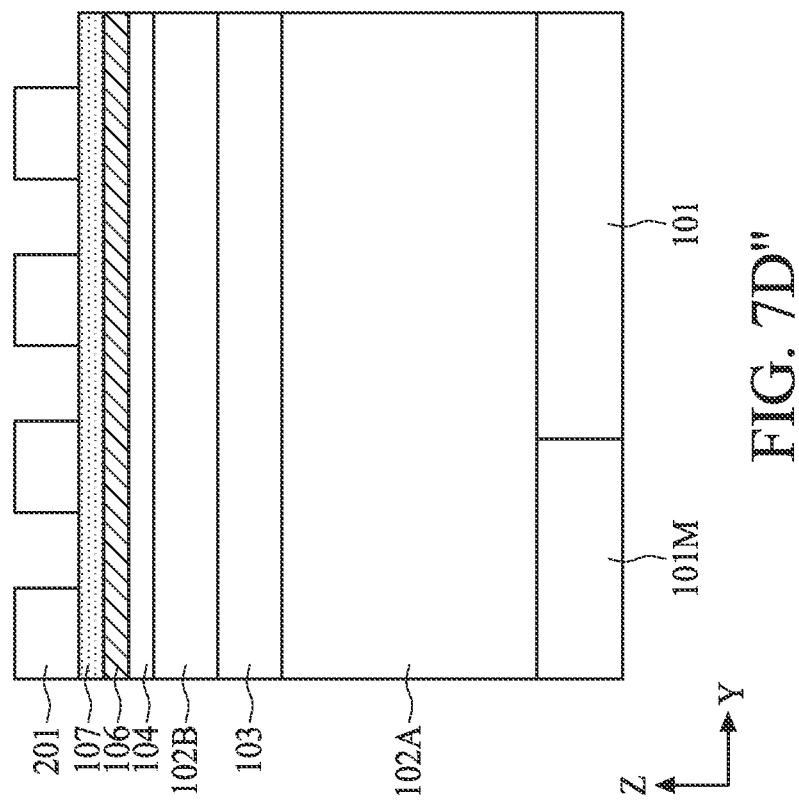

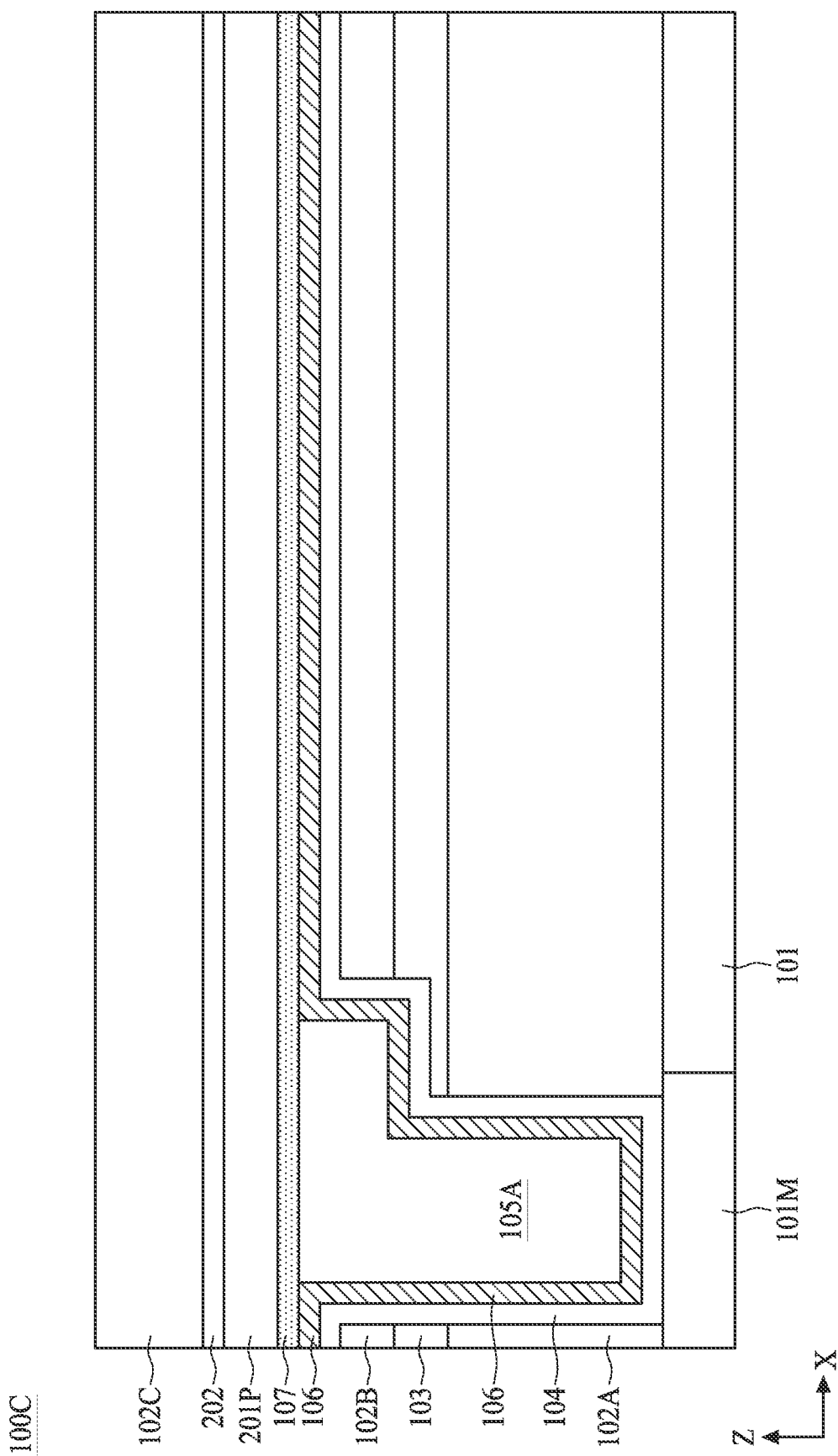

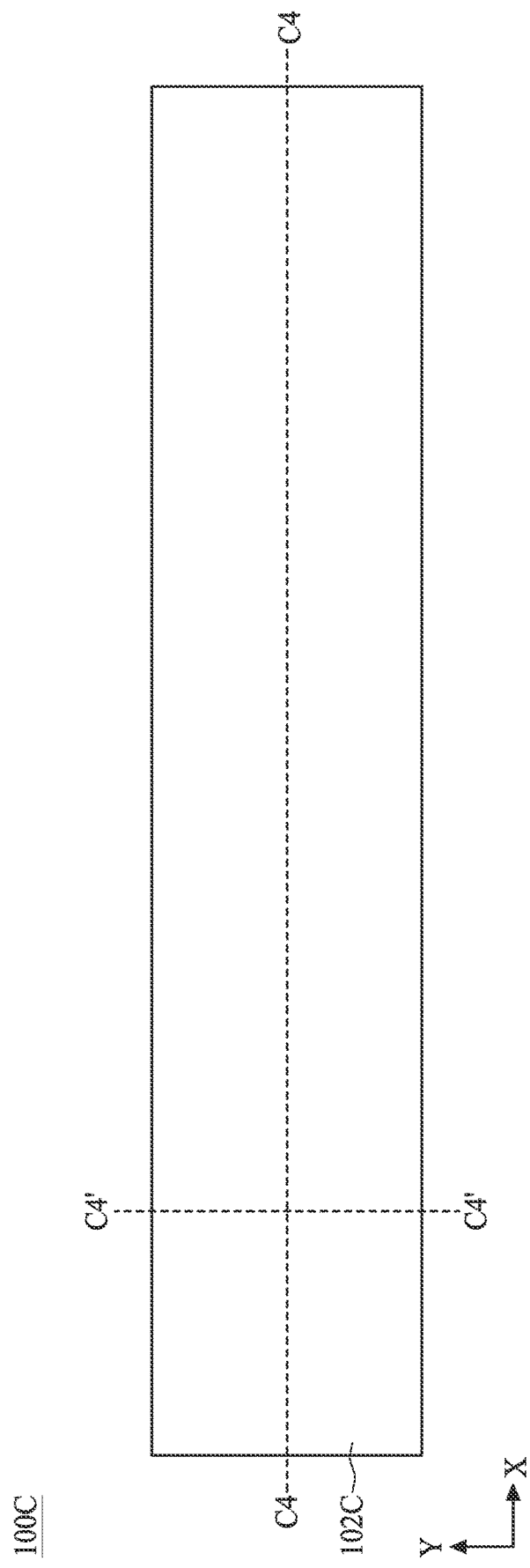

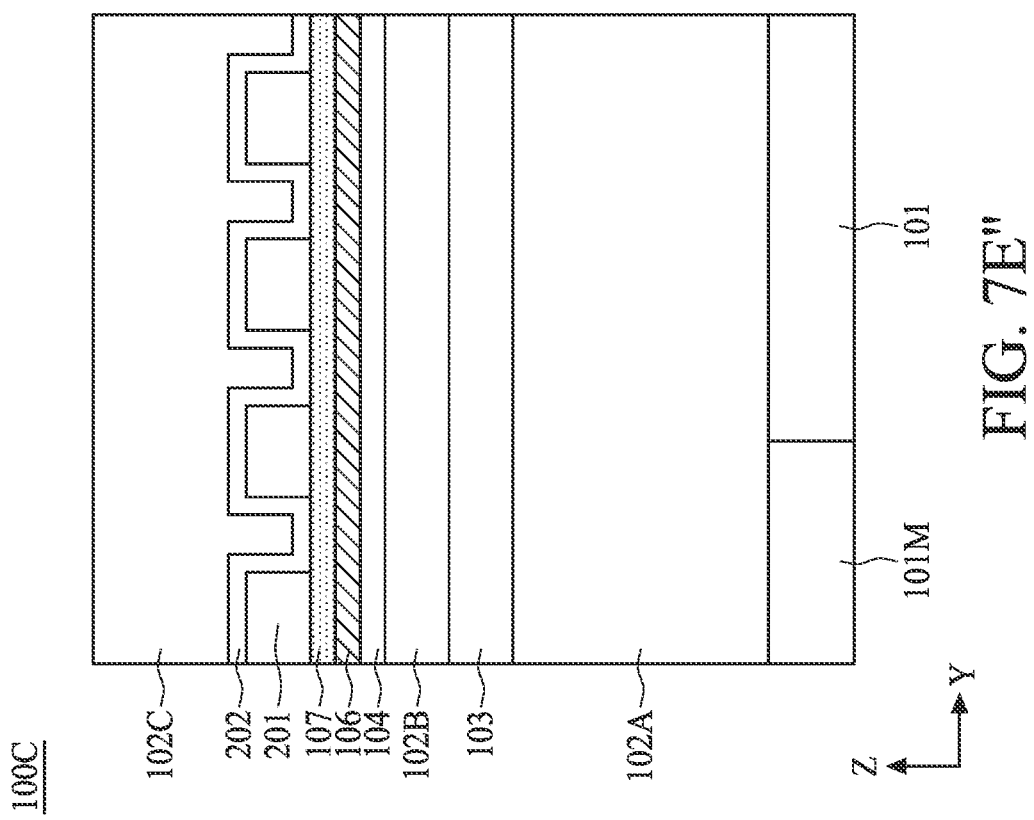
FIG. 7E"

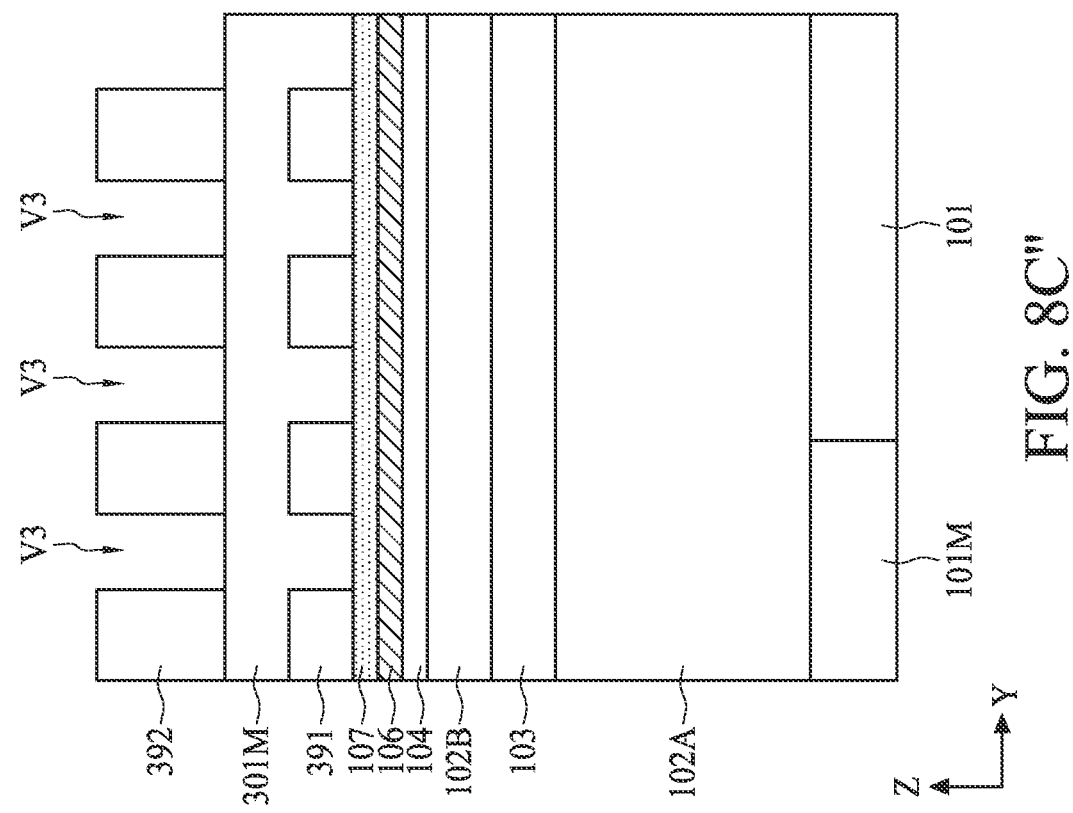

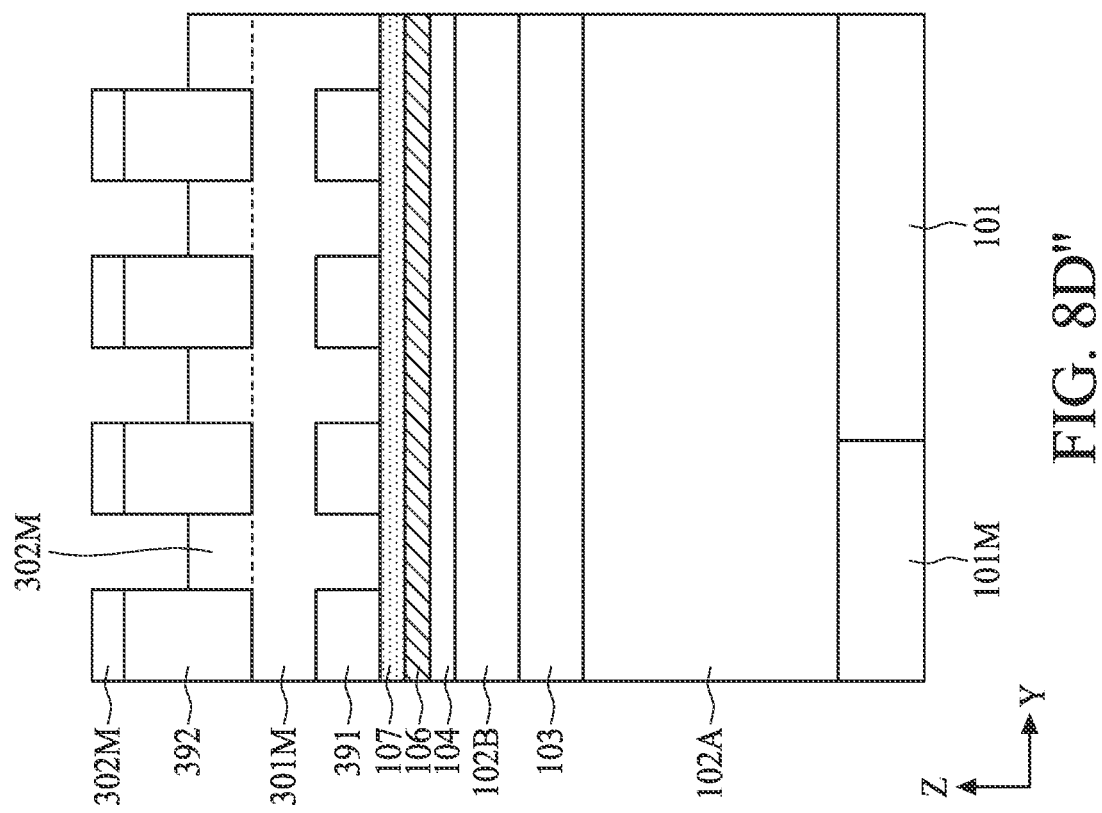

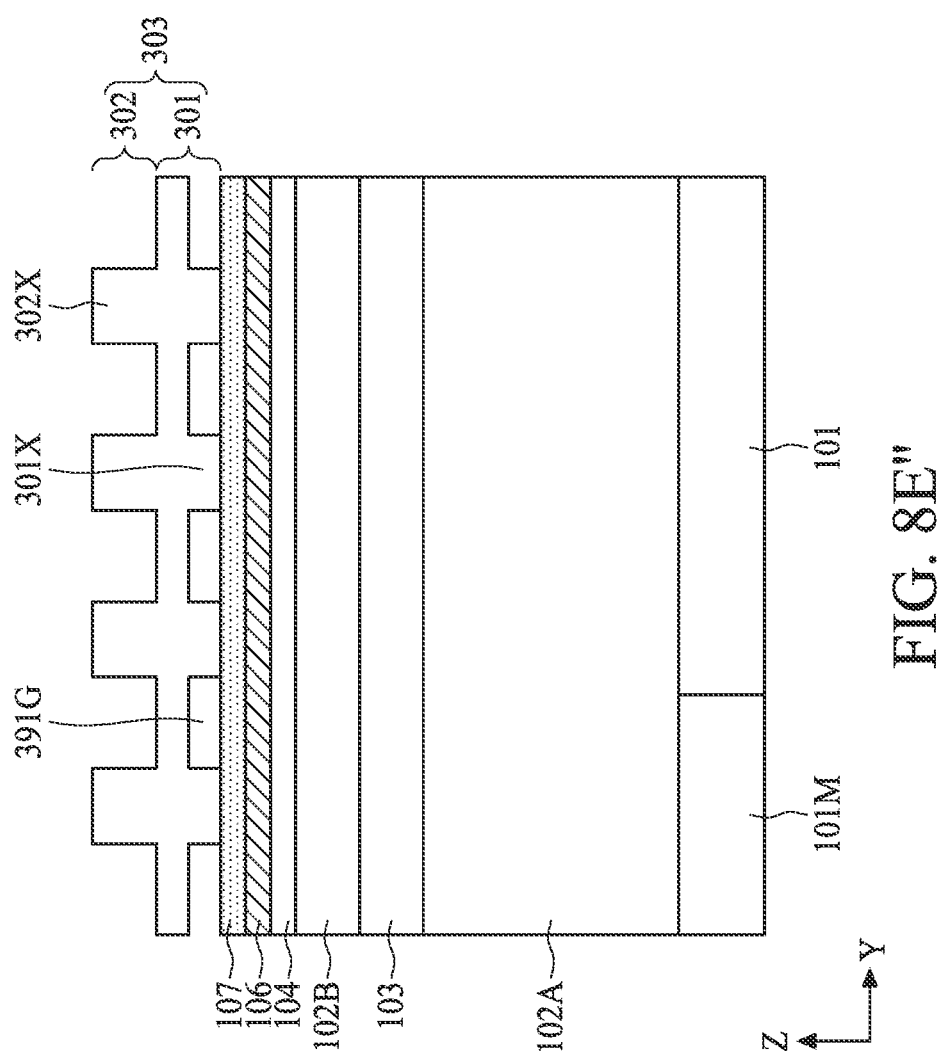
FIG. 8E"

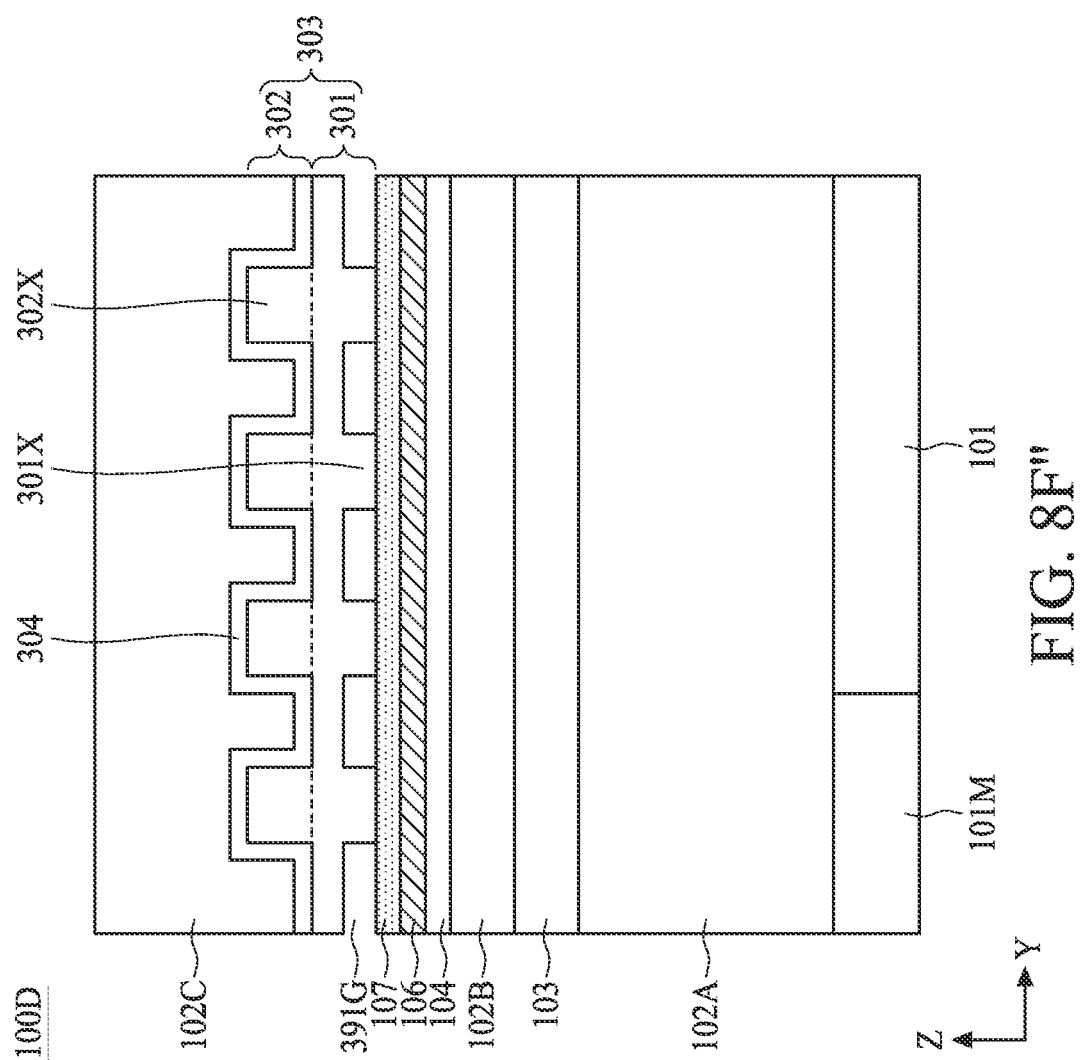
FIG. 8F"

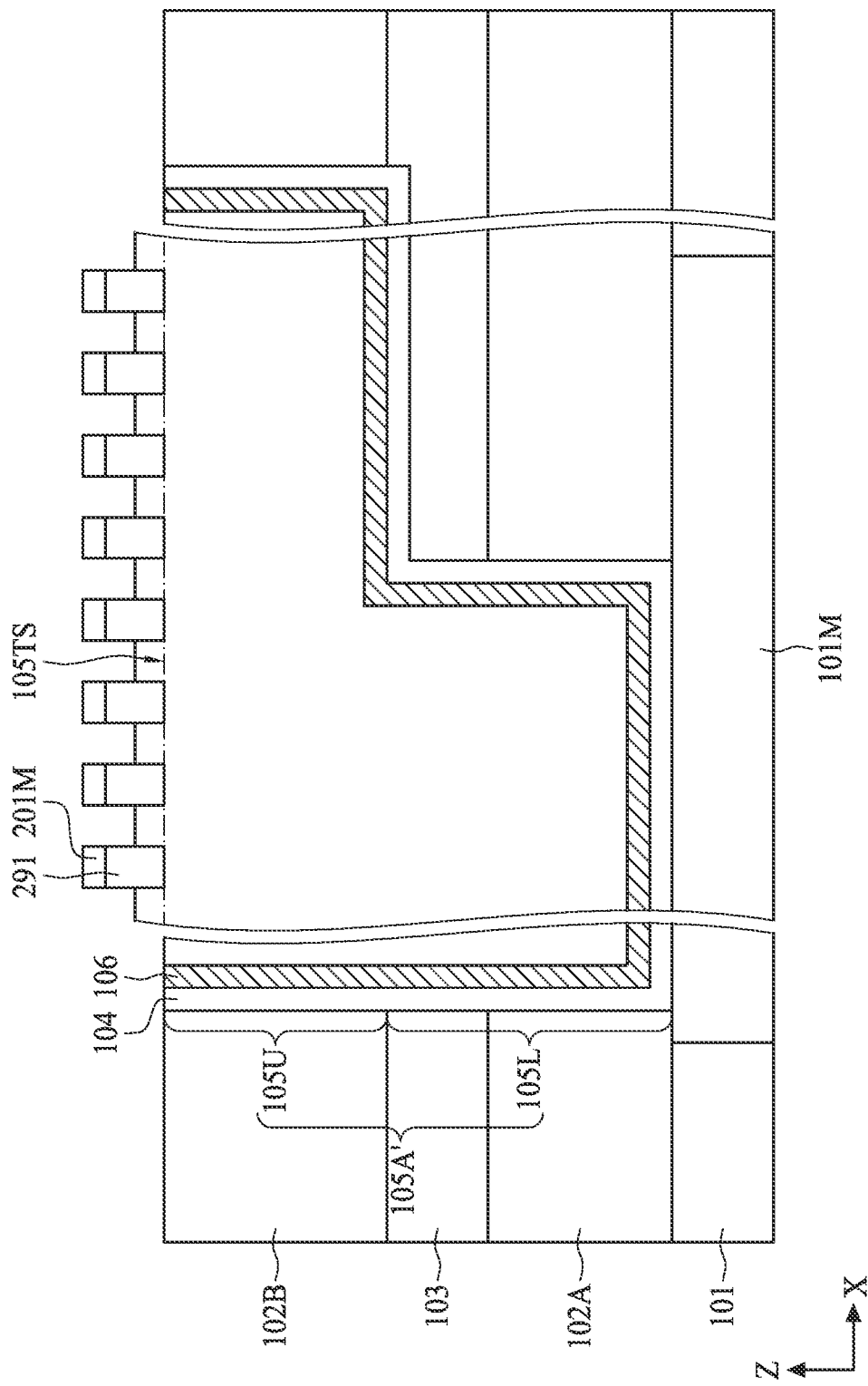

INTERCONNECT STRUCTURE AND MANUFACTURING METHOD FOR THE SAME

CROSS REFERENCE TO RELATED APPLICATIONS

The specification and drawings set forth in U.S. application Ser. No. 17/697,937, filed on Mar. 18, 2022 and entitled "CONDUCTIVE STRUCTURE INCLUDING COPPER-PHOSPHOROUS ALLOY AND A METHOD OF MANUFACTURING CONDUCTIVE STRUCTURE", are herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

Dual damascene operation is one of the most important techniques for forming interconnect structures. However, with the trend of scaling down the geometry size, the resistance of the interconnect structure becomes an issue to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6B-1 is a top view of a horizontal plane Q1 of the interconnect structure, as shown in FIG. 6B, during intermediate stages of manufacturing operations, in accordance with some embodiments of the present disclosure.

FIG. 6B-1' is an explosive view of a conductive via and a profile of a portion of ILD layer(s) and etch stop layer(s) that is proximal to the conductive via, as shown in FIG. 6B, in accordance with some embodiments of the present disclosure.

FIG. 6B-2 is a top view of a horizontal plane Q1 of the interconnect structure, as shown in FIG. 6B, during intermediate stages of manufacturing operations, in accordance with some embodiments of the present disclosure.

FIG. 6B-2' is a perspective view of a conductive via shown in FIG. 6B-2, in accordance with some embodiments of the present disclosure.

FIG. 6B-3 is a top view of a horizontal plane Q1 of the interconnect structure, as shown in FIG. 6B, during intermediate stages of manufacturing operations, in accordance with some embodiments of the present disclosure.

FIG. 6B-3' is a perspective view of a conductive via shown in FIG. 6B-3, in accordance with some embodiments of the present disclosure.

FIG. 6B-4 is a top view of a horizontal plane Q1 of the interconnect structure, as shown in FIG. 6B, during intermediate stages of manufacturing operations, in accordance with some embodiments of the present disclosure.

FIG. 6B-4' is a perspective view of a conductive via shown in FIG. 6B-4, in accordance with some embodiments of the present disclosure.

FIG. 6B-5 is a top view of a horizontal plane Q1 of the interconnect structure, as shown in FIG. 6B, during intermediate stages of manufacturing operations, in accordance with some embodiments of the present disclosure.

FIG. 6B-5' is a perspective view of a conductive via shown in FIG. 6B-5, in accordance with some embodiments of the present disclosure.

FIG. 6B-6 is a top view of a horizontal plane Q1 of the interconnect structure, as shown in FIG. 6B, during intermediate stages of manufacturing operations, in accordance with some embodiments of the present disclosure.

FIG. 6B-6' is a perspective view of a primary portion of a conductive via shown in FIG. 6B-6, in accordance with some embodiments of the present disclosure.

FIG. 6B-6" is a cross section along Jr-Jr of the interconnect structure shown in FIG. 6B-6, during intermediate stages of manufacturing operations, in accordance with some embodiments of the present disclosure.

FIG. 7B' is a top view of the interconnect structure of FIG. 7B during intermediate stages of manufacturing operations, in accordance with some embodiments of the present disclosure.

FIG. 7B" is a cross section along C1'-C1' of the interconnect structure shown in FIG. 7B', during intermediate stages of manufacturing operations, in accordance with some embodiments of the present disclosure.

FIG. 7C' is a top view of the interconnect structure of FIG. 7C during intermediate stages of manufacturing operations, in accordance with some embodiments of the present disclosure.

FIG. 7C" is a cross section along C2'-C2' of the interconnect structure shown in FIG. 7C', during intermediate stages of manufacturing operations, in accordance with some embodiments of the present disclosure.

FIG. 7D' is a top view of the interconnect structure of FIG. 7D during intermediate stages of manufacturing operations, in accordance with some embodiments of the present disclosure.

FIG. 7D" is a cross section along C3'-C3' of the interconnect structure shown in FIG. 7D', during intermediate stages of manufacturing operations, in accordance with some embodiments of the present disclosure.

FIG. 7E is a cross section of an interconnect structure during intermediate stages of manufacturing operations, in accordance with some embodiments of the present disclosure.

FIG. 7E' is a top view of the interconnect structure of FIG. 7E during intermediate stages of manufacturing operations, in accordance with some embodiments of the present disclosure.

FIG. 7E" is a cross section along C4'-C4' of the interconnect structure shown in FIG. 7E', during intermediate stages of manufacturing operations, in accordance with some embodiments of the present disclosure.

FIG. 8A' is a top view of the interconnect structure of FIG. 8A during intermediate stages of manufacturing operations, in accordance with some embodiments of the present disclosure.

FIG. 8A" is a cross section along D1'-D1' of the interconnect structure shown in FIG. 8A', during intermediate stages of manufacturing operations, in accordance with some embodiments of the present disclosure.

FIG. 8B' is a top view of the interconnect structure of FIG. 8B during intermediate stages of manufacturing operations, in accordance with some embodiments of the present disclosure.

FIG. 8B" is a cross section along D2'-D2' of the interconnect structure shown in FIG. 8B', during intermediate stages of manufacturing operations, in accordance with some embodiments of the present disclosure.

FIG. 8C' is a top view of the interconnect structure of FIG. 8C during intermediate stages of manufacturing operations, in accordance with some embodiments of the present disclosure.

FIG. 8C" is a cross section along D3'-D3' of the interconnect structure shown in FIG. 8C', during intermediate stages of manufacturing operations, in accordance with some embodiments of the present disclosure.

FIG. 8D' is a top view of the interconnect structure of FIG. 8D during intermediate stages of manufacturing operations, in accordance with some embodiments of the present disclosure.

FIG. 8D" is a cross section along D4'-D4' of the interconnect structure shown in FIG. 8D', during intermediate stages of manufacturing operations, in accordance with some embodiments of the present disclosure.

FIG. 8E' is a top view of the interconnect structure of FIG. 8E during intermediate stages of manufacturing operations, in accordance with some embodiments of the present disclosure.

FIG. 8E" is a cross section along D5'-D5' of the interconnect structure shown in FIG. 8E', during intermediate stages of manufacturing operations, in accordance with some embodiments of the present disclosure.

FIG. 8F' is a top view of the interconnect structure of FIG. 8F during intermediate stages of manufacturing operations, in accordance with some embodiments of the present disclosure.

FIG. 8F" is a cross section along a D6'-D6' of the interconnect structure shown in FIG. 8F', during intermediate stages of manufacturing operations, in accordance with some embodiments of the present disclosure.

FIG. 9A to FIG. 9B are cross sections of an interconnect structure during intermediate stages of manufacturing operations, in accordance with some embodiments of the present disclosure.

DETAILED DESCRIPTION

Figure 2:
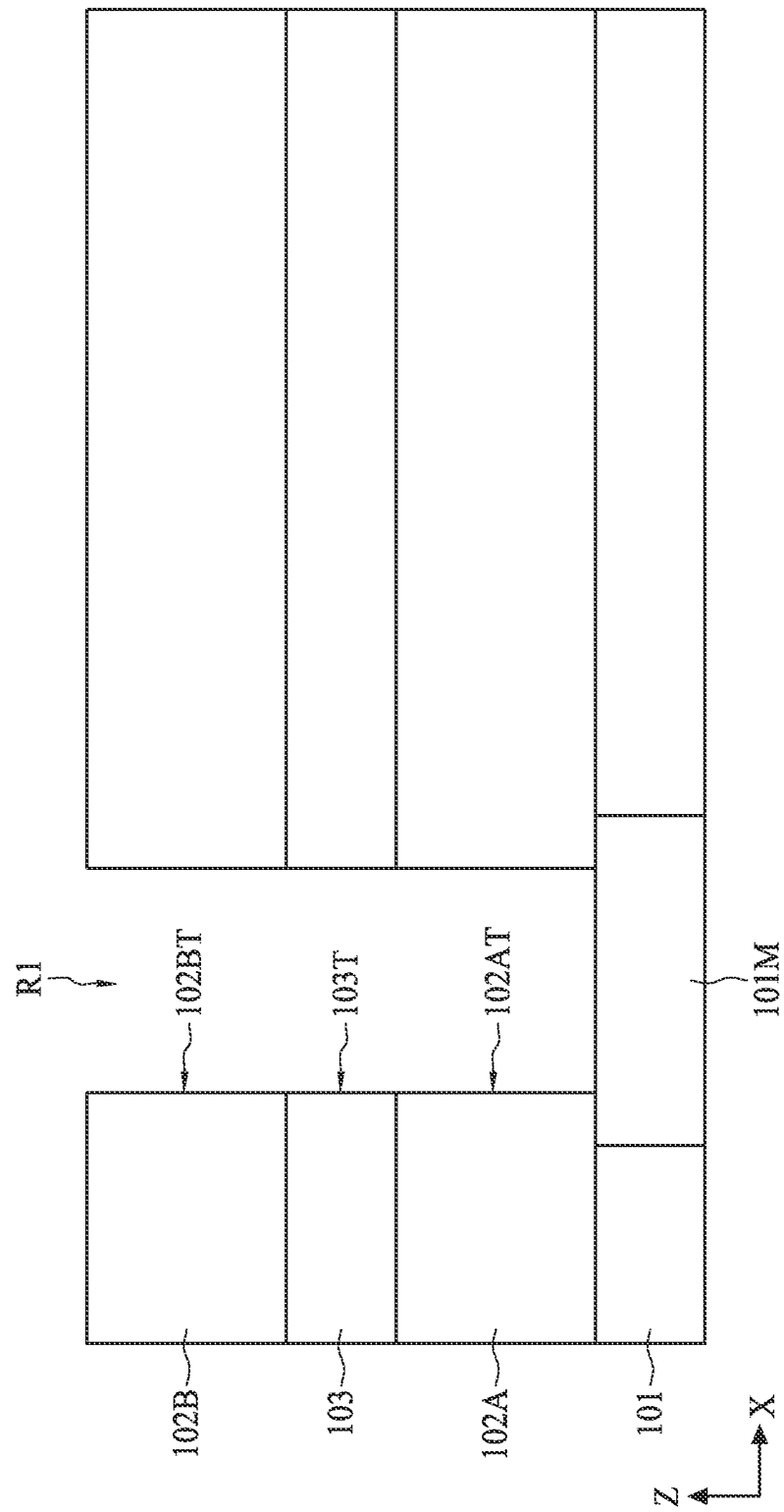
FIG. 1 to FIG. 3 are cross sections of an interconnect structure during intermediate stages of manufacturing operations, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to +2%, less than or equal to ±1%, less than or equal to ±0.5%, less than or equal to ±0.1%, or less than or equal to +0.05%. For example, two numerical values can be deemed to be "substantially" the same or equal if a difference between the values is less than or equal to ±10% of an average of the values, such as less than or equal to +5%, less than or equal to ±4%, less than or equal to ±3%, less than or equal to ±2%, less than or equal to +1%, less than or equal to +0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±10, less than or equal to ±0.5°, less than or equal to ±0.1°, or less than or equal to +0.05°. For example, "substantially" perpendicular can refer to a range of angular variation relative to 90° that is less than or equal to ±10°, such as less than or equal to +5°, less than or equal to ±4°, less than or equal to +3°, less than or equal to ±2°, less than or equal to ±1°, less than or equal to ±0.5°, less than or equal to +0.1°, or less than or equal to +0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The issue of resistance is commonly found amid interconnect structures, wherein such issue may deteriorate device performance. It is particularly important to alleviate the issue of resistance caused by narrower dimension of conductive paths in advanced technology node. In some cases, when transmitting a high-frequency signal, skin effect may occur. That is, electrons may accumulate at the surface of conductive wirings, thereby increasing resistance and deteriorate device performance. Comparative approaches, such as merely increasing a dimension of the conductive wirings along one direction, may not effectively address the aforesaid issues. The present disclosure provides an approach that can effectively increase the surface area of the conductive paths to address the aforesaid resistance issues. Such approach can be incorporated with damascene operation, dual damascene operation or other suitable operation for forming interconnect structures.

Furthermore, in present disclosure, copper-phosphorous alloy (such as $Cu_3P$) can be incorporated into the interconnect structure to improve anti-corrosive, wear resistance, wettability, more condensed structure, strength, toughness, conformability, processability, et cetera. In addition, copper-phosphorous alloy can also be utilized as a wetting layer for a copper layer, which can alleviate void issues and facilitate the conformability of copper layer in a high aspect ratio via.

The copper(I) phosphide ($Cu_3P$) in the present disclosure may include the nonstoichiometric compounds $Cu_{3-x}P$, where in some embodiments, x can be less than 0.1 to become copper-deficient $Cu_3P$. In other words, the phosphorous constituent in the copper(I) phosphide can be in a range of from about 13.98% to about 14.39%, thus the melting temperature is about 1020° C.

Comparing to sputtered copper in comparative embodiment, copper-phosphorous alloy (such as $Cu_3P$) may exhibit improved ability regarding anti-corrosive, wear resistance, wettability, more condensed structure, strength, toughness, conformability, processability, et cetera. Particularly, the copper-phosphorous alloy exhibits improved strength and toughness even in high temperatures, thus can be integrated with anyone one of the Ti, TiN, TaN, $W_2N$, W, titanium-based material, tantalum-based material, metal nitride, or other suitable material and utilized as a barrier layer for spacing copper layer away from low-k material or insulator in various direction (such as laterally or vertically) and thereby alleviating the issue related to electron migration effect. Such properties make copper-phosphorous alloy a great candidate that can be incorporated into damascene, dual damascene procedures, or other suitable operations for forming an interconnect structures. Furthermore, the structure and adhesive force provided by copper-phosphorous alloy alleviates the peeling issue of copper layer when performing a chemical mechanical planarization operation during a damascene, dual damascene operation, or other fabrication operation for forming multi-layer interconnect structure. Also, copper-phosphorous alloy can be formed over the planarized copper surface and integrated with anyone one of the Ti, TiN, TaN, $W_2N$, W, titanium-based material, tantalum-based material, metal nitride, or other suitable material and as a capping layer to prevent copper diffusion toward overlying interlayer dielectric layers.

Phosphorous can also be utilized as deoxidizer and wetting agent for copper. For example, by forming a thin copper-phosphorous alloy (such as $Cu_3P$) prior to forming copper by plating, the oxidation of the copper layer proximal to a surface of the device (such as printed circuit board, integrated circuit, integrated circuit carrier, or the like) due to the exposure to environment may be alleviated. Particularly, oxygen in the environment reacting with copper may generate copper oxide, thereby causing the issue of increased resistance. In conventional technique, nitrogen is required during the formation of sputtered copper layer to alleviate oxidation, which may incur greater cost. Especially in advanced technology application (such as $5^{th}$ generation mobile networks, $6^{th}$ generation mobile networks, artificial intelligence, or the like), the issue of resistance is even more important due to skin effect, that is, electrons may accumulate at the surface of conductive wirings of skin effect (especially when transmitting a high-frequency signal), thereby increasing resistance and deteriorating device performance. In the cases that the copper oxide is formed at surfaces of wirings, the performance of the device may further decrease.

In addition, the electrical conductivity and the thermal conductivity of copper-phosphorous alloy is comparative to sputtered copper, which has a resistivity as lower as 1.84 $\mu\Omega$·cm and a thermal conductivity around 381 W/(m·K). Furthermore, the advantage regarding the reliability of copper-phosphorous alloy (e.g. comparing to sputtered copper) especially exhibits in extreme ambient environment, such as under non-oxidative acid (HCl, $H_2SO_4$, et cetera), basic solution, organic acid (e.g. acetic acid, citric acid), ocean water, salt solution, or when exposed to air.

Additionally, since copper-phosphorous alloy (such as $Cu_3P$) has a dense structure, it can be integrated with anyone one of the Ti, TiN, TaN, $W_2N$, W, titanium-based material, tantalum-based material, metal nitride, or other suitable material and utilized as diffusion barrier layer for alleviating the diffusion of copper from conductive wiring into the adjacent structures (such as silicon oxide that can be utilized as insulating layer). Moreover, copper-phosphorous alloy can also be utilized as a wetting layer for a copper layer, which can alleviate void issues and facilitate the conformability of copper layer in a high aspect ratio via (such as conductive via, blind via, buried via, or the like), especially when forming the copper layer in an electroplating operation. Accordingly, the copper-phosphorous alloy (such as $Cu_3P$ with a thickness in a range from about 5 Å to about 100 Å) may replace sputtered copper wetting layer in some applications of printed circuit board, integrated circuit, integrated circuit carrier, or the like. In some embodiments, when a concentration of phosphorous in a solution is greater than specific level, phosphorous in acicular crystal form may be formed, thus is suitable for catalyzing and facilitating the formation of copper-phosphorous alloy. Furthermore, copper-phosphorous alloy can also be utilized as heat dissipation material.

Comparing to cobalt (Co) and ruthenium (Ru), in the present disclosure the copper-phosphorous alloy along with anyone one of the Ti, TiN, TaN, $W_2N$, W, titanium-based material, tantalum-based material, metal nitride, or other suitable material that can not only provide good adhesive property but alleviate diffusion to improve the compatibility with copper. Specifically, a rough film with lower conductivity may form between sputtered copper and cobalt, and Galvanic Corrosion may occur at an interface between copper and cobalt, thereby causing the material loss of cobalt. In the case of ruthenium, ruthenium lacks conformability and wettability, comparing to the copper-phosphorous alloy as discussed in present disclosure.

The aforesaid advantage of copper-phosphorous alloy (especially $Cu_3P$) provides better overall device performance and such high compatibility in semiconductor device, IC and PCB fabrication operation may allow more potential for altering configuration of conductive structures that can further enhance device properties. In some cases, the lack of conformability and processability of sputtered copper limits the potential of increasing aspect ratio of conductive via and changing the configuration of conductive features to reduce resistance. The present disclosure utilizes plating operation for forming wetting material to enhance conformability and processability to address issues related to aspect ratio and resistance. For example, copper-phosphorous alloy or other suitable material (such as copper) can be formed by electroplating operation or electroless plating operation to be a wetting layer material. In addition, present disclosure provides methods for incorporating copper-phosphorous alloy into the steps of fabricating semiconductor device, or alternatively, Integrated Circuit (IC) or Printed Circuit Board (PCB), which may include electroless plating operation and/or electroplating operation.

In some embodiments, a copper-phosphorous film (which may include $Cu_3P$) or a copper film can be formed by techniques of electroless plating or electroplating. Electroless plating (also can be referred to as chemical plating or autocatalytic plating) is a type of technique that creates metal or metal-containing alloy coatings on various materials by autocatalytic chemical reduction of metal cations in a liquid bath, wherein a workpiece to be plated is immersed in a reducing agent that, when sensitized and catalyzed by certain materials, changes metal ions to metal that forms a coating on the workpiece. Generally, advantages of electroless plating technique include compatibility and product quality. In some cases, electroless plating technique can be applied to both conductive workpiece and non-conductive workpiece, and also the workpiece with smaller size or smaller surface area (such as conductive via, blind via, buried via, or the like). Furthermore, the coating layer formed by electroless plating technique may exhibit greater anti-corrosive and/or greater wear resistance comparing to electroplating technique.

In contrast, electroplating is a technique for forming metal coatings on various materials by externally generated electric current. Advantages of the electroplating technique include higher efficiency and greater throughput.

In some embodiments, the plating solution(s) in the present disclosure (either for electroless plating or electroplating) may include chelating agent and reductant, which may help phosphorus-based chemical reacting with copper, thereby forming copper-phosphorous alloy (such as $Cu_3P$) over a workpiece.

Figure 1:
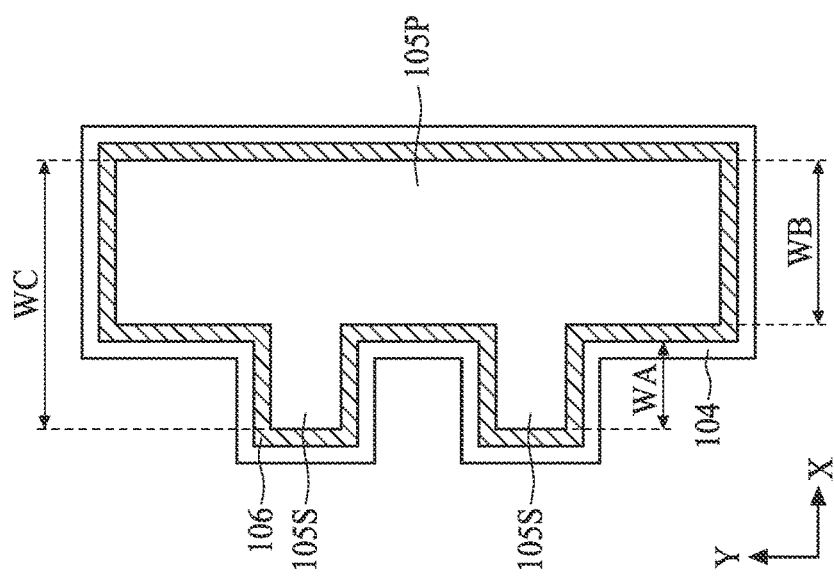

Referring to FIG. 1, FIG. 1 is a cross section of an interconnect structure during intermediate stages of manufacturing operations, in accordance with some embodiments of the present disclosure. At least one metal line 101M is formed in a metal layer 101 over a substrate (not shown), wherein the metal line 101M may be made of a conductive material (e.g. copper, aluminum copper, or the like), and the metal layer may include insulation materials such as dielectrics. In some embodiments, the substrate includes silicon. Alternatively, or additionally, the substrate includes another material, such as germanium, silicon carbide, gallium arsenide, gallium phosphide, gallium nitride, indium phosphide, indium arsenide, and/or indium antimonide, or, an alloy semiconductor, such as silicon germanium (SiGe), GaAsP, AlInAs, AlGaAs, GaInAs, GaInP, GaInAsP, one or more group III-V materials, one or more group II-VI materials, or combinations thereof. In some other embodiments, the substrate is a semiconductor-on-insulator substrate, such as a silicon-on-insulator (SOI) substrate, a silicon germanium-on-insulator (SGOI) substrate, or a germanium-on-insulator (GOI) substrate. A first inter-layer dielectric (ILD) layer 102A is formed over the metal layer 101. An etch stop layer (ESL) 103 is formed over the first ILD layer 102A. The etch stop layer 103 may include oxide, nitride, carbide, metal-derivative, or the like. For example, the etch stop layer 103 may be made of silicon nitride. In some embodiments, the etch stop layer 103 may have a single-layer configuration. In some alternative embodiments, the etch stop layer 103 may have a bi-layer or multi-layer configuration, which may provide a more precise etching control. A second ILD layer 102B is formed over the etch stop layer 103. The first ILD layer 102A and the second ILD layer 102B may be formed of oxides such as un-doped Silicate Glass (USG), Fluorinated Silicate Glass (FSG), phosphosilicate glass (PSG), borophosphosilicate glass (BPSG), low-k dielectric materials, $SiO_2$, $SiO_2$ doped with carbon, poly(arylether), silsesquioxane polymer, benzocyclobutene, polyimide, polyimide that contains fluoride, or the like. The low-k dielectric materials may have k values lower than 3.8. In some embodiments, the first ILD 102A and the second ILD layer 102B may be made of inorganic material. It should be noted that the number of ILD layer(s) and/or the number of etch stop layer(s) can be adjusted (or even omitted) in accordance with specific requirement.

A first photoresist layer 191 is patterned (or selectively formed) over the second ILD layer 102B, wherein a first portion E1 of the second ILD layer 102B is exposed from the first photoresist layer 191. In some of the embodiments, at least a portion of the first portion E1 overlaps with the metal line 101M in vertical direction (e.g. Z direction shown in FIG. 1, which is orthogonal to X direction).

Referring to FIG. 2, FIG. 2 is a cross section of an interconnect structure during intermediate stages of manufacturing operations, in accordance with some embodiments of the present disclosure. A removal operation is performed from the first portion E1 of the second ILD layer 102B exposed from the first photoresist layer 191, thereby a first recess R1 is formed. In some embodiments, at least a portion of the metal line 101M is exposed by the first recess R1. A first sidewall 102AT of the first ILD layer 102A, a first sidewall 103T of the etch stop layer 103, and a first sidewall 102BT of the second ILD layer 102B are exposed at the first recess R1. The first photoresist layer 191 may be removed.

Figure 3:
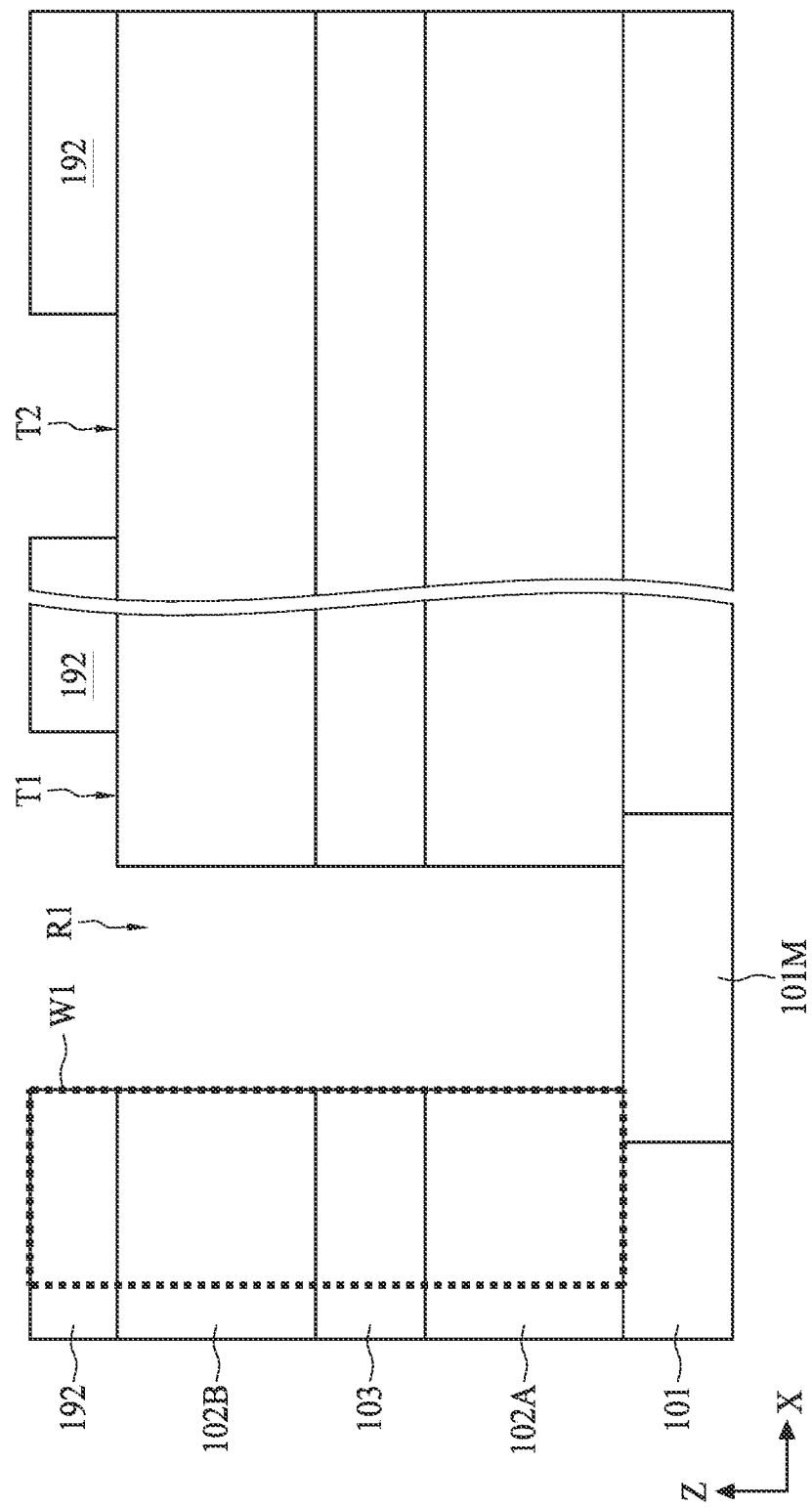
Figure 3A:
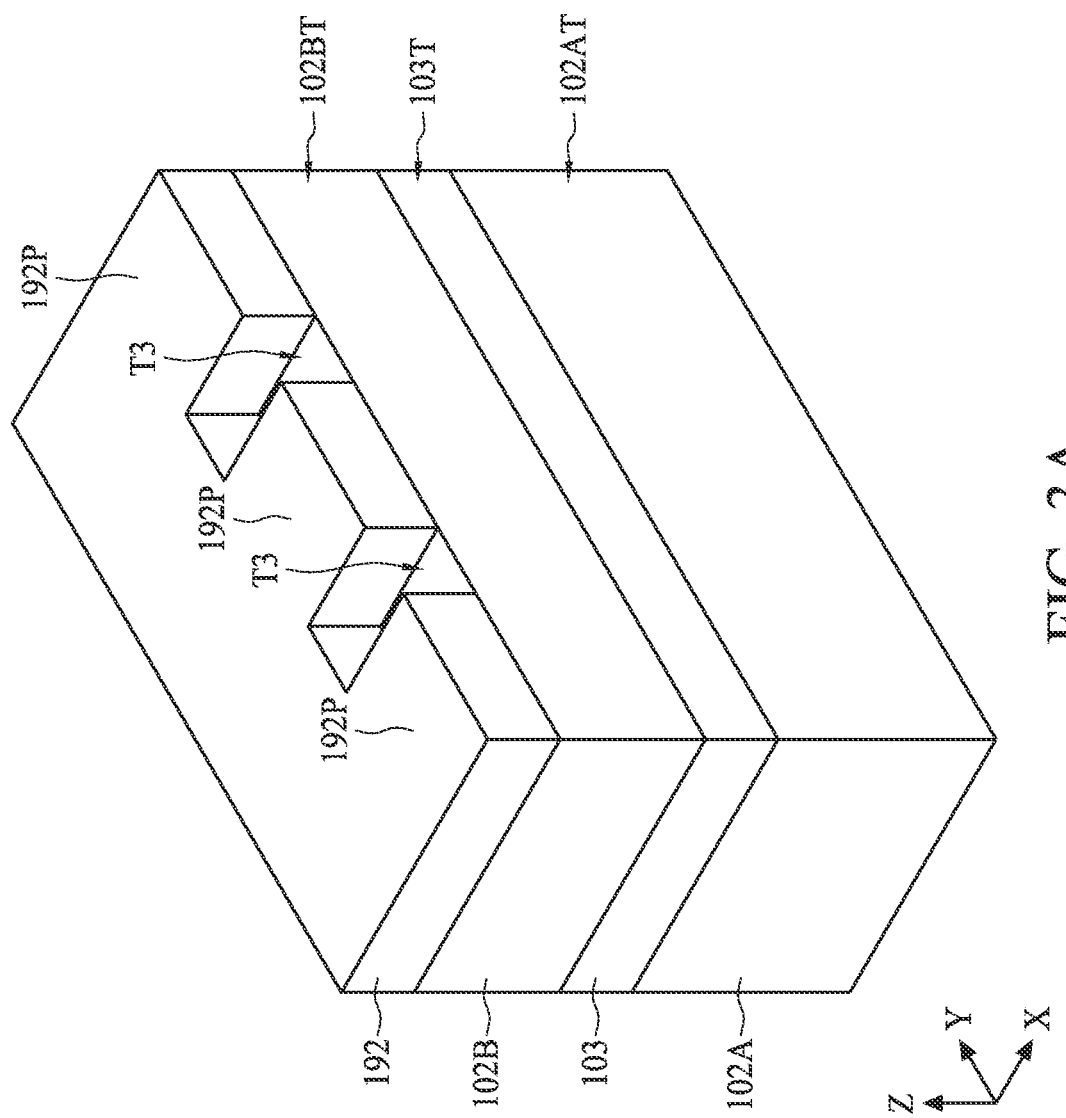
FIG. 3A is a partially enlarged fragmentary diagrammatic view of a portion W1 of the interconnect structure, as shown in FIG. 3, during intermediate stages of manufacturing operations, in accordance with some embodiments of the present disclosure.

Referring to FIG. 3 and FIG. 3A, FIG. 3 is a cross section of an interconnect structure during intermediate stages of manufacturing operations, FIG. 3A is a partially enlarged fragmentary diagrammatic view of a portion W1 of the interconnect structure, as shown in FIG. 3, during intermediate stages of manufacturing operations, in accordance with some embodiments of the present disclosure. In some of the embodiments, a second photoresist layer 192 is patterned (or selectively formed) over a top surface of the second ILD layer 102B. In some embodiments, a first section T1 and a second section T2 of the top surface of the second ILD layer 102B are exposed from the second photoresist layer 192, wherein the first section T1 is relatively proximal to the first recess R1 comparing to the second section T2. The second photoresist layer 192 further includes one or more protrusions 192P proximal to a peripheral area of the first recess R1 and above the second ILD layer 102B. A third section T3 (as shown in FIG. 3A) of the top surface of the second ILD layer 102B is exposed from the protrusions 192P and may be adjacent to the first recess R1. Alternatively stated, a portion of the second photoresist layer 192 proximal to the first recess R1 has a corrugated profile, wherein each protrusions 192P may be spaced apart from each other by a distance.

Figure 4:
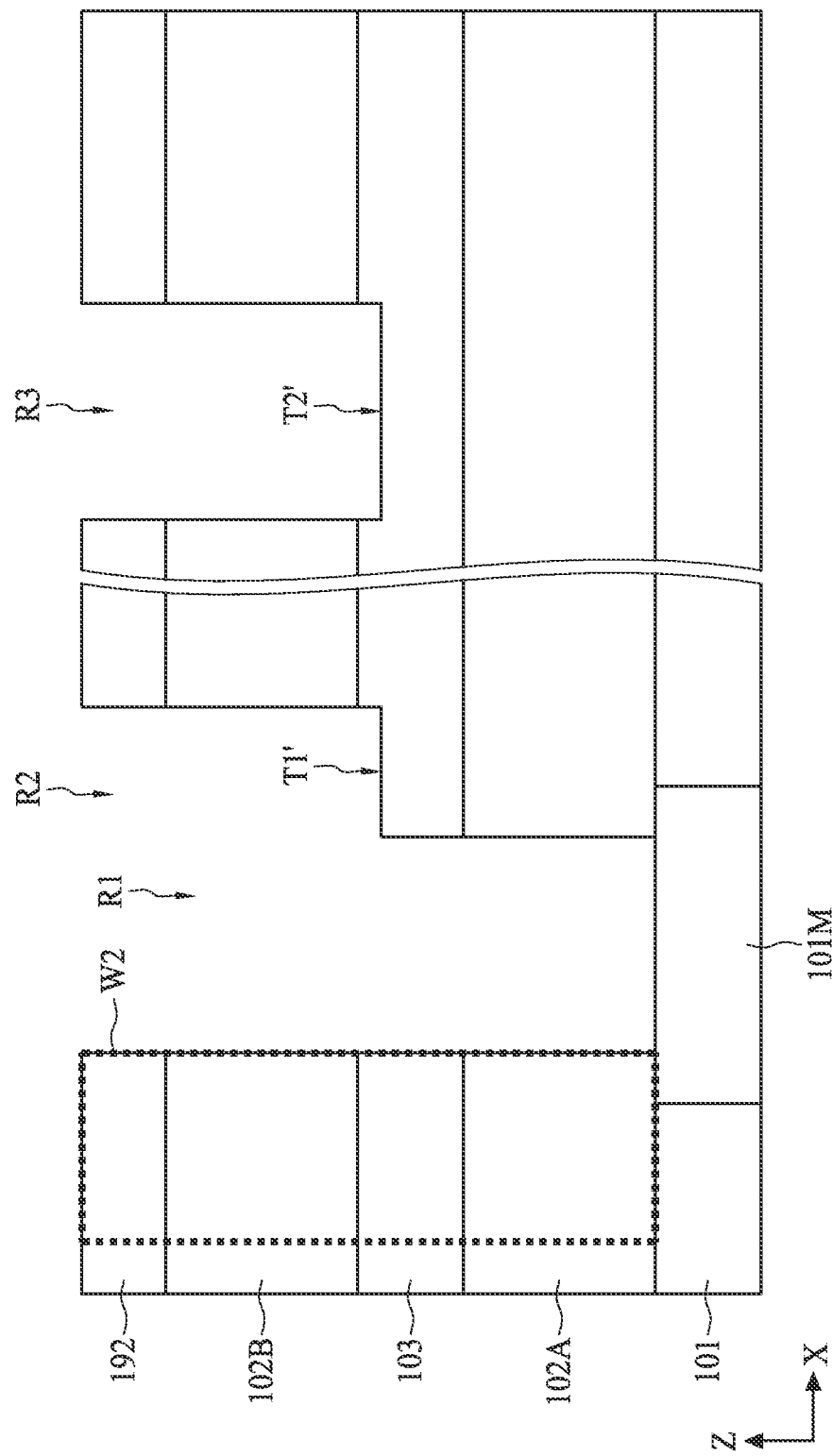
FIG. 4 is a cross section of an interconnect structure during intermediate stages of manufacturing operations, in accordance with some embodiments of the present disclosure.
Figure 4A:
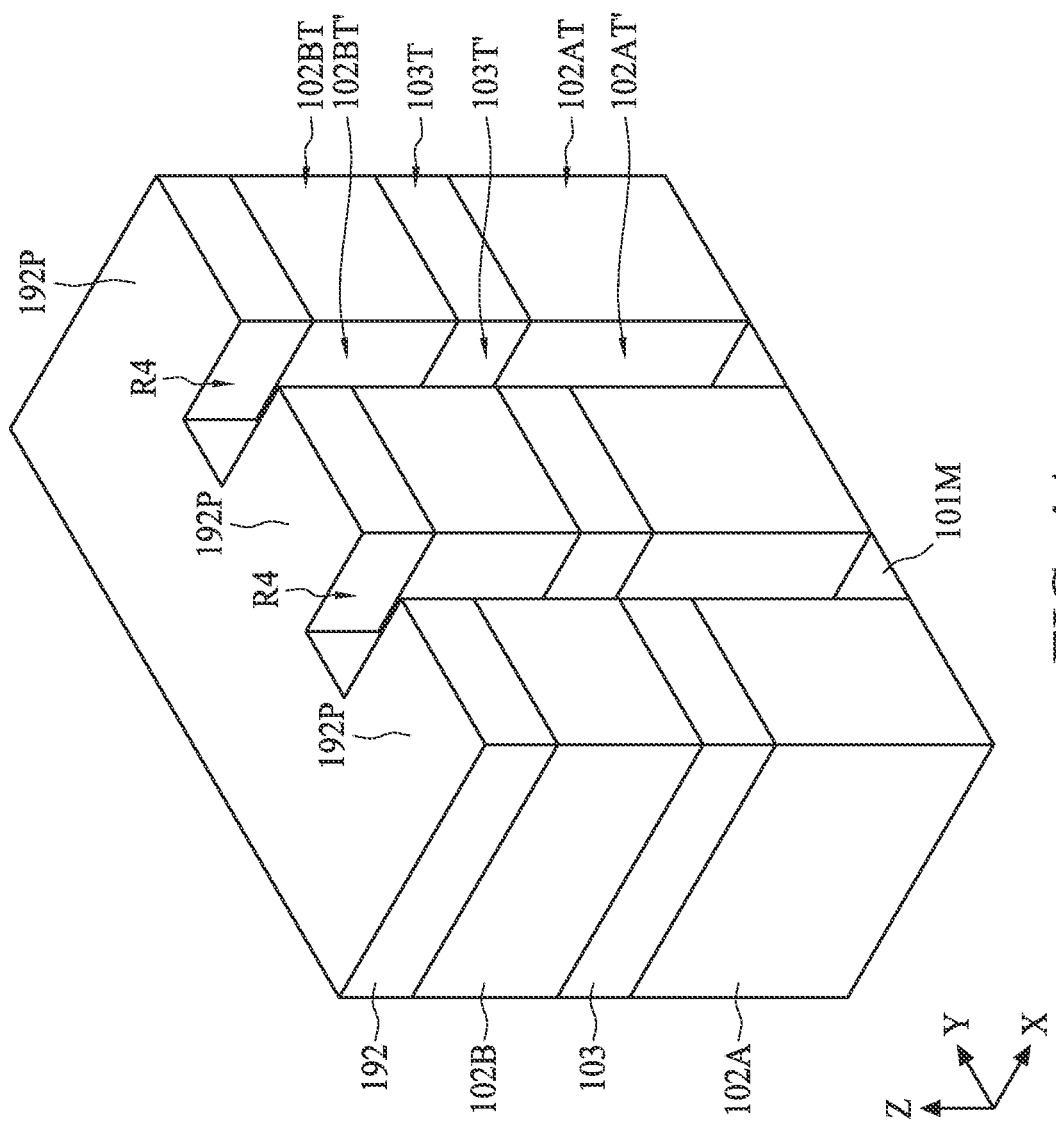
FIG. 4A is a partially enlarged fragmentary diagrammatic view of a portion W2 of the interconnect structure, as shown in FIG. 4, during intermediate stages of manufacturing operations, in accordance with some embodiments of the present disclosure.

Referring to FIG. 4 and FIG. 4A, FIG. 4 is a cross section of an interconnect structure during intermediate stages of manufacturing operations, FIG. 4A is a partially enlarged fragmentary diagrammatic view of a portion W2 of the interconnect structure, as shown in FIG. 4, during intermediate stages of manufacturing operations, in accordance with some embodiments of the present disclosure. An etching operation is performed to partially remove the second ILD layer 102B, the etch stop layer 103, and/or the first ILD layer 102A. For example, the second ILD layer 102B is recessed from the first section T1 (shown in FIG. 3, which has a portion exposed from the second photoresist layer 192) and thereby forming a second recess R2. In some embodiments, a first part T1' of the etch stop layer 103 is exposed from the second recess R2. In some embodiments, the second recess R2 is connected to the first recess R1. In some embodiments, the second ILD layer 102B is recessed from the second section T2 (shown in FIG. 3, which has a portion exposed from the second photoresist layer 192) and thereby forming a third recess R3. In some embodiments, a second part T2' of the etch stop layer 103 is exposed from the third recess R3. In some embodiments, the second ILD layer 102B is recessed from the third section T3 (shown in FIG. 3A, which has a portion exposed from the second photoresist layer 192) and thereby forming one or more fourth recesses R4 extending along the first sidewall 102BT of the second ILD layer 102B. The fourth recesses R4 are connected to the first recess R1. In some embodiments, the fourth recesses R4 stop at the metal line 101M (or alternatively at the metal layer 101). A second sidewall 102AT' of the first ILD layer 102A, a second sidewall 103T' of the etch stop layer 103, and a second sidewall 102BT' of the second ILD layer 102B are exposed at the fourth recess R4. A portion of the second sidewall 102AT' may be free from being parallel to the first sidewall 102AT, a portion of the second sidewall 103T' may be free from being parallel to the first sidewall 103T, and a portion of the second sidewall 102BT' may be free from being parallel to the first sidewall 102BT. Alternatively stated, the sidewalls of the first ILD layer 102A, the second ILD layer 102B, and the etch stop layer 103 may have a corrugated profile, which is corresponding to (or substantially similar to) the corrugated profile of the second photoresist layer 192. In some of the embodiments, the second sidewall 102AT', the second sidewall 103T' and the second sidewall 102BT' may be substantially aligned.

In some alternative embodiments, the fourth recesses R4 stop at the first ILD layer 102A. In some alternative embodiments, the fourth recesses R4 stop at the etch stop layer 103. In some alternative embodiments, the fourth recesses R4 stop at the second ILD layer 102B.

Figure 5:
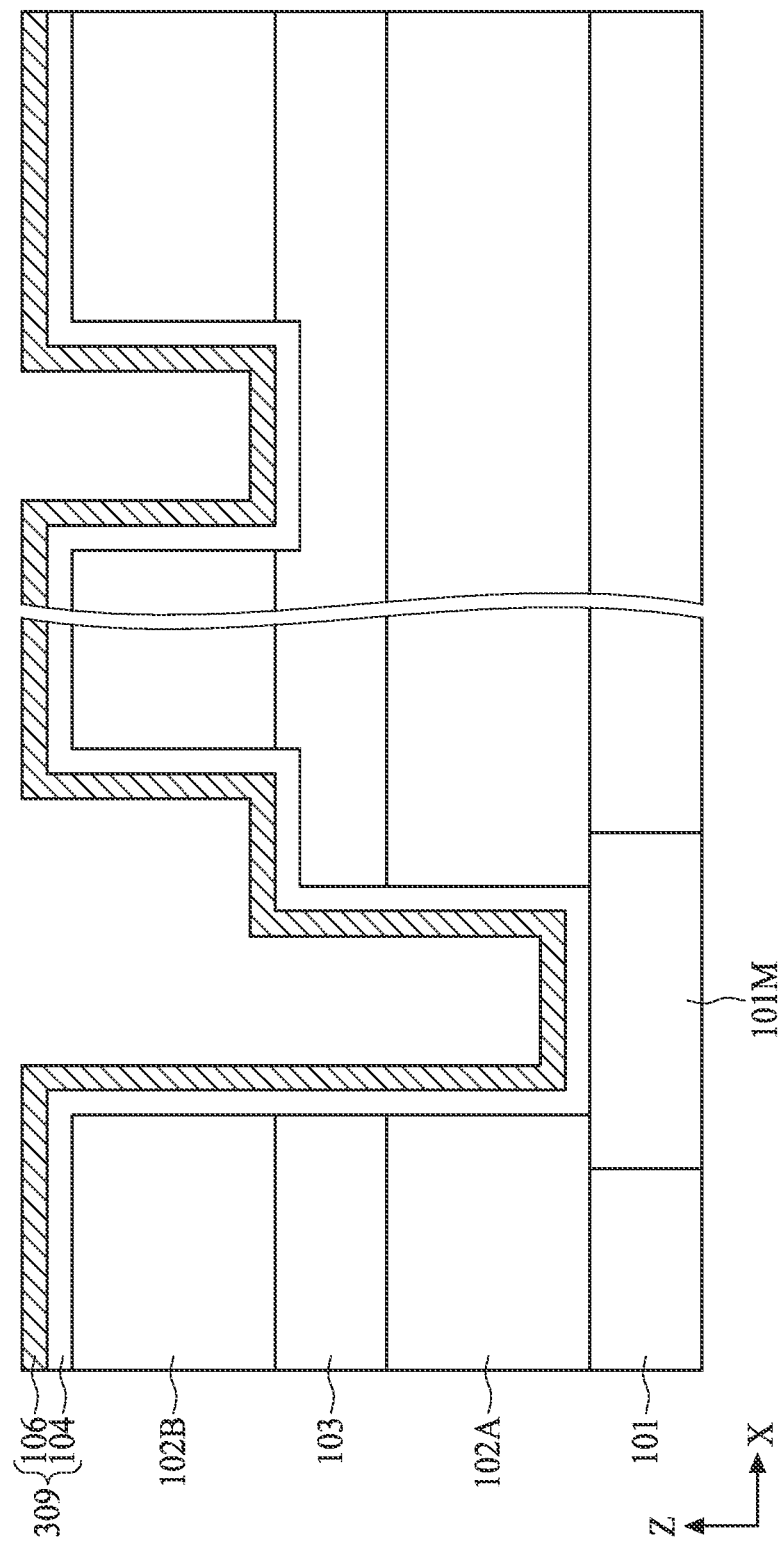
FIG. 5 is a cross section of an interconnect structure during intermediate stages of manufacturing operations, in accordance with some embodiments of the present disclosure.

Referring to FIG. 5, FIG. 5 is a cross section of an interconnect structure during intermediate stages of manufacturing operations, in accordance with some embodiments of the present disclosure. The second photoresist layer 192 may be removed, and a barrier layer 104 may be formed over the second ILD layer 102B. The barrier layer 104 can be further lining at the sidewalls and the bottom surfaces of the first recess R1, the second recess R2, the third recess R3, and the fourth recesses R4. Alternatively stated, the barrier layer 104 is formed over the exposed surfaces of the first ILD layer 102A, the etch stop layer 103, and the second ILD layer 102B. In some embodiments, the barrier layer 104 may be made of one of the Ti, TiN, TaN, $W_2N$, W, titanium-based material, tantalum-based material, metal nitride, or other suitable material that can alleviate diffusion.

In FIG. 5, a copper-phosphorous alloy layer 106 is further formed over the barrier layer 104. In some embodiments, the copper-phosphorous alloy layer 106 can also be referred as a wetting layer. In the embodiments, the copper-phosphorous alloy layer 106 may be formed by performing an electroless plating operation. The details of the plating techniques can also be referred to the U.S. application Ser. No. 17/697,937, entitled "Conductive structure including copper-phosphorous alloy and a method of manufacturing conductive structure", which is hereby incorporated by reference in its entirety. For example, the copper-phosphorous alloy may be formed by providing a phosphorus-based chemical and a copper-based chemical in a plating solution, wherein the phosphorus-based chemical can be one of the following chemicals: phosphine ($PH_3$), phosphoryl chloride ($POCl_3$), or phosphorus trichloride ($PCl_3$). In contrast, the copper-based chemical can be one of the following chemicals: copper(II) sulfate ($CuSO_4$), or copper(II) pyrophosphate ($Cu_2P_2O_7$). An operation temperature of the electroless plating operation may be in a range from about 50° C. to about 60° C. A. pH value of the plating solution may be a range from about 8 to about 9. In some embodiments, the copper-phosphorous alloy formed by electroless plating operation may exhibit improved quality and wettability, thereby further improving device performance. In some alternative embodiments, the copper phosphorous alloy layer 106 may be formed by PVD operations such as sputtering. In some embodiments, the copper-phosphorous alloy layer 106 and the barrier layer 104 are collectively referred to as a diffusion barrier composite stack 309.

Figure 6A:
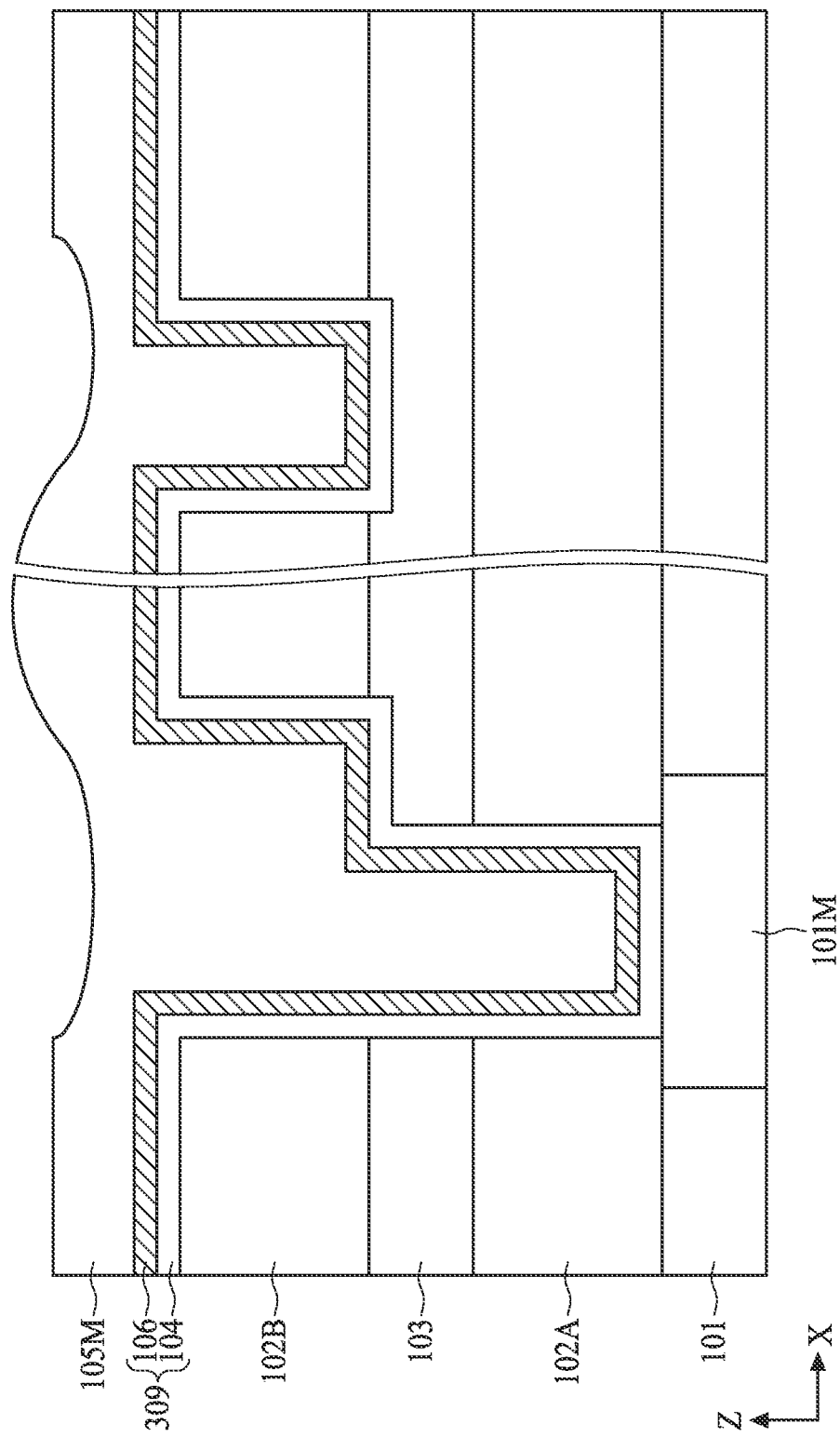
FIG. 6A to FIG. 6B are cross sections of an interconnect structure during intermediate stages of manufacturing operations, in accordance with some embodiments of the present disclosure.

Referring to FIG. 6A, FIG. 6A is a cross section of an interconnect structure during intermediate stages of manufacturing operations, in accordance with some embodiments of the present disclosure. Further, a conductive material layer 105M is formed over the copper-phosphorous alloy layer 106 (for example, with a thickness about 5 Å to 100 Å) of the diffusion barrier composite stack 309 as well as in the first recess R1, the second recess R2, the third recess R3, and the fourth recesses R4 as previously described in FIG. 4 and FIG. 4A. In some embodiments, the conductive material layer 105M may include copper or other suitable conductive material (such as copper-phosphorous alloy, e.g. $Cu_3P$). In some embodiments, the conductive material layer 105M may be formed by electroplating operation as discussed in U.S. application Ser. No. 17/697,937 (entitled "Conductive structure including copper-phosphorous alloy and a method of manufacturing conductive structure"), which is hereby incorporated by reference in its entirety.

For example, the plating solution for performing a copper electroplating operation includes soluble salt that provide metallic ions (such as $Cu^{2+}$) for the electroplating operation. In some embodiments, the plating solution further includes complexation reagent, which can bond with the aforesaid metallic ions (such as $Cu^{2+}$) thereby forming a coordination complex. In some embodiments, the plating solution further includes reducing agent, which can be utilized to reduce the metallic ions (such as $Cu^{2+}$) in a coordination complex. In some embodiments, the plating solution further includes buffering agent, which can be utilized to adjust or stabilize the pH value (i.e. acidity/basicity) of the plating solution. In some embodiments, the plating solution further includes active agent such as chloride ion ($Cl^-$), where chloride ion can also be utilized as anode surfactant. In some embodiments, the plating solution further includes other additives, such as brightener that includes chloride ion ($Cl^-$), grain refiner, leveling agent, wetting agent, stress relieving agent, or inhibitor. For example, the polyethylene glycol (PEG) may be attached to the workpiece and react with metallic ions (or phosphorous ion in some cases) and forming a coordination complex, thereby adjusting a reaction rate of the plating (such as decreasing the reaction rate).

In some embodiments, the plating solution includes $CuSO_4 \cdot 5H_2O$ (such as having a concentration about 220 g/L), sulfuric acid (such as having a concentration about 40 g/L), and chloride ion (such as about 40 ppm) for improving the electroplating solution conductivity and the shininess of copper. In some other cases, the plating solution may have basic chemical that includes $Cu^{2+}$ and is substantially free of cyanide. In some cases, utilizing basic chemicals during fabrication operations may alleviate the critical issue of material loss in nanometer technology, especially the barrier layers, such as tantalum nitride layer (TaN), or cobalt layers in a workpiece. For example, tantalum oxide may be formed when tantalum nitride is oxidized, which may further cause reliability issues. In some embodiments, the plating solution includes phosphorus-based chemical, such as phosphine ($PH_3$) or copper(II) pyrophosphate ($Cu_2P_2O_7$). In some of the embodiments, the aforesaid phosphorus-based chemical may be in gas form that can be supplied by a chemical source.

Particularly, herein the copper-phosphorous alloy layer 106 of the diffusion barrier composite stack 309 can also be utilized as a wetting layer or a seed layer for a copper layer, which can alleviate void issues and facilitate the conformability of copper layer in a high aspect ratio via, especially when forming the copper layer in a electroless plating operation. Accordingly, the copper-phosphorous alloy (such as $Cu_3P$ with a thickness in a range from about 5 Å to about 100 Å) may replace sputtered copper wetting layer in some applications. In some embodiments, when a concentration of phosphorous in a solution is greater than specific level, phosphorous in acicular crystal form may be formed, thus is suitable for catalyzing and facilitating the formation of copper-phosphorous alloy. In addition, the copper-phosphorous alloy layer 106 can be used as a deoxidizer, thereby may alleviate the forming of copper oxide in the conductive material layer 105M. Such properties improve the overall conductivity and reliability.

Figure 6B:
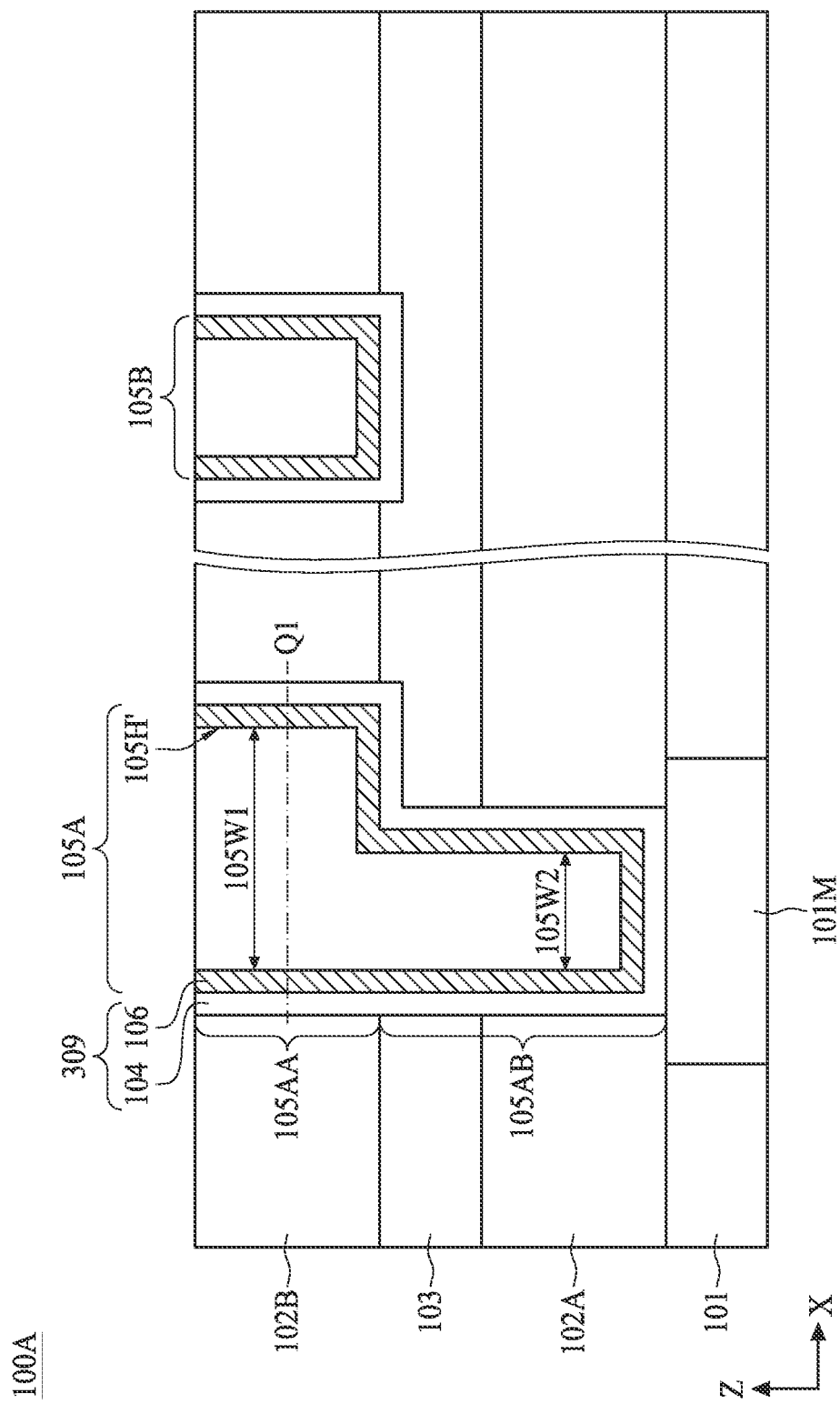
Figure 6B:
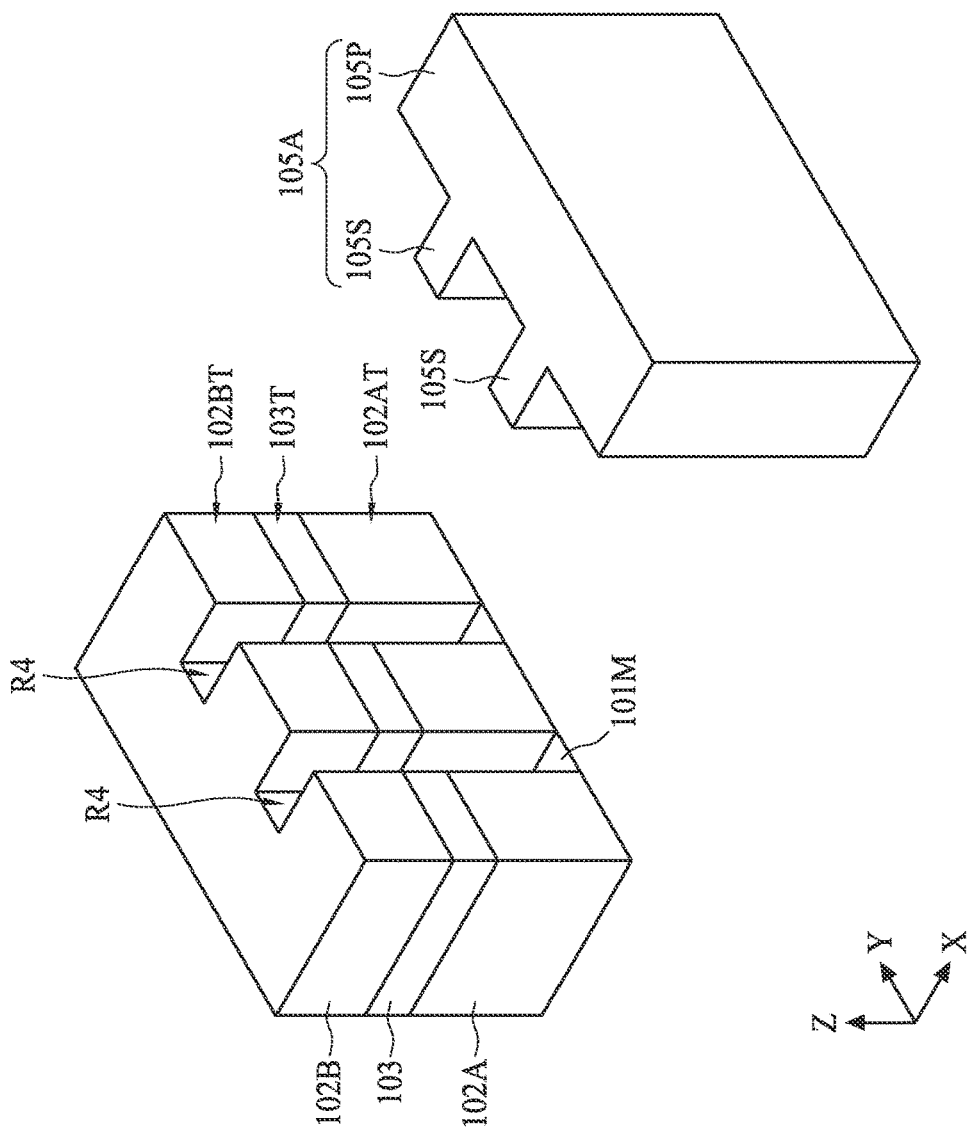

Referring to FIG. 6B, FIG. 6B is a cross section of an interconnect structure during intermediate stages of manufacturing operations, in accordance with some embodiments of the present disclosure. A planarization operation, such as chemical mechanical planarization (CMP), is performed over the conductive material layer 105M (shown in FIG. 6A) to remove an excessive portion of the conductive material layer 105M, thereby forming an interconnect structure 100A including a first conductive feature 105A electrically connected to the metal line 101M and a second conductive feature 105B at a position different from the first conductive feature 105A. In some embodiments, the first conductive feature 105A is not electrically connected to the second conductive feature 105B after the planarization operation. At least a portion of the first ILD 102A is under a coverage of a projection area of the first conductive feature 105A. The planarization operation may stop at a top surface of the barrier layer 104 (and may stop at a top surface of the second ILD layer 102B), and the top surface of the barrier layer 104 may be coplanar with a top surface of the first conductive feature 105A and a top surface of the second conductive feature 105B. As previously discussed in FIG. 5, the barrier layer 104 may help alleviating the peeling and dish issues during the planarization operation. Also, the barrier layer 104 may strengthen the structure of the conductive portion (such as copper or other suitable conductive material) of the first conductive feature 105A and the second conductive feature 105B, thereby alleviating the deformation issue thereof under high rotation speed planarization operation. Further, the barrier layer 104 or the copper-phosphorous alloy layer 106 can serve as an end point of the planarization operation. Such configuration effectively improves the efficiency of planarization operation. In some embodiments, the configuration of the second conductive feature 105B, as well as the material of the barrier layer 104, such as Ti, TiN, TaN (for example, having a thickness about 5 Å to about 100 Å), $W_2N$, W, titanium-based material, tantalum-based material, metal nitride, or other suitable material that can alleviate diffusion as well as improving the reliability of the forming of conductive material layer 105M, in terms of avoiding the peeling and dish effects of copper material from some of the non-metal surface (such as $SiO_2$ or Si). Such materials further improve the ability of hindering diffusion of copper material into adjacent dielectric layers.

In some embodiments, the stop detection of the planarization operation may include real-time detection of copper-phosphorous 106 as well as barrier 104 in the slurry. For example, when the concentrations of copper-phosphorous layer 106 as well as barrier 104 detected in used slurry are greater than certain threshold values (or alternatively, the presence of copper-phosphorous 106 as well as barrier 104 in used slurry), the planarization operation can be stopped. Alternatively, a current of a motor that drives the polishing head in CMP apparatus can be used as a benchmark of stop detection of the planarization operation, since either copper-phosphorous alloy layer 106 or barrier layer 104 is harder than copper, thereby the required current for the motor may be increased when the planarization operation reaches the copper-phosphorous alloy layer 106 as well as the barrier layer 104.

In some embodiments, the first conductive feature 105A includes a conductive via 105AB and a conductive post 105AA over the conductive via 105AB. In some embodiments, a total width 105W1 of the conductive post 105AA is greater than a total width 105W2 of the conductive via 105AB.

Based on requirements of application, the configuration (e.g. the shape) of the first conductive feature 105A may be varied. Especially in advanced technology application (such as $5^{th}$ generation mobile networks, $6^{th}$ generation mobile networks, artificial intelligence, or the like), the issue of resistance is even more important due to skin effect, that is, electrons may accumulate at the surface of conductive wirings (especially when transmitting a high-frequency signal), thereby increasing resistance and deteriorating device performance. It should be noted that in comparative approaches, such as merely increasing a dimension of the conductive wirings along one direction, may not effectively address the aforesaid issues.

Accordingly, an effective surface area of the conductive wirings for transmitting high-frequency signal can be substantially increased to effectively address the issues of skin effect. For example, by configuring the sidewall of the first conductive feature 105A with corrugated profile, a plurality of surfaces of the corrugated profile extend along Z-direction (which is substantially parallel to a direction of electric current flowing therein), thus the effective surface area of the first conductive feature 105A may be effectively increased and thereby alleviating issues of skin effect. In some embodiments, the first conductive feature 105A may have protruding portions (subsequently referred as secondary portions 105S) that are arranged in the fashion of repeated geometrical features such as protrusions. Several embodiments are discussed in FIG. 6B-1, FIG. 6B-2, FIG. 6B-3, and FIG. 6B-4 (as well as FIG. 6B-1', FIG. 6B-2', FIG. 6B-3', and FIG. 6B-4' respectively corresponding thereto), but it should be noted that the configurations of the first conductive feature 105A are not limited thereto. The profile of the first conductive feature 105A may be adjusted to comply with specific requirements. The profile of the first conductive feature 105A may depend on the pattern of the second photoresist layer 192 as discussed in FIG. 3A and FIG. 4A, that is, the pattern of the second photoresist layer 192 can be altered accordingly in accordance with the target of forming the profile of the first conductive feature 105A discussed in FIG. 6B-1, FIG. 6B-2, FIG. 6B-3, FIG. 6B-4, FIG. 6B-5, FIG. 6B-6 as well as FIG. 6B-1', FIG. 6B-2', FIG. 6B-3', FIG. 6B-4', FIG. 6B-5', and FIG. 6B-6' respectively corresponding thereto. For the purpose of clarity, FIG. 6B-1' is an explosive view of a conductive via and a profile of a portion of ILD layer(s) and etch stop layer(s) that is proximal to the conductive via, FIG. 6B-2', FIG. 6B-3', FIG. 6B-4', FIG. 6B-5', and FIG. 6B-6' respectively shows a perspective view of a conductive via.

Referring to FIG. 6B-1 and FIG. 6B-1', FIG. 6B-1 is a top view of a horizontal plane Q1 (e.g. X-Y plane) of the interconnect structure, as shown in FIG. 6B, during intermediate stages of manufacturing operations, FIG. 6B-1' is an explosive view of a conductive via and a profile of a portion of ILD layer(s) and etch stop layer(s) that is proximal to the conductive via as shown in FIG. 6B-1, in accordance with some embodiments of the present disclosure. In some embodiments, the first conductive feature 105A shown in FIG. 6B-1 has a primary portion 105P extending along vertical direction (Z-direction) and one or more secondary portions 105S arranged on a side of the primary portion 105P, wherein a width of each secondary portions 105S extends along a direction different from vertical direction (such as along X-Y plane, wherein X direction and Y direction are orthogonal to Z direction, or, substantially orthogonal to Z direction) and protrudes away from the primary portion 105P. In some embodiments, the secondary portions 105S includes repeated geometrical features such as protrusions. The primary portion 105P may have a shape similar to quadrilateral from top view perspective, which may have corners. Further, a copper-phosphorous alloy layer 106 is configured to laterally surround an outer sidewall 105H' (shown in FIG. 6B) of the first conductive feature 105A in a conformal manner, and the barrier layer 104 laterally surrounding an outer sidewall of the copper-phosphorous alloy layer 106 in a conformal manner. Referring to FIG. 4A as well as FIG. 6B-1', the secondary portions 105S and the barrier layer 104 conforming thereto may be proximal to and defined by the second sidewall 102AT' of the first ILD layer 102A, the second sidewall 103T' of the etch stop layer 103, and the second sidewall 102BT' of the second ILD layer 102B. The primary portion 105P, along with the copper-phosphorous alloy layer 106 and the barrier layer 104 conforming thereto, may be defined by the first sidewall 102AT of the first ILD layer 102A, the first sidewall 103T of the etch stop layer 103, and the first sidewall 102BT of the second ILD layer 102B.

The secondary portions 105S has a first width WA (shown in FIG. 6B-1), the primary portion 105P has a second width WB, and the first conductive feature 105A has a third width WC. In some embodiments, a ratio η of the first width WA over the third width WC is in a range from about 10% to about 90%. In the applications that requires improvement regarding thermal capacitance, the ratio η may be relatively closer to 10%. In the applications that requires increasing thermal dissipation (or surface current) area, the ratio η may be relatively closer to 90%. In some of the applications, the first width WA may be substantially identical to the second width WB, but the present disclosure is not limited thereto.

Referring to FIG. 6B-2 and FIG. 6B-2', FIG. 6B-2 is a top view of a horizontal plane Q1 of the interconnect structure, as shown in FIG. 6B, during intermediate stages of manufacturing operations, FIG. 6B-2' is a perspective view of a conductive via shown in FIG. 6B-2, in accordance with some embodiments of the present disclosure. The configuration of the first conductive feature 105A shown in FIG. 6B-2 is similar to the one discussed in FIG. 6B-1, but the difference resides in that the primary portion 105P may have a round shape (such as circular, oval, or shapes that have one or more rounded corners) from top view perspective. Further, the copper-phosphorous alloy layer 106 is configured to laterally surround an outer sidewall 105H' (shown in FIG. 6B) of the first conductive feature 105A in a conformal manner, and the barrier layer 104 laterally surrounding an outer sidewall of the copper-phosphorous alloy layer 106 in a conformal manner.

Referring to FIG. 6B-3 and FIG. 6B-3', FIG. 6B-3 is a top view of a horizontal plane Q1 of the interconnect structure, as shown in FIG. 6B, during intermediate stages of manufacturing operations, FIG. 6B-3' is a perspective view of a conductive via shown in FIG. 6B-3, in accordance with some embodiments of the present disclosure. The configuration of the first conductive feature 105A shown in FIG. 6B-3 is similar to the one discussed in FIG. 6B-2, but the difference resides in that the secondary portions 105S are arranged at two sides of the primary portion 105P. Accordingly, referring back to FIG. 3 and FIG. 4, the second photoresist layer 192 selectively formed at a position proximal to the first section T1 may also be patterned with a corrugated profile (that is, having protrusions similar to the protrusions 192P that protrude toward the first recess R1). Further, the copper-phosphorous alloy layer 106 is configured to laterally surround an outer sidewall of the first conductive feature 105A in a conformal manner, and the barrier layer 104 laterally surrounding an outer sidewall of the copper-phosphorous alloy layer 106 in a conformal manner.

Referring to FIG. 6B-4 and FIG. 6B-4', FIG. 6B-4 is a top view of a horizontal plane Q1 of the interconnect structure, as shown in FIG. 6B, during intermediate stages of manufacturing operations, FIG. 6B-4' is a perspective view of a conductive via shown in FIG. 6B-4, in accordance with some embodiments of the present disclosure. The configuration of the first conductive feature 105A shown in FIG. 6B-4 is similar to the one discussed in FIG. 6B-3, but the difference resides in that the secondary portions 105S are arranged along an edge of the primary portion 105P. Alternatively stated, the secondary portions 105S laterally surrounds the primary portion 105P. A first distance Rd1 measured from a center CX of the first conductive feature 105A to an edge of the secondary portions 105S is greater than a second distance Rd2 measured from the center CX to an edge of the primary portion 105P. Accordingly, referring back to FIG. 3 and FIG. 4, the second photoresist layer 192 selectively formed at a position proximal to the first recess R1 may be patterned with protrusions laterally surrounding the first recess R1. Further, the barrier layer 104 laterally surrounding an outer sidewall of the copper-phosphorous alloy layer 106 in a conformal manner.

Referring to FIG. 6B-5 and FIG. 6B-5', FIG. 6B-5 is a top view of a horizontal plane Q1 of the interconnect structure, as shown in FIG. 6B, during intermediate stages of manufacturing operations, FIG. 6B-5' is a perspective view of a conductive via shown in FIG. 6B-5, in accordance with some embodiments of the present disclosure. The configuration of the first conductive feature 105A shown in FIG. 6B-5 is similar to the one discussed in FIG. 6B-4, but the difference resides in that the primary portion 105P has a shape substantially similar to a quadrilateral (such as square or rectangle), wherein the secondary portions 105S are arranged along each sides of the primary portion 105P. The primary portion 105P has a width WD, wherein the width WD would depend on the application of the device that includes the interconnect structure discussed in present disclosure. Furthermore, a number of secondary portions 105S arranged on one side of the primary portion 105P is also depending on the application of the device, as well as the working frequency of the signal that would pass through the first conductive feature 105A. Particularly, a skin depth δ is inversely proportional to a square root of working frequency F, and a number N of secondary portions 105S arranged on one side of the primary portion 105P is proportional to the width WD, while The number N may be inversely proportional to the skin depth δ. The present disclosure provides corresponding formula or equation:

Skin depth $\delta = [2\rho/(2\pi F \cdot \mu_R \cdot \mu_0)]^{\wedge}0.5$, wherein ρ is resistivity of the conductive material (for example, 1.67 μΩ·cm), $\mu_R$ is relative permeability of the conductive material, $\mu_0$ is magnetic permeability of free space, F is working frequency.

Present disclosure provides a basis for determining the number N of secondary portions 105S arranged on one side of the primary portion 105P: N is about (WD/δ−1)/2, wherein WD is the width WD of the primary portion 105P as discussed above. Herein the width WD depends on the application (for example, the type of electronic device that adopts the aforesaid interconnect structure) as well as the working frequency of said electronic device.

For example, for some integrated circuit (IC) chips (especially for the top metal layer or the level directly below top metal layer, or for a through silicon via of a IC), the width WD may be around or larger than 25 μm. In the applications that the width WD is 25 μm, and the working frequency is 4 GHz, the number N of secondary portions 105S arranged on one side of the primary portion 105P may be 11. (The calculated result of number N is 11.65, but the portion of number behind the decimal point can be omitted. Alternatively, the calculated result may also be rounded off.) For the working frequency of 6 GHz, 8 GHz, 10 GHz, the corresponding number N of secondary portions 105S arranged on one side of the primary portion 105P (wherein the width WD is 25 μm) may be respectively 14, 16, and 18.

For example, for some integrated circuit carrier, the width WD may be as large as 30 μm. In the applications that the width WD is 30 μm, and the working frequency is 4 GHz, the number N of secondary portions 105S arranged on one side of the primary portion 105P may be 14. For the working frequency of 6 GHz, 8 GHz, 10 GHz, the corresponding number N of secondary portions 105S arranged on one side of the primary portion 105P (wherein the width WD is 30 μm) may be respectively 17, 20, and 22.

For example, for some printed circuit board (PCB), the width WD may be around or larger than 40 μm. In the applications that the width WD is 40 μm, and the working frequency is 4 GHz, the number N of secondary portions 105S arranged on one side of the primary portion 105P may be 19. For the working frequency of 6 GHz, 8 GHz, 10 GHz, the corresponding number N of secondary portions 105s arranged on one side of the primary portion 105P (wherein the width WD is 40 μm) may be respectively 23, 27, and 30.

In the embodiments of incorporating the aforesaid first conductive feature 105A in a 3D package, such as using the aforesaid first conductive feature 105A as a through via of the 3D package, the width WD may be in a range from about 50 μm to about 100 μm.

For example, for some high power device (such as high power PCB or high power IC), the width WD may be around or larger than 100 μm. In the applications that the width WD is 100 μm, and the working frequency is 4 GHz, the number N of secondary portions 105S arranged on one side of the primary portion 105P may be 48. For the working frequency of 6 GHz, 8 GHz, 10 GHz, the corresponding number N of secondary portions 105S arranged on one side of the primary portion 105P (wherein the width WD is 100 μm) may be respectively 59, 68, and 80.

For example, for some high power Insulated Gate Bipolar Transistor (IGBT), or Metal-Oxide-Semiconductor Field-Effect Transistor (MOSFET), the width WD may be around or larger than 120 μm. In the applications that the width WD is 120 μm, and the working frequency is 4 GHz, the number N of secondary portions 105S arranged on one side of the primary portion 105P may be 57. For the working frequency of 6 GHz, 8 GHz, 10 GHz, the corresponding number N of secondary portions 105S arranged on one side of the primary portion 105P (wherein the width WD is 120 μm) may be respectively 71, 82, and 91.

Further, depths of the secondary portions 105S of the first conductive feature 105A discussed in FIG. 6B-1, FIG. 6B-2, FIG. 6B-3, FIG. 6B-4, and FIG. 6B-5 may be corresponding to the depths of the fourth recess R4, as discussed in FIG. 4. A depth direction of each secondary portions 105S may be along Z direction. The secondary portions 105S may include first repeated geometric features.

Figures 2, 6B:
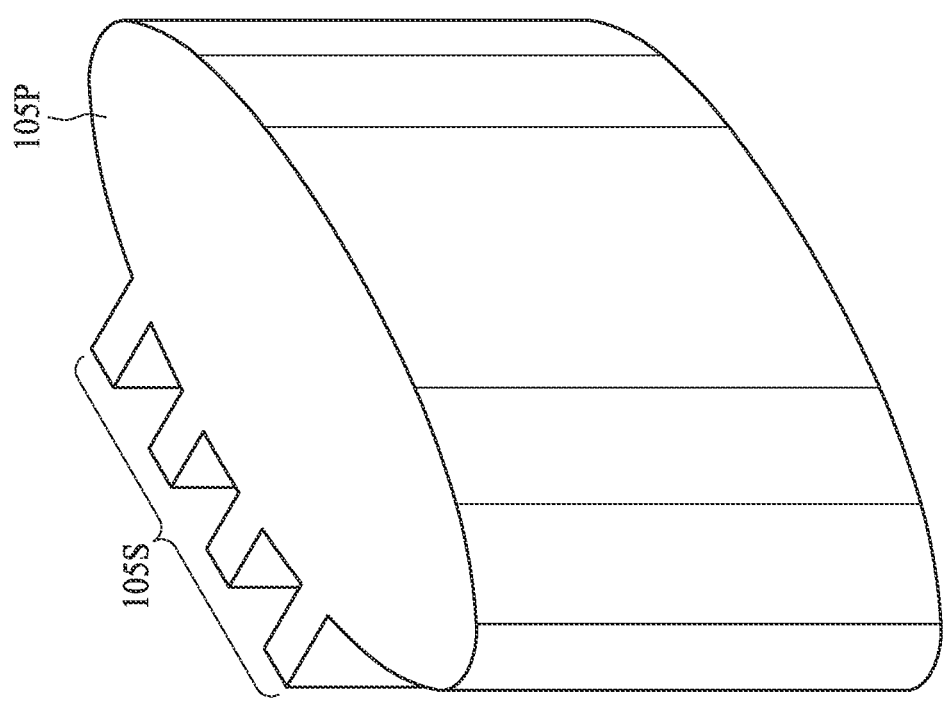
Figures 2, 6B:
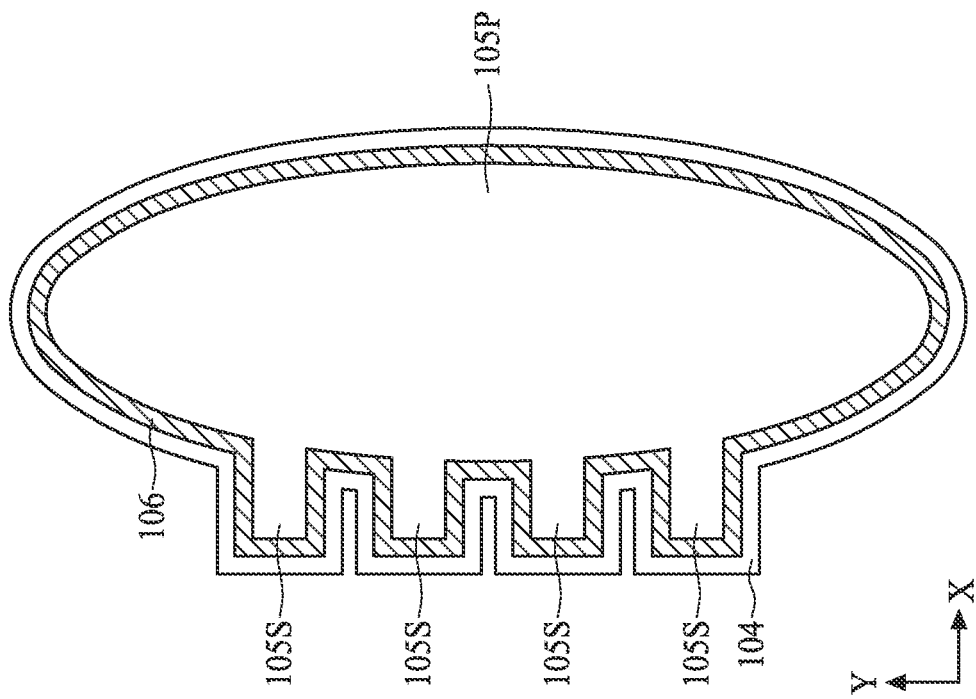
Figures 3, 6B:
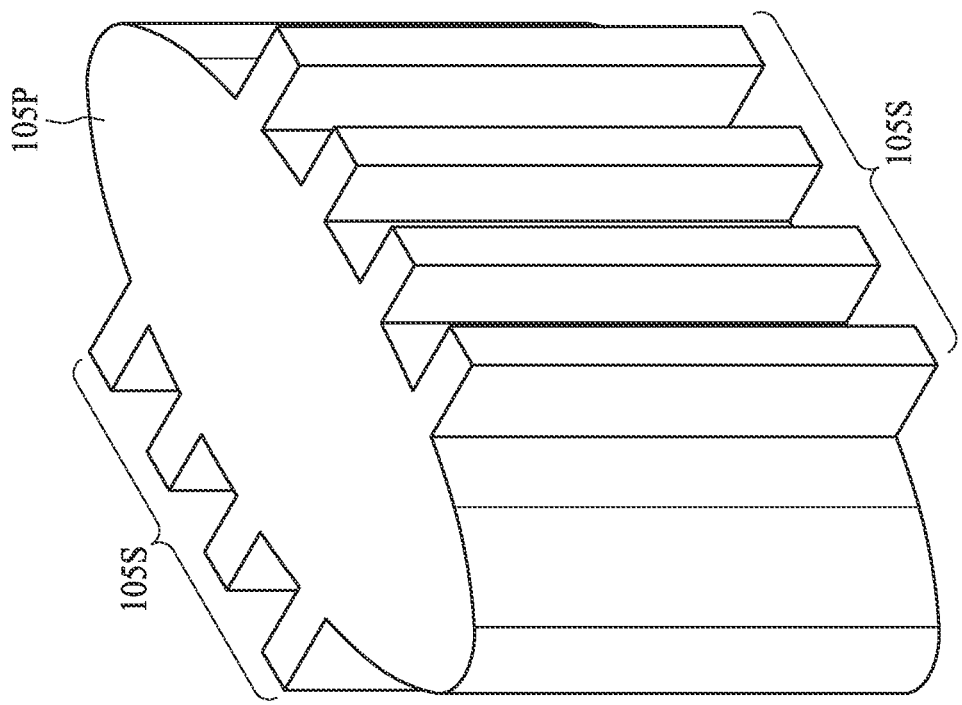
Figures 3, 6B:
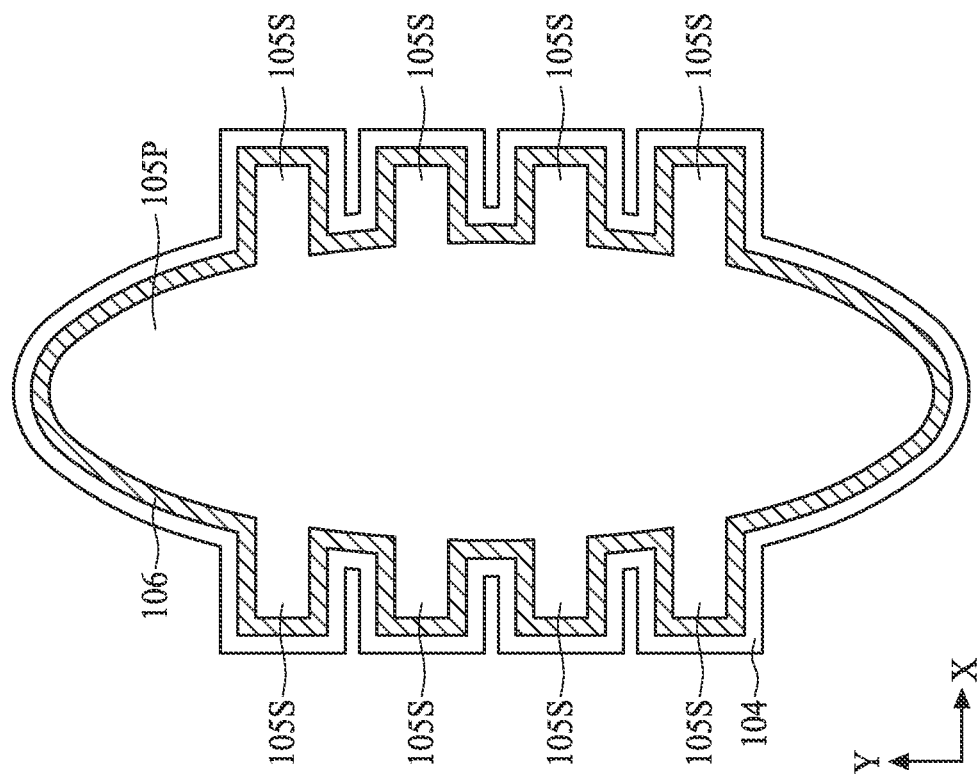
Figures 4, 6B:
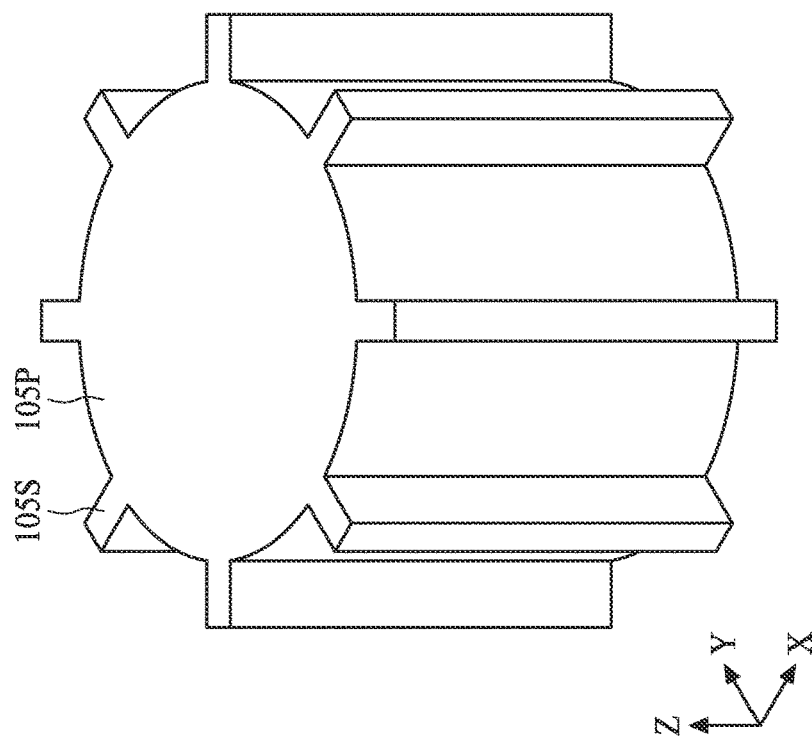
Figures 4, 6B:
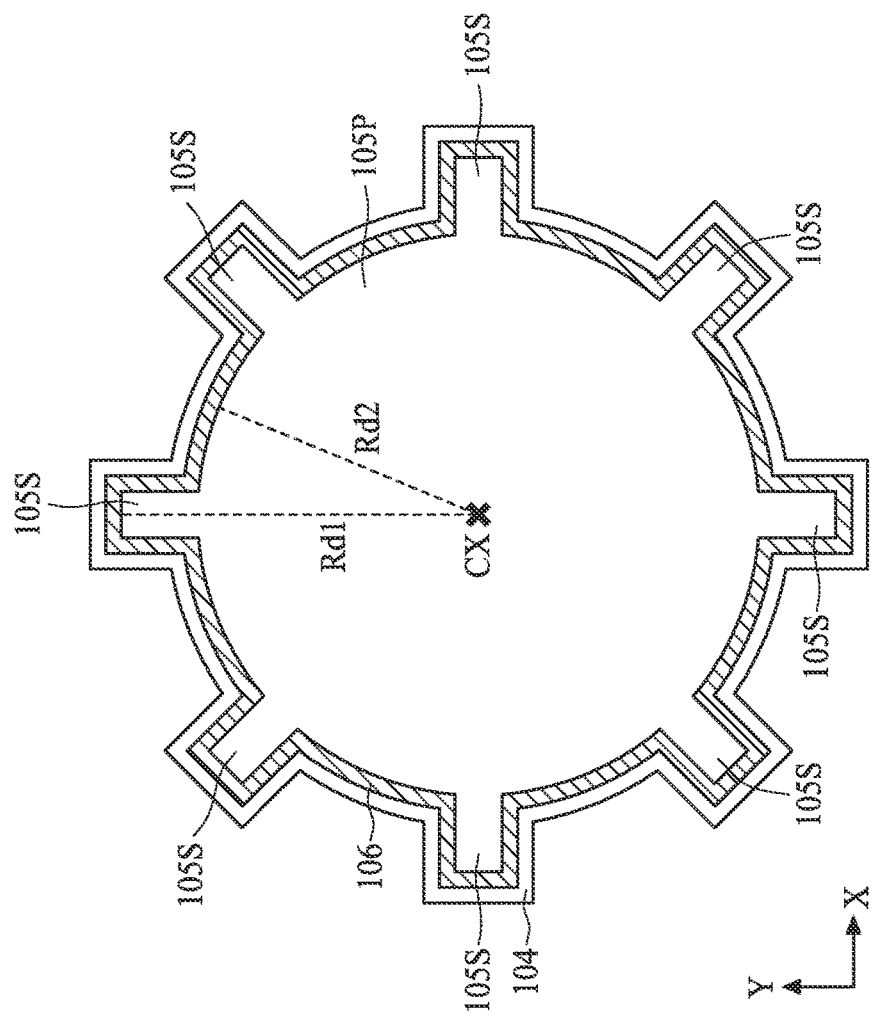
Figures 6, 6B:
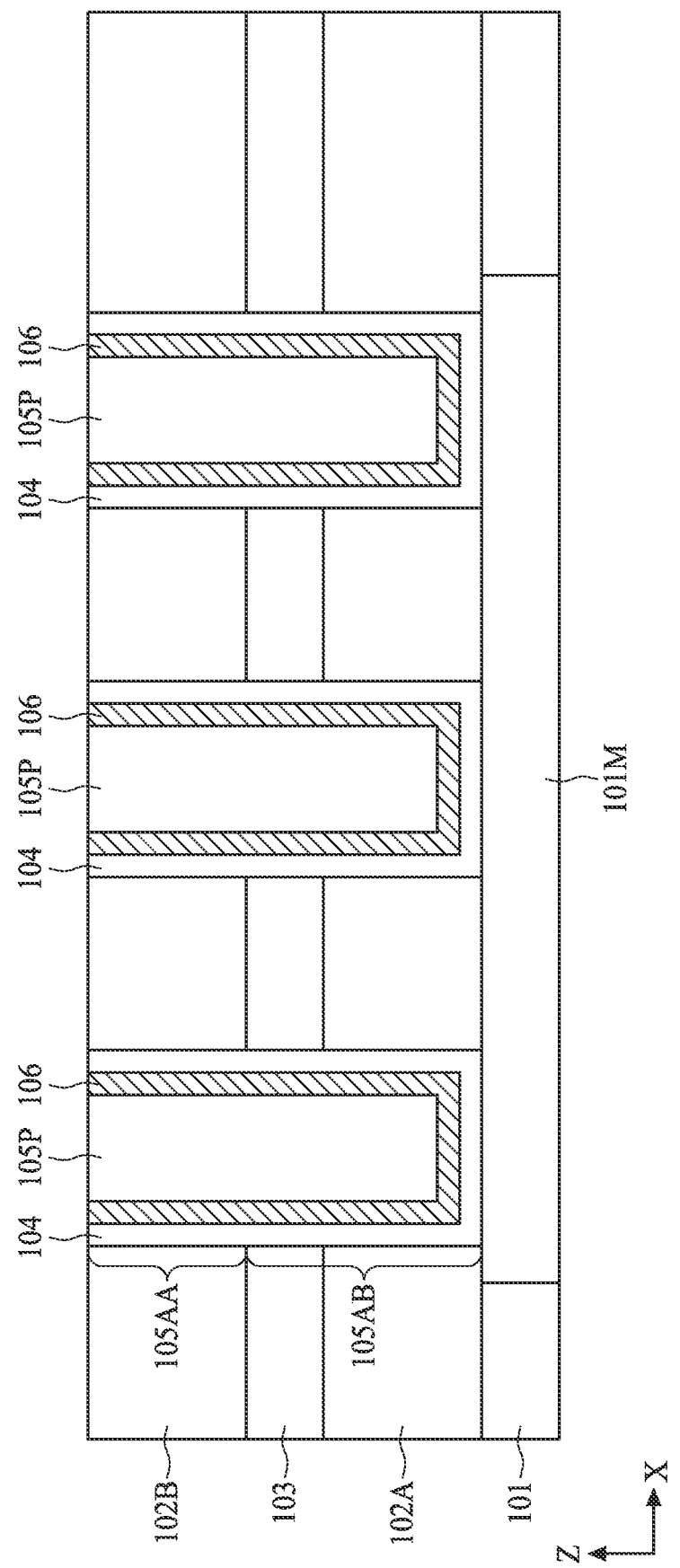

Referring to FIG. 6B-6 and FIG. 6B-6', FIG. 6B-6 is a top view of a horizontal plane Q1 of the interconnect structure, as shown in FIG. 6B, during intermediate stages of manufacturing operations, FIG. 6B-6' is a perspective view of a primary portion of a conductive via shown in FIG. 6B-6, FIG. 6B-6" is a cross section along Jr-Jr of the interconnect structure shown in FIG. 6B-6, in accordance with some embodiments of the present disclosure. In some alternative embodiments, the primary portion 105P being configured as grid shape (e.g. similar to that of window) can also effectively increase surface area to address the skin effect issues. For example, one or more inner sidewalls 105H extending along Z direction are disposed in primary portion 105P, which can increase the surface area of the primary portion 105P. Each inner sidewalls 105H may surround a portion of the second ILD layer 102B, a portion of the etch stop layer 103 and a portion of the first ILD layer 102A (shown in FIG. 6B-6"). An outer sidewall 105H' can also be identified in proximal to the edge of the primary portion 105P. As shown in FIG. 6B-6, a plurality of inner sidewalls 105H define a region or space accommodating the first ILD layer 102A. From a top view perspective, a plurality of regions or spaces, for example, 4 tetragonal regions, are defined by the inner sidewalls 105H. The copper-phosphorous alloy layer 106 is configured to laterally surround the outer sidewall 105H' of the first conductive feature 105A in a conformal manner, and the barrier layer 104 laterally surrounding an outer sidewall of the copper-phosphorous alloy layer 106 in a conformal manner. A copper-phosphorous alloy layer 106 and a barrier layer 104 may be further surrounded by each of the inner sidewalls 105H of the primary portion 105P. The forming of the interconnect structure discussed in FIG. 6B-6 may include defining a recess that has a grid shape (i.e. the positions of the inner sidewalls 105H are defined) in the second ILD layer 102B, the etch stop layer 103 and the first ILD layer 102A (wherein a plurality of protrusions including a portion of the second ILD layer 102B, a portion of the etch stop layer 103 and a portion of the first ILD layer 102A may be remained standing in the recess), followed by the forming of the barrier layer 104 and the copper-phosphorous alloy layer 106. Further, the primary portion 105P is formed by filling a conductive material in the aforesaid recess and performing a CMP operation. Such configuration may alleviate skin effect issue and further improve thermal management in terms of heat dissipation because a greater surface area of the conductive material can be obtained. In addition, the increase of parasitic capacitance around adjacent areas by the previous method can be alleviated with such configuration, thereby alleviating issues related to electromagnetic compatibility (EMC) and electromagnetic interference (EMI).

Figure 6C:
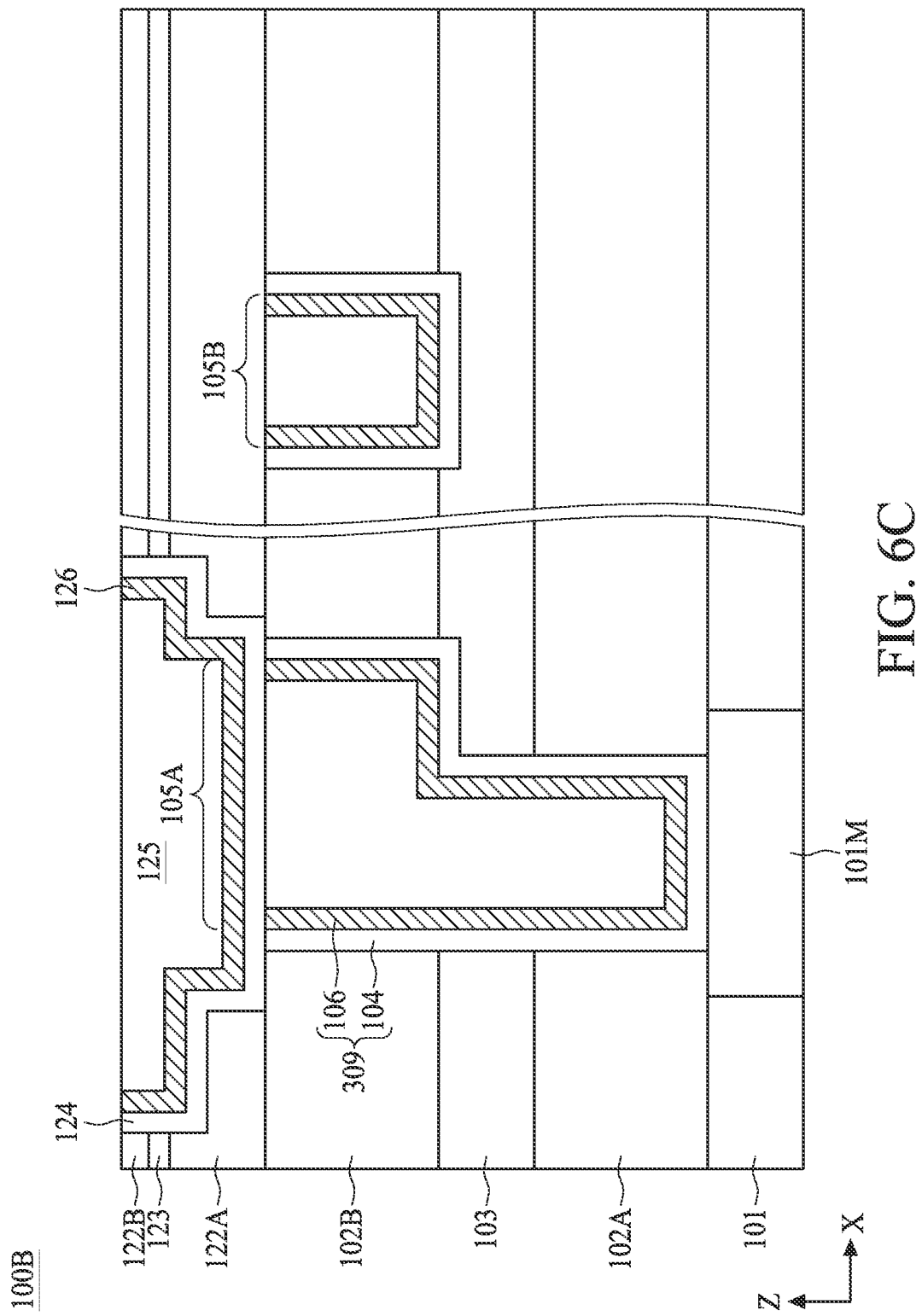
FIG. 6C is a cross section of an interconnect structure during intermediate stages of manufacturing operations, in accordance with some embodiments of the present disclosure.

Referring to FIG. 6C, FIG. 6C is a cross section of an interconnect structure during intermediate stages of manufacturing operations, in accordance with some embodiments of the present disclosure. In some embodiments, a conductive path 125 can be formed over the first conductive feature 105A and/or the second conductive feature 105B to form an interconnect structure 100B. For example, a third ILD layer 122A is formed over the first conductive feature 105A and the second conductive feature 105B, an etch stop layer 123 is formed over the third ILD layer 122A, and a fourth ILD layer 122B is formed over the etch stop layer 123. Further, a conductive feature 125 can be formed to be electrically connected to the first conductive feature 105A or the second conductive feature 105B. A portion of the conductive feature 125 may be laterally surrounded by the third ILD layer 122A, the etch stop layer 123, and the fourth ILD layer 122B. The conductive feature 125 may be formed by damascene operation, dual damascene operation, conductive material deposition, sputtering, electroplating, or other suitable operations. In some embodiments, a barrier layer 124 and a wetting layer 126 can be formed to be lining at sidewalls and/or a portion of a bottom surface of the conductive feature 125. A material of the wetting layer 126 may include copper-phosphorous alloy (such as $Cu_3P$). In alternative embodiments, the barrier layer 124 may include one of the Ti, TiN, TaN, $W_2N$, W, titanium-based material, tantalum-based material, metal nitride, or other suitable material that can alleviate diffusion.

Especially in advanced technology application (such as $5^{th}$ generation mobile networks, $6^{th}$ generation mobile networks, artificial intelligence, or the like), the issue of resistance is even more important due to skin effect, that is, electrons may accumulate at the surface of conductive wirings (especially when transmitting a high-frequency signal), thereby increasing resistance and deteriorating device performance. The use of copper-phosphorous alloy enables the fabrication of complexed conductive paths. In addition, conductive paths having a corrugated profile either at top surface and/or lower surface not only increases the effective surface area of the conductive wiring such that the skin effect can be alleviated and resistance can be decreased, but also substantially alleviating the parasitic capacitance. Thereby, the transmission speed of signal can be improved. Accordingly, the embodiments of FIG. 7A to FIG. 7E" with conductive wiring having an upper corrugated profile, and the embodiments of FIG. 8A to FIG. 8F''' with conductive wiring having a corrugated profile on either one of two sides will be discussed below.

Figure 7A:
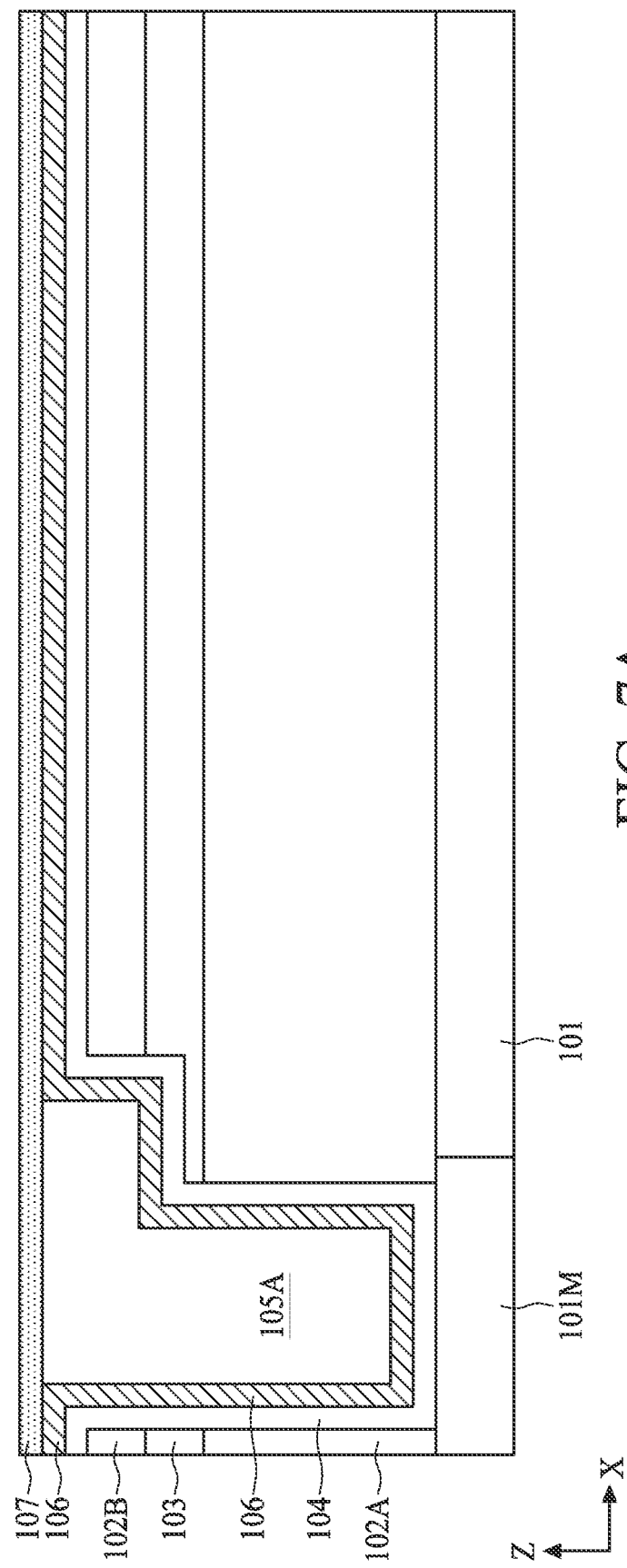
FIG. 7A is a cross section of an interconnect structure during intermediate stages of manufacturing operations, in accordance with some embodiments of the present disclosure.

Referring to FIG. 7A, FIG. 7A is a cross section of an interconnect structure during intermediate stages of manufacturing operations, in accordance with some embodiments of the present disclosure. After forming the first conductive feature 105A discussed in FIG. 6B (as well as FIG. 6B-1 to FIG. 6B-6), a conductive layer 107 is formed over the first conductive feature 105A as well as the barrier layer 104. In some embodiments, the conductive layer 107 may be made of copper and can be formed by electroplating operation as discussed in U.S. application Ser. No. 17/697,937 (entitled "Conductive structure including copper-phosphorous alloy and a method of manufacturing conductive structure"), which is hereby incorporated by reference in its entirety.

Figure 7B:
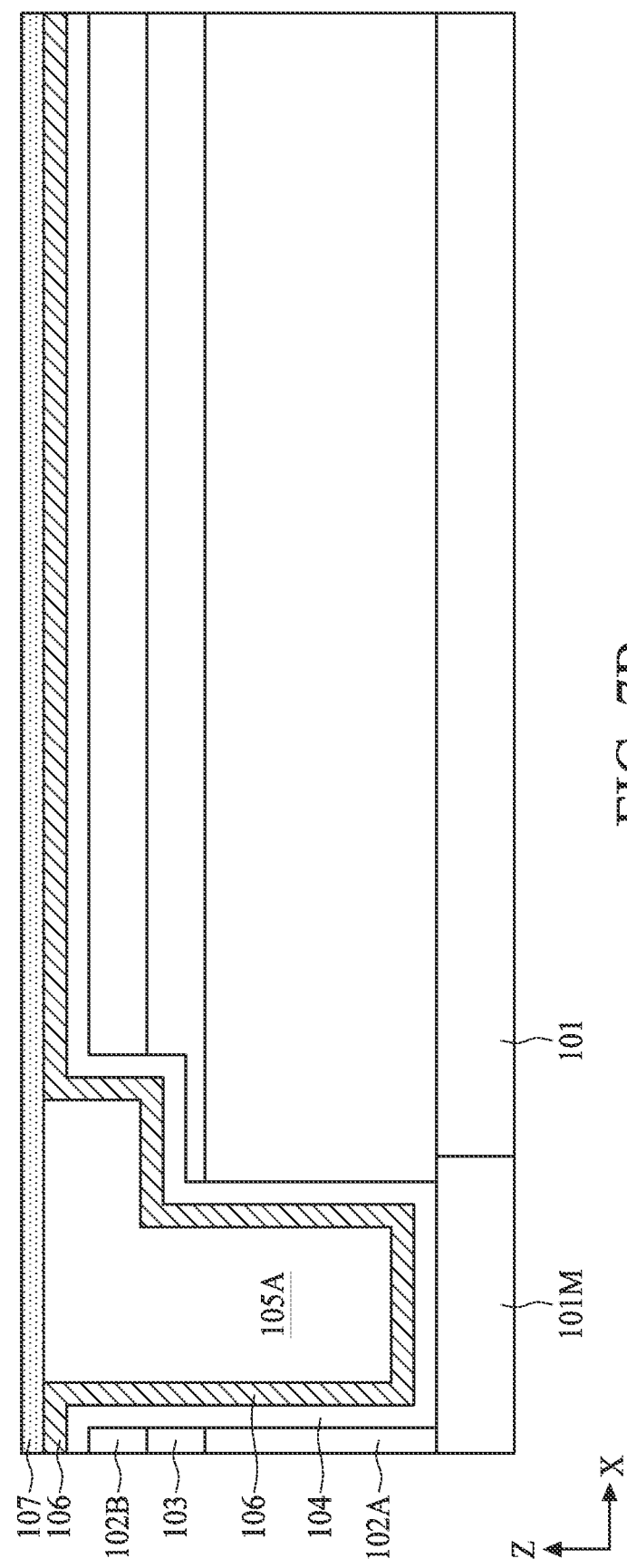
FIG. 7B is a cross section of an interconnect structure during intermediate stages of manufacturing operations, in accordance with some embodiments of the present disclosure.
Figure 7B:
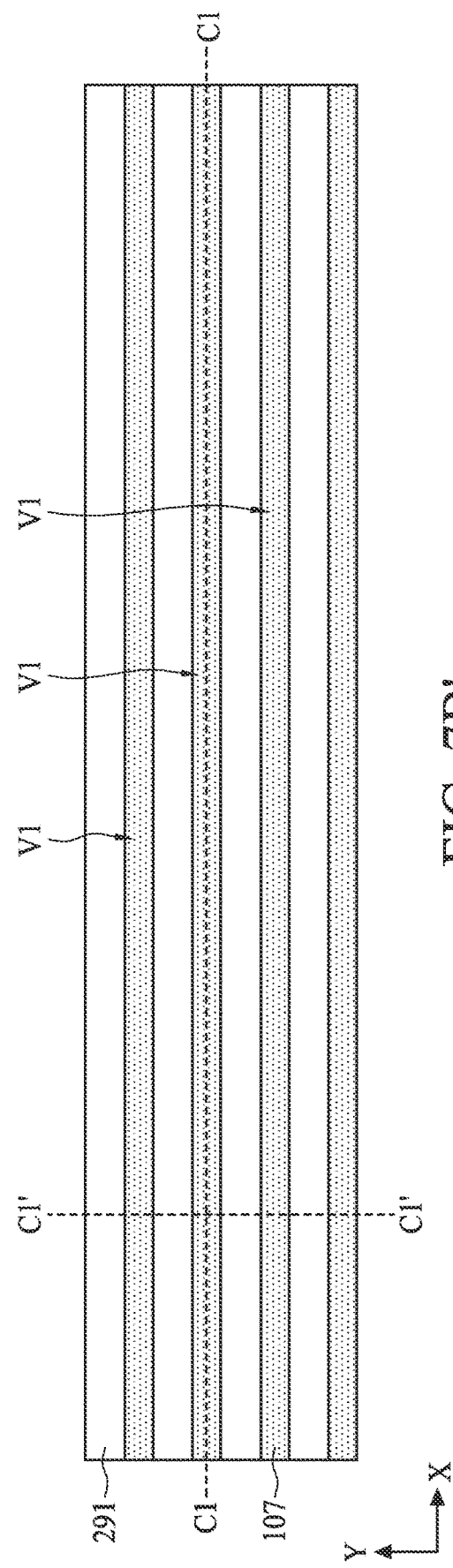

Referring to FIG. 7B, FIG. 7B', and FIG. 7B'', FIG. 7B is a cross section of an interconnect structure during intermediate stages of manufacturing operations, FIG. 7B' is a top view of the interconnect structure of FIG. 7B during intermediate stages of manufacturing operations, and FIG. 7B'' is a cross section along C1'-C1' of the interconnect structure shown in FIG. 7B', in accordance with some embodiments of the present disclosure. Further, FIG. 7B is an example of cross section C1-C1 of the interconnect structure shown in FIG. 7B'. A photoresist 291 (e.g., can be a positive or a negative resist) is formed over the conductive layer 107 by coating and baking operation. By patterning the photoresist 291, a plurality of trenches V1 that expose the underlying conductive layer 107 is formed, and a top profile of the photoresist 291 is defined. In some embodiments, the plurality of trenches V1 extends along X direction. In some embodiments, the patterned photoresist 291 forms a corrugated profile at the completion of the operation illustrated in FIG. 7B' or FIG. 7B''.

Figure 7C:
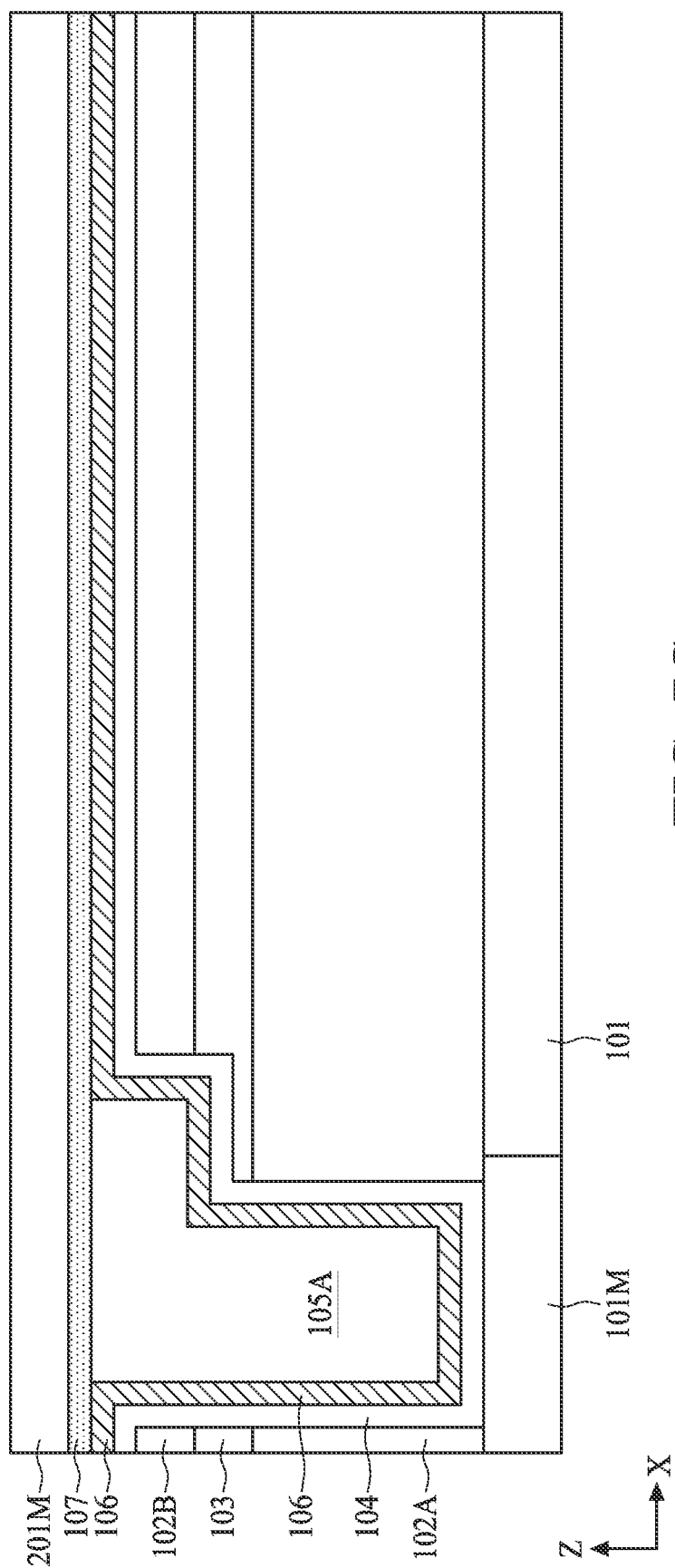
FIG. 7C is a cross section of an interconnect structure during intermediate stages of manufacturing operations, in accordance with some embodiments of the present disclosure.

Referring to FIG. 7C, FIG. 7C', and FIG. 7C'', FIG. 7C is a cross section of an interconnect structure during intermediate stages of manufacturing operations, FIG. 7C' is a top view of the interconnect structure of FIG. 7C during intermediate stages of manufacturing operations, and FIG. 7C'' is a cross section along C2'-C2' of the interconnect structure shown in FIG. 7C', in accordance with some embodiments of the present disclosure. Further, FIG. 7C is an example of cross section C2-C2 of the interconnect structure shown in FIG. 7C'. An electroplating operation is performed to form a copper material layer 201M, or other conductive feature, over the photoresist 291 and filling the trenches V1 patterned therein. In some embodiments, a thickness of the copper material layer 201M is smaller than that of the photoresist 291 so that the top surface of the photoresist 291 is higher than the top surface of the copper material layer 201M filling the trenches. In some embodiments, the photoresist 291 may be a dry film photoresist. In some alternative embodiments, the photoresist 291 may include a negative photoresist such as polyisoprene rubber or a positive resist such as Novolac resin, an epoxy-based photoresist material (such as SU-8 photoresist, or the like) or polymer material (such as Polymethyl methacrylate (PMMA), or the like).

Figure 7D:
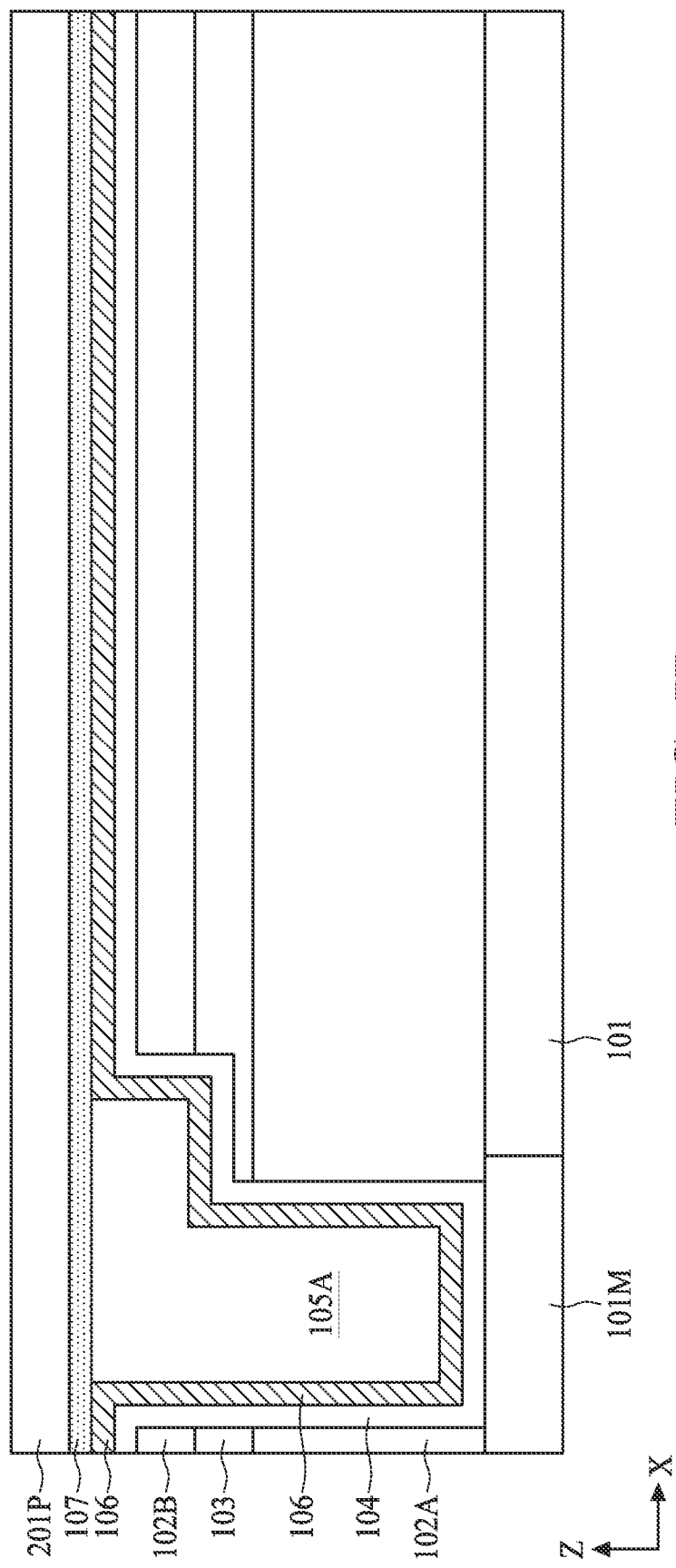
FIG. 7D is a cross section of an interconnect structure during intermediate stages of manufacturing operations, in accordance with some embodiments of the present disclosure.
Figure 7D:
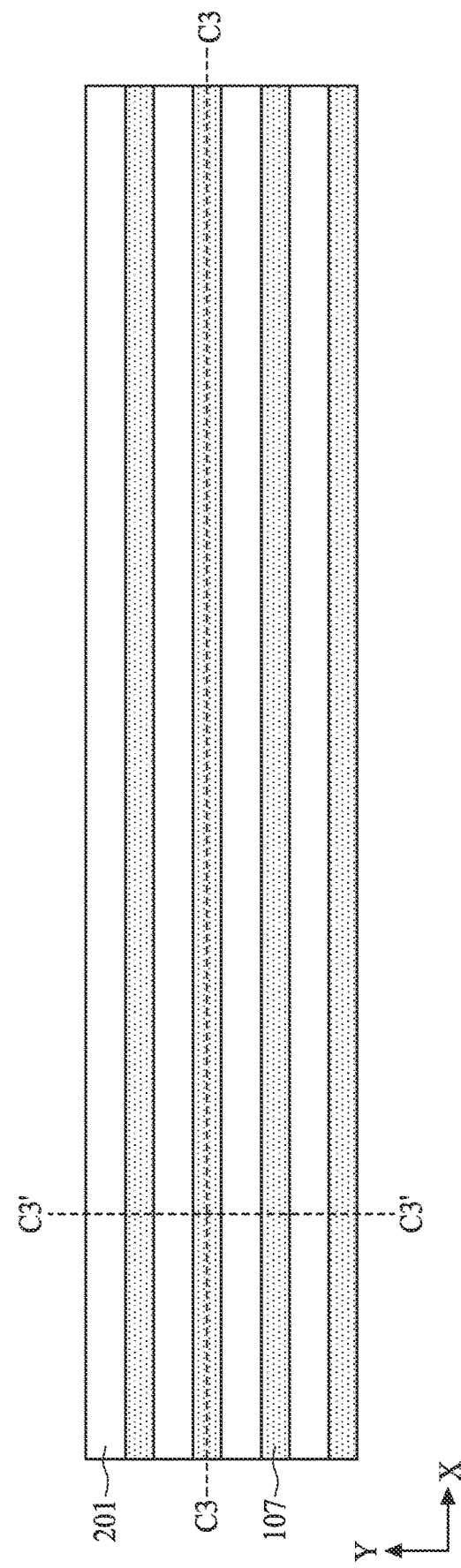

Referring to FIG. 7D, FIG. 7D', and FIG. 7D'', FIG. 7D is a cross section of an interconnect structure during intermediate stages of manufacturing operations, FIG. 7D' is a top view of the interconnect structure of FIG. 7D during intermediate stages of manufacturing operations, and FIG. 7D'' is a cross section along C3'-C3' of the interconnect structure shown in FIG. 7D', in accordance with some embodiments of the present disclosure. Further, FIG. 7D is an example of cross section C3-C3 of the interconnect structure shown in FIG. 7D'. A lift-off operation is performed to remove the portion of the copper material layer 201M (shown in FIG. 7C) on top of the photoresist 291. The other portion of the copper material layer 201M that fills the trenches may also be consumed by a limited amount due to the shielded position in view of the adjacent higher photoresist 291 (shown in FIG. 7C). A portion of the copper material layer 201M is remained, thereby forming a copper layer 201 (shown in FIG. 7D). In some embodiments, by the lift-off operation, and the corrugated profile of the copper layer 201 is obtained. A profile of the copper layer 201 is in accordance with the profile of each trenches V1, for example, the copper layer 201 extends along X direction. A plurality of surfaces of the corrugated profile is substantially parallel to a direction of electric current flowing therein (such as X direction), thereby alleviating issues of skin effect. The copper layer 201 is electrically connected to the conductive feature 105A (wherein the current therein may flow along the Z direction) through the conductive layer 107. Alternatively stated, the copper layer 201 is a metal feature that has a plurality of protrusions that are electrically connected to the conductive feature 105A.

Referring to FIG. 7E, FIG. 7E', and FIG. 7E'', FIG. 7E is a cross section of an interconnect structure 100C during intermediate stages of manufacturing operations, FIG. 7E' is a top view of the interconnect structure of FIG. 7E during intermediate stages of manufacturing operations, and FIG. 7E'' is a cross section along C4'-C4' of the interconnect structure shown in FIG. 7E', in accordance with some embodiments of the present disclosure. Further, FIG. 7E is an example of cross section C4-C4 of the interconnect structure shown in FIG. 7E'. A capping layer 202 is further formed over the corrugated profile of the copper layer 201 and the copper layer 107. In some embodiments, the capping layer 202 is made by a combination of copper-phosphorous (such as $Cu_3P$) and barrier layers (such as Ti, TiN, TaN, $W_2N$, W, titanium-based material, tantalum-based material, metal nitride, or other suitable material that can alleviate diffusion). The capping layer 202 may help alleviating diffusion issue from the copper layer 201, and further alleviating the oxidation of the copper layer 201. Further, an upper ILD layer 102C is formed over the capping layer 202. Thereby, an interconnect structure 100C is formed. In some embodiments, the upper ILD layer 102C may be made of inorganic material.

The embodiment(s) conductive paths having a corrugated profile in either one of two sides of the conductor wiring is discussed in FIG. 8A to FIG. 8F''' subsequently.

Figure 8A:
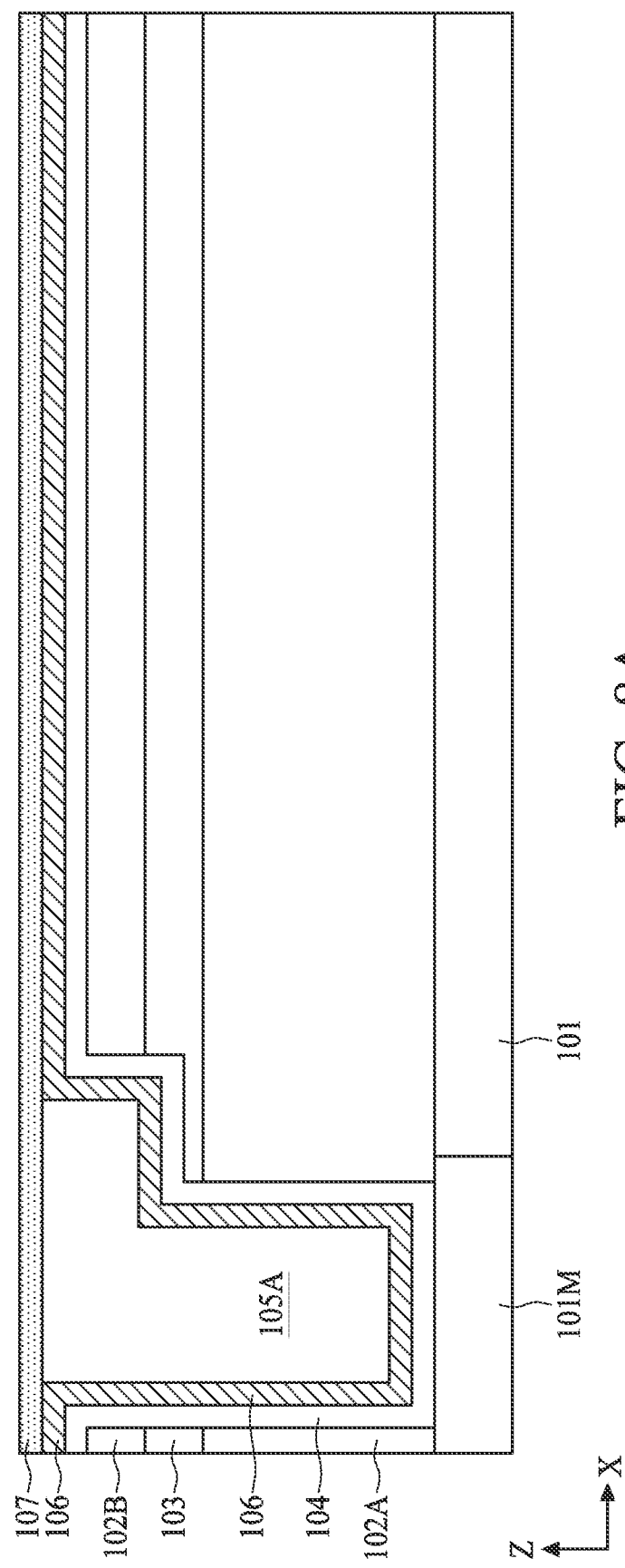
FIG. 8A is a cross section of an interconnect structure during intermediate stages of manufacturing operations, in accordance with some embodiments of the present disclosure.
Figure 8A:
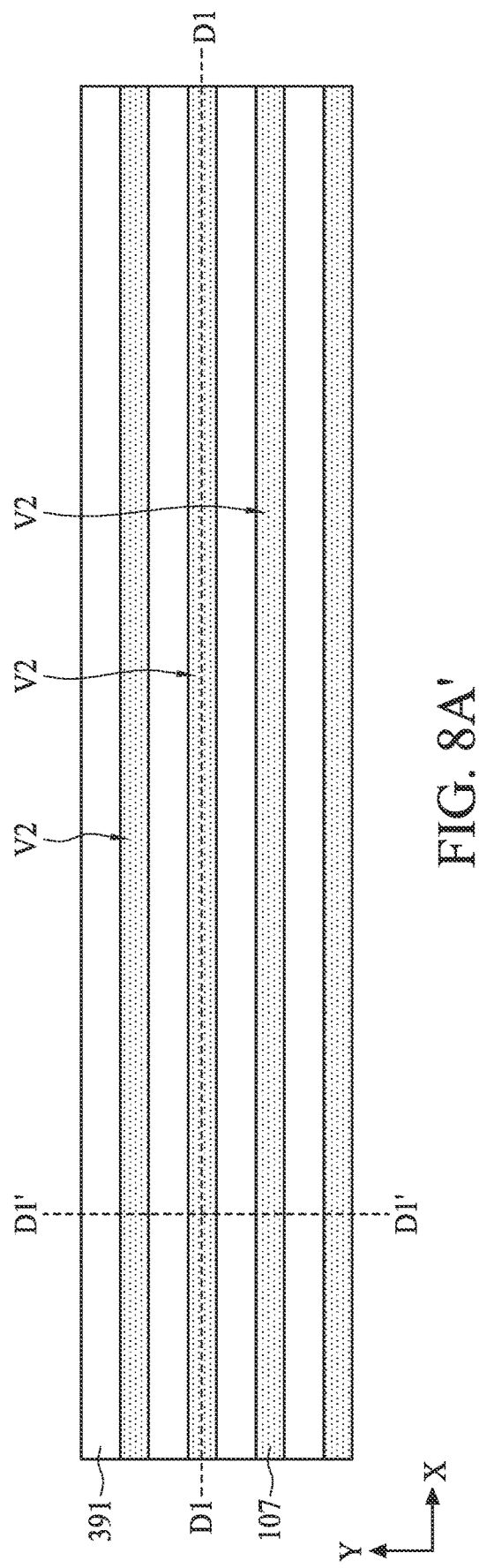
Figure 8A:
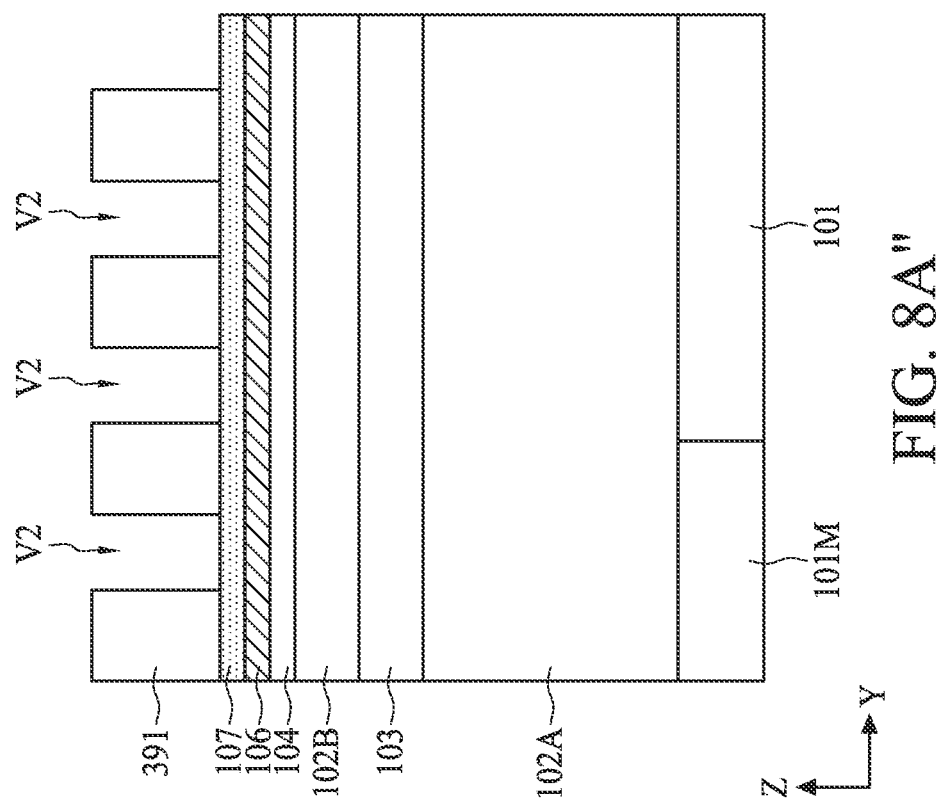

Referring to FIG. 8A, FIG. 8A', and FIG. 8A'', FIG. 8A is a cross section of an interconnect structure during intermediate stages of manufacturing operations, FIG. 8A' is a top view of the interconnect structure of FIG. 8A during intermediate stages of manufacturing operations, and FIG. 8A'' is a cross section along D1'-D1' of the interconnect structure shown in FIG. 8A', in accordance with some embodiments of the present disclosure. Further, FIG. 8A is an example of cross section D1-D1 of the interconnect structure shown in FIG. 8A'. After forming the first conductive feature 105A discussed in FIG. 6B (as well as FIG. 6B-1 to FIG. 6B-6), a copper layer 107 is formed over the first conductive feature 105A as well as the barrier layer 104. In some embodiments, the copper layer 107 may be formed by electroplating operation as discussed in U.S. application Ser. No. 17/697,937 (entitled "Conductive structure including copper-phosphorous alloy and a method of manufacturing conductive structure"), which is hereby incorporated by reference in its entirety. Further, a first photoresist 391 (e.g., can be a positive or a negative resist) is formed over the copper layer 107 by coating and baking operation. By patterning the first photoresist 391, a plurality of trenches V2 that exposes the underlying copper layer 107 is formed, and a top profile of the first photoresist 391 is defined. In some embodiments, the plurality of trenches V2 extends along X direction. In some embodiments, the first photoresist 391 may be a dry film photoresist. In some alternative embodiments, the first photoresist 391 may include a negative photoresist such as polyisoprene rubber or a positive resist such as Novolac resin, an epoxy-based photoresist material (such as SU-8 photoresist, or the like) or polymer material (such as Polymethyl methacrylate (PMMA), or the like).

Figure 8B:
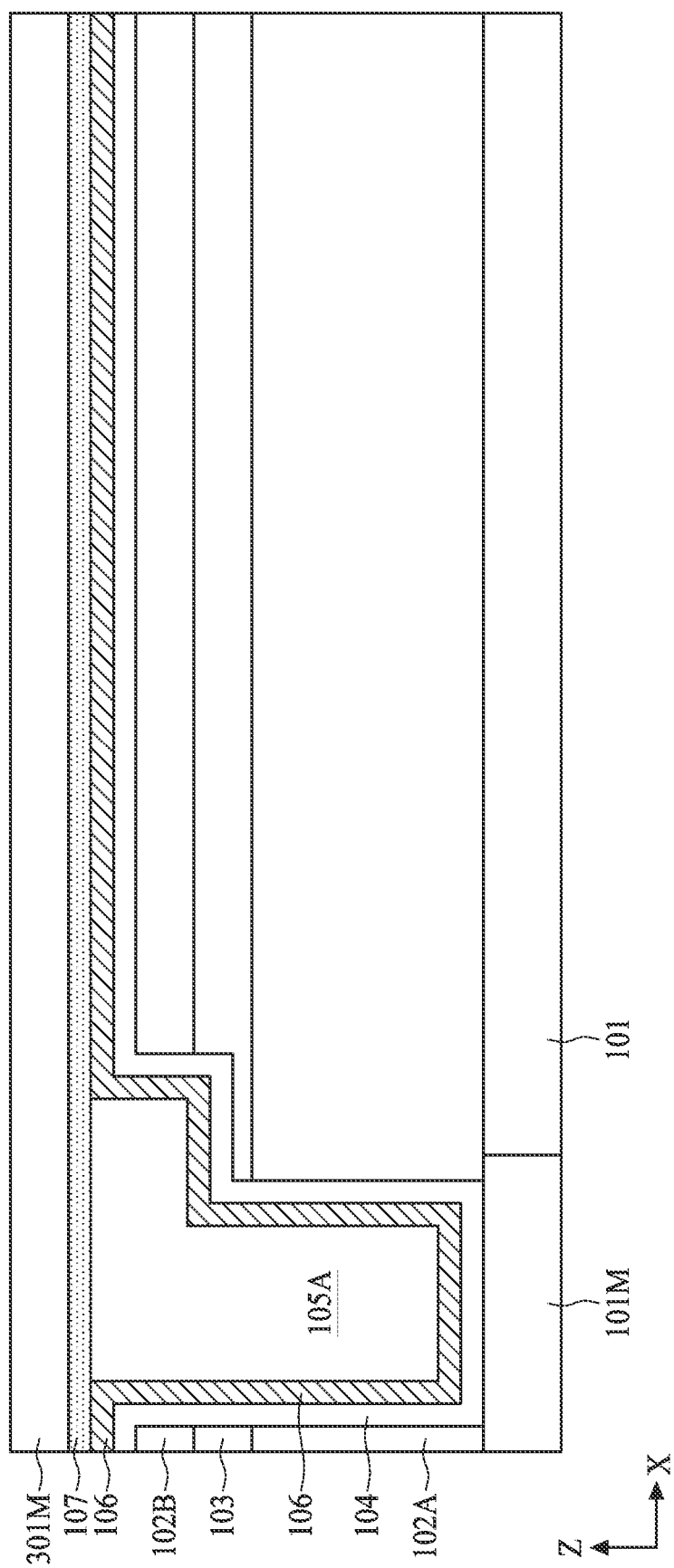
FIG. 8B is a cross section of an interconnect structure during intermediate stages of manufacturing operations, in accordance with some embodiments of the present disclosure.
Figure 8B:
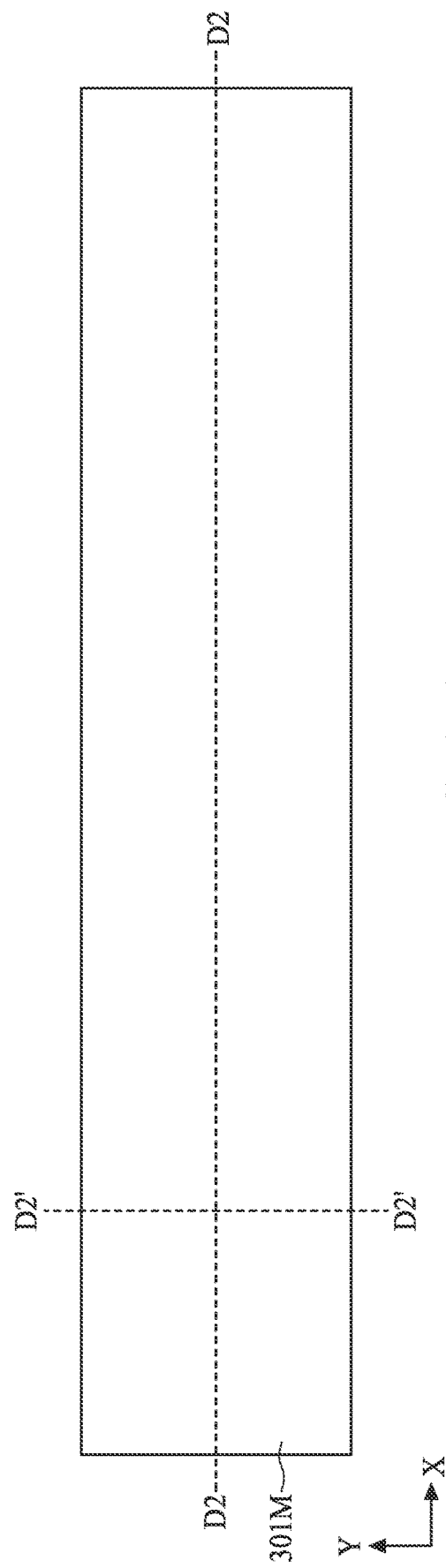
Figure 8B:
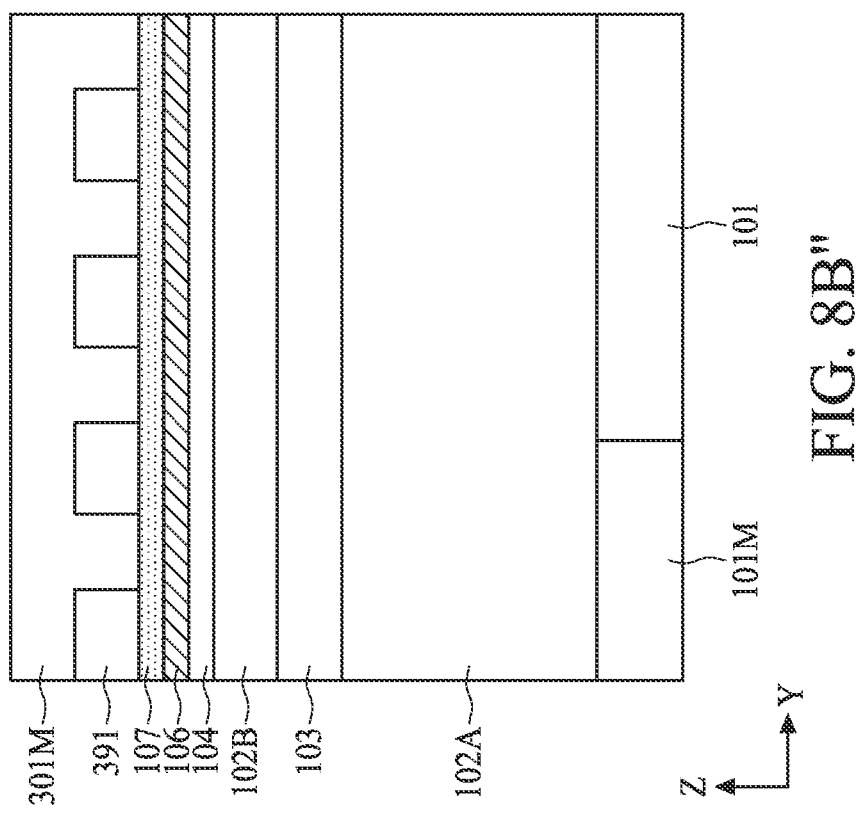

Referring to FIG. 8B, FIG. 8B', and FIG. 8B", FIG. 8B is a cross section of an interconnect structure during intermediate stages of manufacturing operations, FIG. 8B' is a top view of the interconnect structure of FIG. 8B during intermediate stages of manufacturing operations, and FIG. 8B" is a cross section along D2'-D2' of the interconnect structure shown in FIG. 8B', in accordance with some embodiments of the present disclosure. Further, FIG. 8B is an example of cross section D2-D2 of the interconnect structure shown in FIG. 8B'. An electroplating operation is performed to form a copper material layer 301M, or other conductive feature, over the first photoresist 391 and filling the trenches V2 patterned therein. In some embodiments, a thickness of the copper material layer 301M is greater than that of the photoresist 391 and covering a top surface of the photoresist 391. The copper material layer 301M formed in FIG. 8B" is referred to the first conductive material.

Figure 8C:
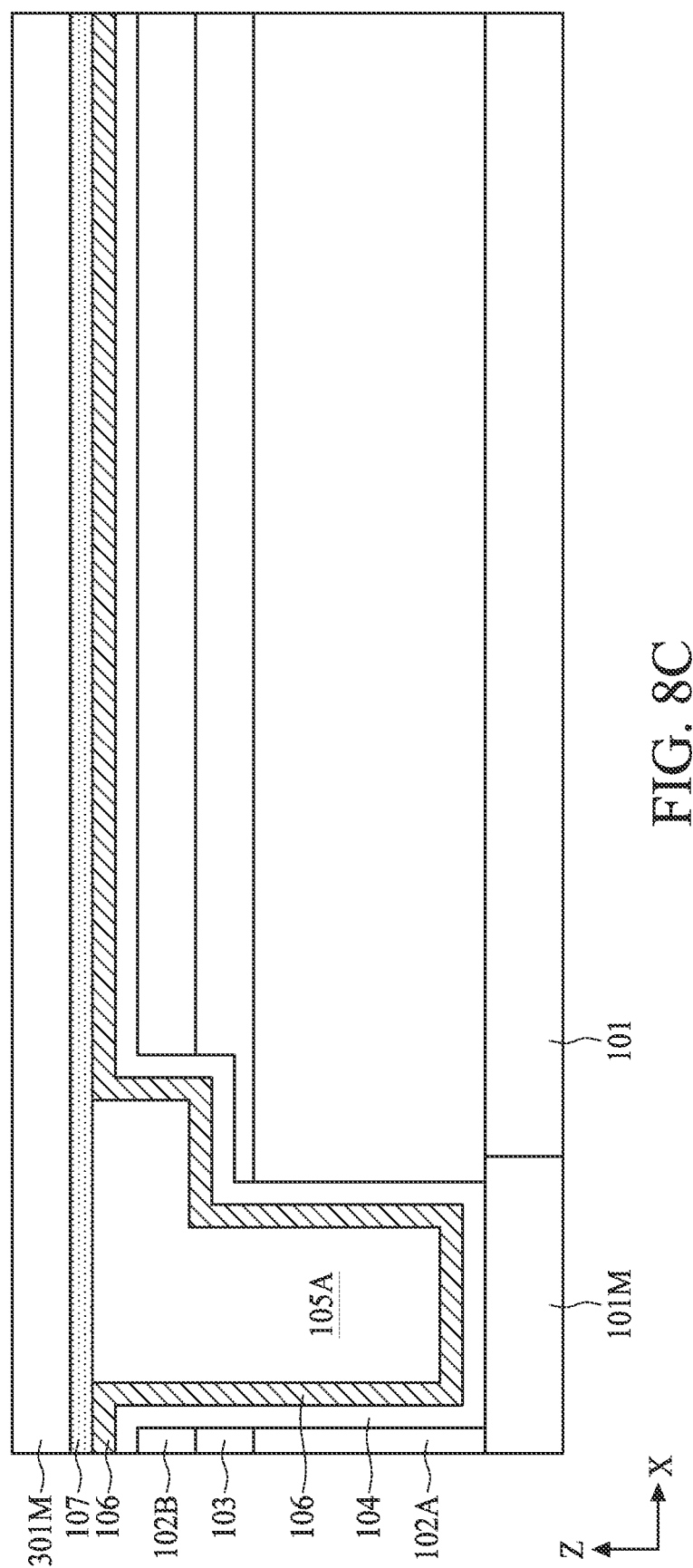
FIG. 8C is a cross section of an interconnect structure during intermediate stages of manufacturing operations, in accordance with some embodiments of the present disclosure.
Figure 8C:
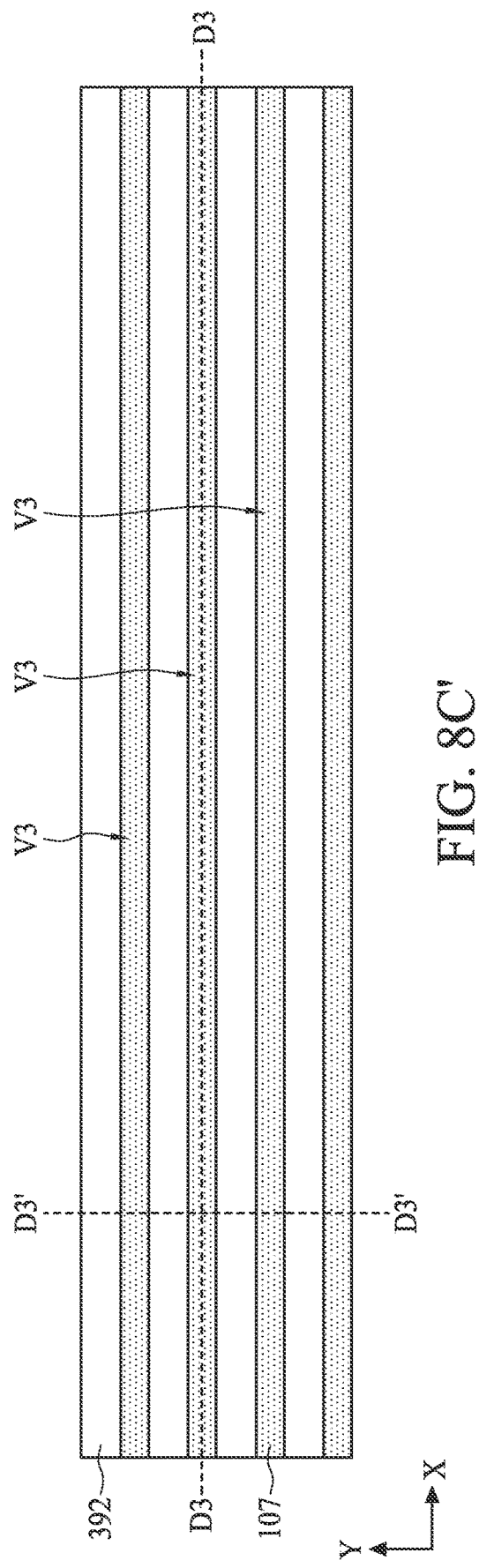

Referring to FIG. 8C, FIG. 8C', and FIG. 8C", FIG. 8C is a cross section of an interconnect structure during intermediate stages of manufacturing operations, FIG. 8C' is a top view of the interconnect structure of FIG. 8C during intermediate stages of manufacturing operations, and FIG. 8C" is a cross section along D3'-D3' of the interconnect structure shown in FIG. 8C', in accordance with some embodiments of the present disclosure. Further, FIG. 8C is an example of cross section D3-D3 of the interconnect structure shown in FIG. 8C'. A second photoresist 392 is patterned over the copper material layer 301M. By patterning the second photoresist 392, a plurality of trenches V3 that exposes the underlying copper material layer 301M is formed, and a top profile of the second photoresist 392 is defined. In some embodiments, the trench V3 extends along X direction, and in some of the embodiments, the positions of the trenches V3 may correspond to the positions of the plurality of trenches V2. In some embodiments, a polarity of the first photoresist 391 is identical to a polarity of the second photoresist 392. In some embodiments, both the first photoresist 391 and the second photoresist 392 are positive resist. In some embodiments, both the first photoresist 391 and the second photoresist 392 are negative resist. In some embodiments, a material of the first photoresist 391 is identical to a material of the second photoresist 392. In some embodiments, the second photoresist 392 may be a dry film photoresist. In some alternative embodiments, the second photoresist 392 may include a negative photoresist such as polyisoprene rubber or a positive resist such as Novolac resin, an epoxy-based photoresist material (such as SU-8 photoresist, or the like) or polymer material (such as Polymethyl methacrylate (PMMA), or the like).

Figure 8D:
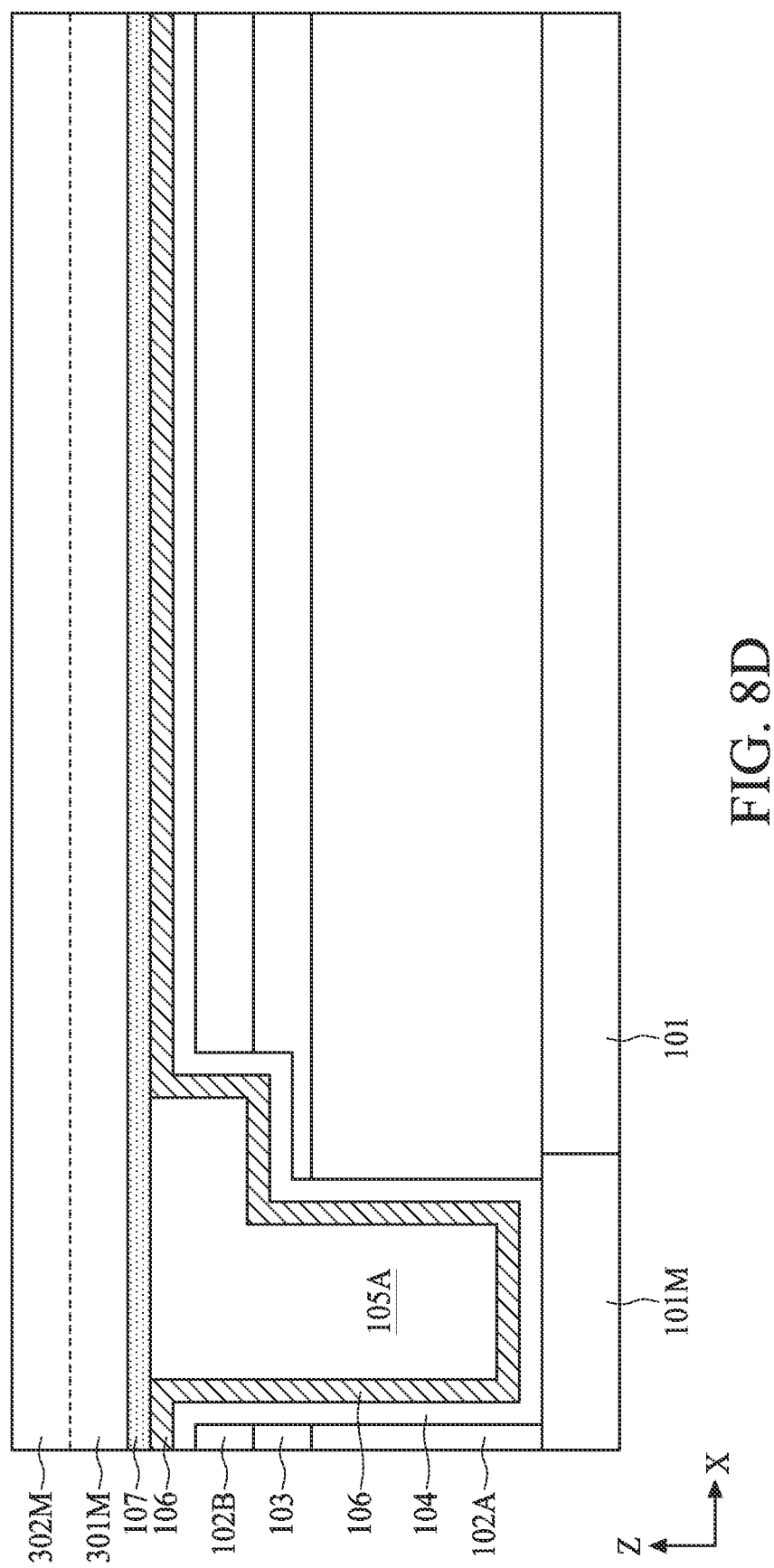
FIG. 8D is a cross section of an interconnect structure during intermediate stages of manufacturing operations, in accordance with some embodiments of the present disclosure.
Figure 8D:
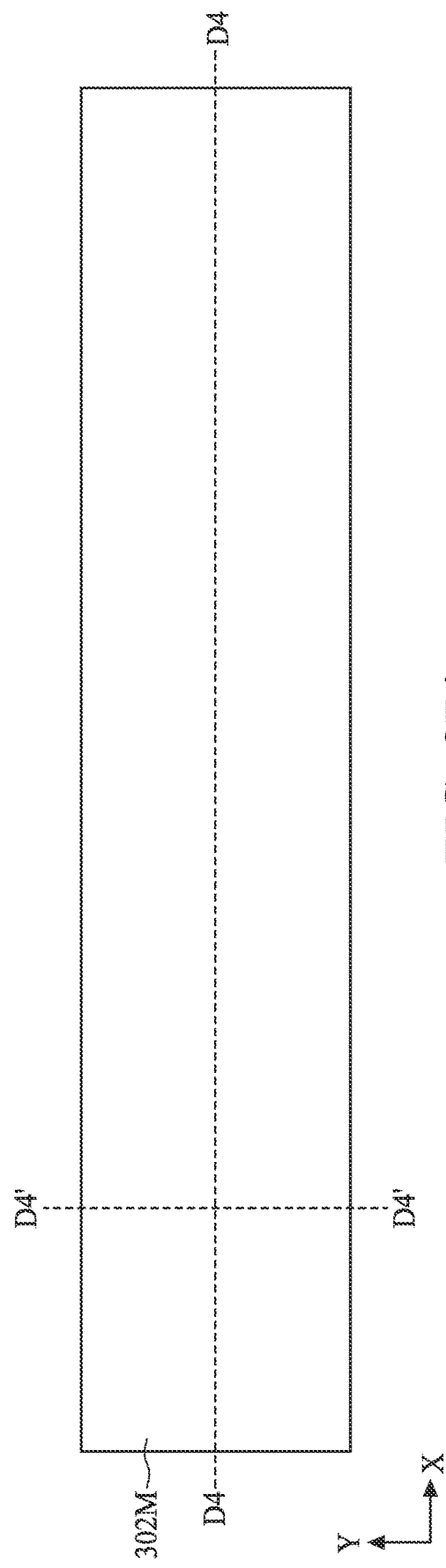

Referring to FIG. 8D, FIG. 8D', and FIG. 8D", FIG. 8D is a cross section of an interconnect structure during intermediate stages of manufacturing operations, FIG. 8D' is a top view of the interconnect structure of FIG. 8D during intermediate stages of manufacturing operations, and FIG. 8D" is a cross section along D4'-D4' of the interconnect structure shown in FIG. 8D', in accordance with some embodiments of the present disclosure. Further, FIG. 8D is an example of cross section D4-D4 of the interconnect structure shown in FIG. 8D'. An electroplating operation is performed to form a copper material layer 302M, or other conductive features, over the second photoresist 392 and filling the trenches V3 patterned therein. In some embodiments, a thickness of the copper material layer 302M is smaller than that of the second photoresist 392 so that the top surface of the second photoresist 392 is higher than the top surface of the copper material layer 302M filling the trenches, as shown in FIG. 8D". In some embodiments, in view of the copper material layer 301M, or the first conductive material, previously formed in FIG. 8B", the copper material layer 302M formed in FIG. 8D" is referred to the second conductive material. The first conductive material and the second conductive material may or may not composed of the same material. Since there are two deposition or plating operations involved in the formation of the conductive wiring 303, a boundary may be visible under proper contrasting treatment and microscopy technique.

Figure 8E:
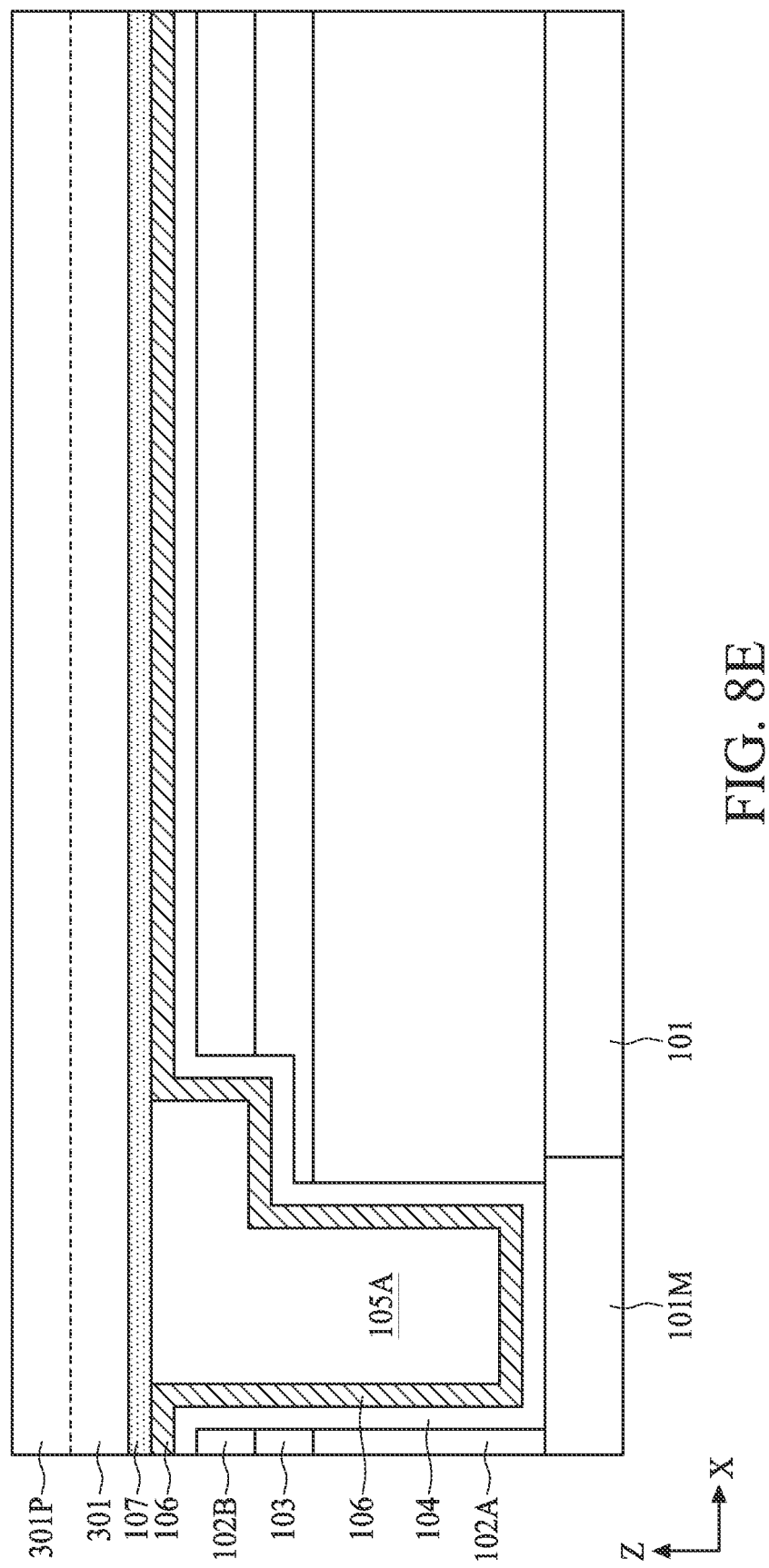
FIG. 8E is a cross section of an interconnect structure during intermediate stages of manufacturing operations, in accordance with some embodiments of the present disclosure.
Figure 8E:
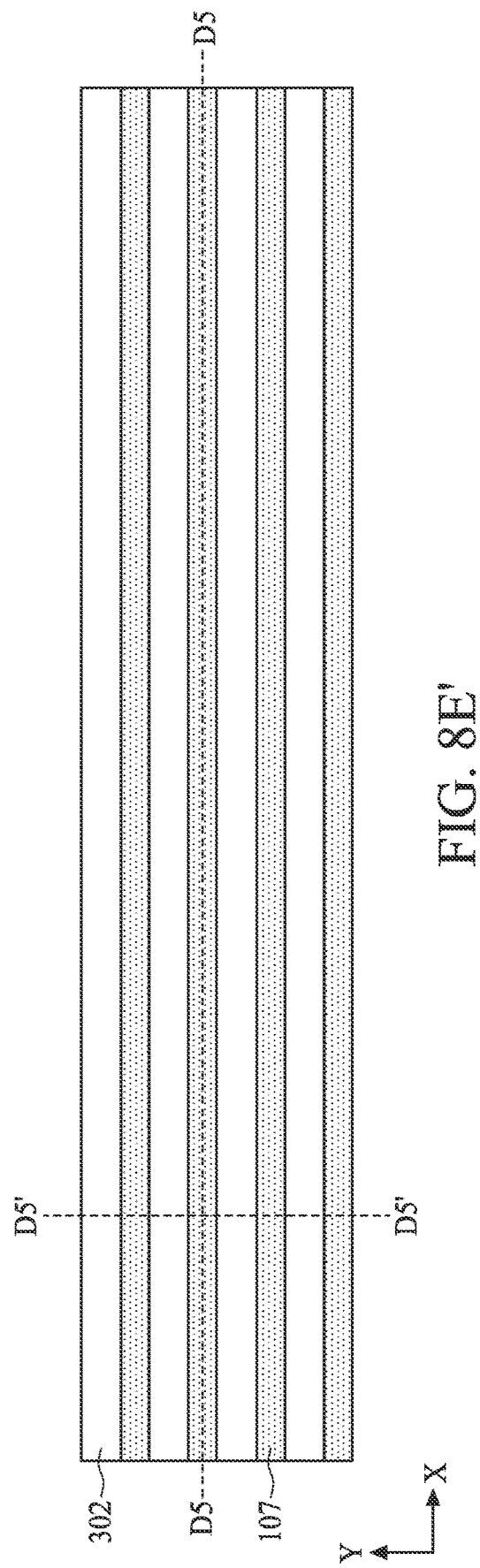

Referring to FIG. 8E, FIG. 8E', and FIG. 8E", FIG. 8E is a cross section of an interconnect structure during intermediate stages of manufacturing operations, FIG. 8E' is a top view of the interconnect structure of FIG. 8E during intermediate stages of manufacturing operations, and FIG. 8E" is a cross section along D5'-D5' of the interconnect structure shown in FIG. 8E', in accordance with some embodiments of the present disclosure. Further, FIG. 8E is an example of cross section D5-D5 of the interconnect structure shown in FIG. 8E'. Similar to the discussion in FIG. 7D, a lift-off operation is performed to remove the portion of the copper material layer 302M (shown in FIG. 8D) on top of the second photoresist 392 (shown in FIG. 8D). The other portion of the copper material layer 302M that fills the trenches may also be consumed by a limited amount due to the shielded position in view of the adjacent higher second photoresist 392. In some of the embodiments, the first photoresist 391 (shown in FIG. 9D) may also be removed, thereby forming gap(s) 391G at positions that was previously filled by first photoresist 391. Alternatively stated, the second photoresist 392 and the first photoresist 391 are removed in one removal operation. In some embodiments, the gaps 391G are empty (e.g. can be an air space), thereby alleviating the parasitic capacitance (for example, relative permittivity can be lowered to about 1), thus the transmission speed of signal can be improved, as the skin effect can be alleviated and resistance can be decreased as well. In some embodiments, the removal operation for removing the first photoresist 391 and the second photoresist 392 includes: soaking in a solution including Nitric Acid and Hydrogen Peroxide, elevating a temperature of the solution to a temperature greater than room temperature (such as elevated to a range from about 75° C. to about 85° C.), followed by adding Sulfuric Acid. Alternatively, the removal operation includes plasma oxygen ashing operations. As a result, a remained portion of the copper material layer 301M and a remained portion of the copper material layer 302M thereby respectively become a lower portion 301 and an upper portion 302 of a conductive wiring 303 with corrugated profile on two sides. Alternatively stated, the conductive wiring 303 is a metal feature that includes a plurality of first protrusions 301X protruding downward and extending along X direction, and a plurality of second protrusions 302X protruding upward and extending along X direction, wherein the plurality of first protrusions 301X include second repeated geometrical features, and adjacent second repeated geometrical features defines the gaps 391G. A plurality of surfaces of the corrugated profile is substantially parallel to a direction of electric current flowing therein (such as X direction), thereby alleviating issues of skin effect. In some embodiments, the gaps 391G may effectively lower dielectric coefficient of the interconnect structure. The conductive wiring 303 is electrically connected to the conductive feature 105A through the conductive layer 107.

Figure 8F:
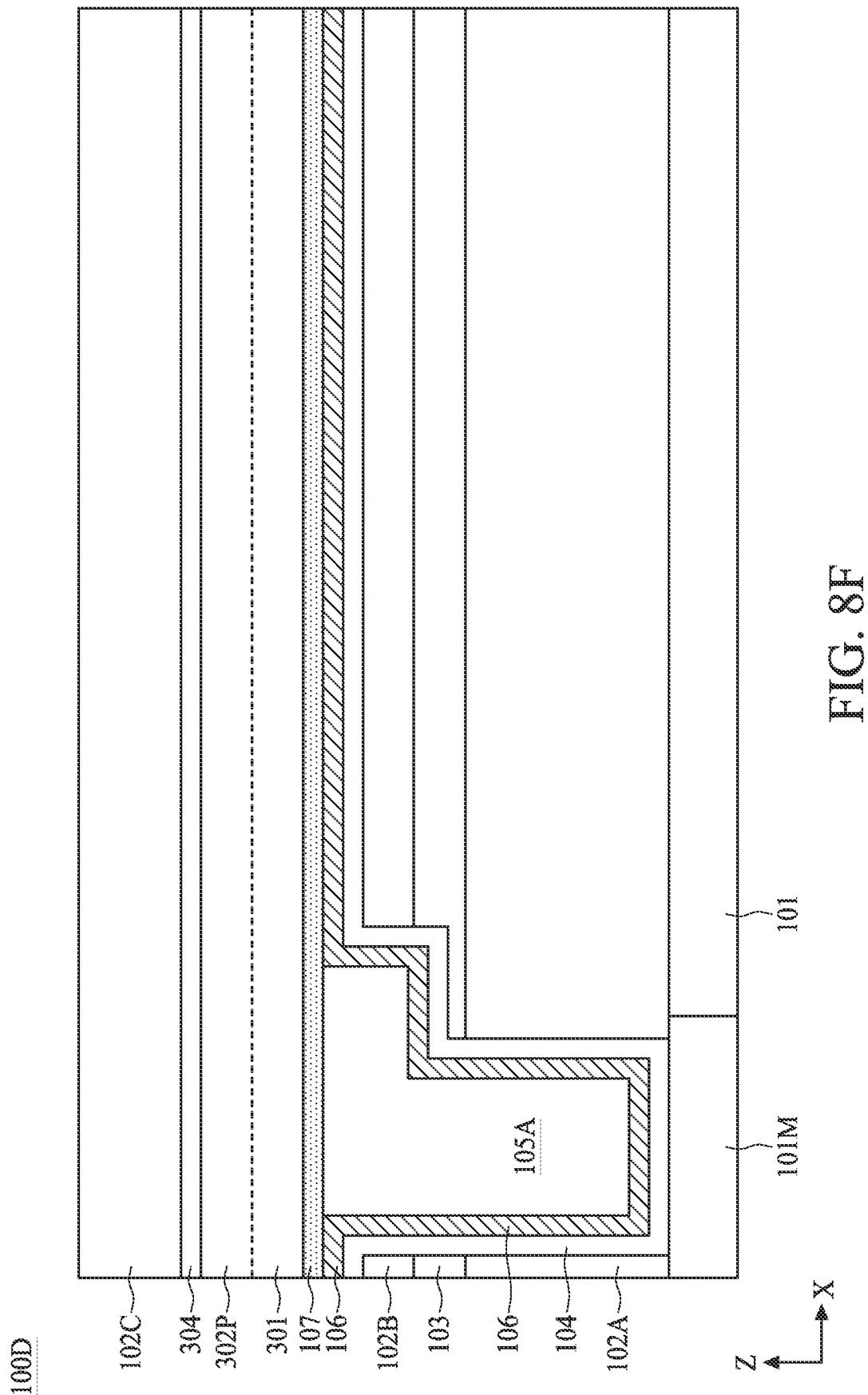
FIG. 8F is a cross section of an interconnect structure during intermediate stages of manufacturing operations, in accordance with some embodiments of the present disclosure.
Figure 8F:
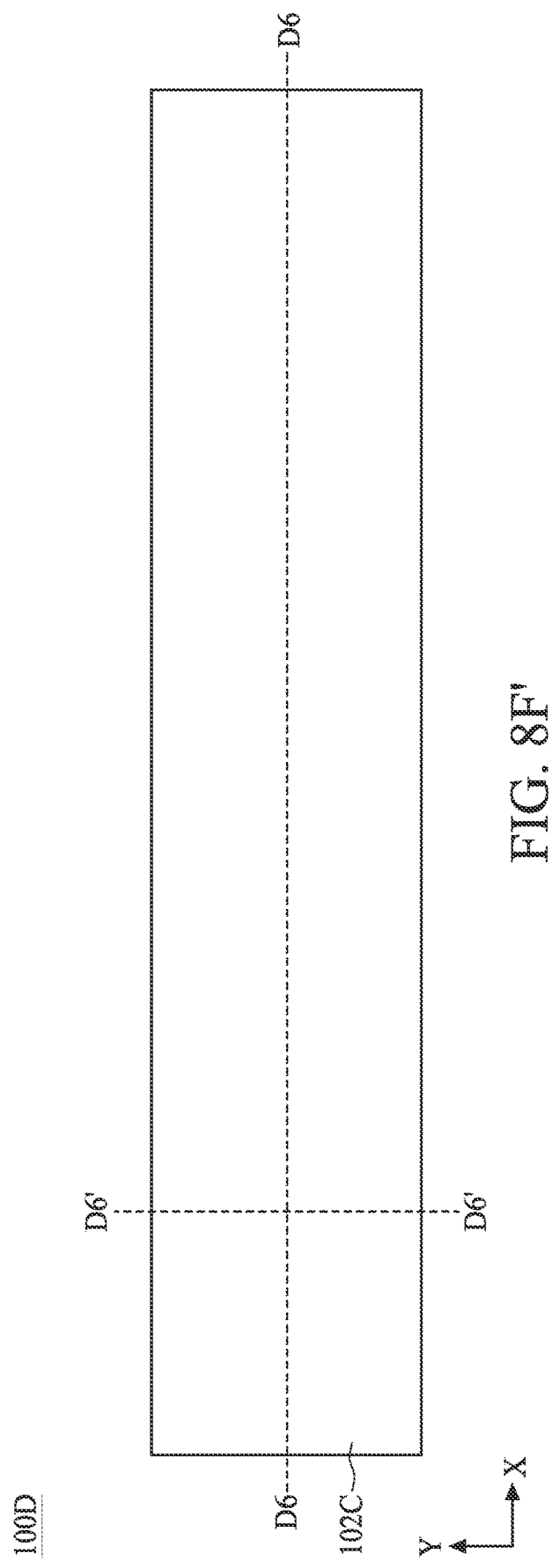

Referring to FIG. 8F, FIG. 8F', and FIG. 8F", FIG. 8F is a cross section of an interconnect structure during intermediate stages of manufacturing operations, FIG. 8F' is a top view of the interconnect structure of FIG. 8F during intermediate stages of manufacturing operations, and FIG. 8F" is a cross section along D6'-D6' of the interconnect structure 100D shown in FIG. 8F', in accordance with some embodiments of the present disclosure. Further, FIG. 8F is an example of cross section D6-D6 of the interconnect structure shown in FIG. 8F'. A capping layer 304 is further formed over the conductive wiring 303. In some embodiments, the capping layer 304 is made by the combination of copper-phosphorous (such as $Cu_3P$) and barrier layers (such as Ti, TiN, TaN, $W_2N$, W, titanium-based material, tantalum-based material, metal nitride, or other suitable material that can alleviate diffusion). The capping layer 304 may help alleviating diffusion issue from the conductive wiring 303, and further alleviating the oxidation of the conductive wiring 303. Further, an upper ILD layer 102C is formed over the capping layer 304. Thereby, an interconnect structure 100D is formed.

In some alternative embodiments, the operations in FIG. 8C to FIG. 8E" are omitted. That is, after forming the copper material layer 301M (as discussed in FIG. 8B, FIG. 8B' and FIG. 8B"), the first photoresist 391 is removed to form the gap(s) 391G, and the upper ILD layer 102C is formed thereon. Alternatively stated, such conductive wiring includes first protrusions 301X protruding downward, and may not include second protrusions 302X protruding upward.

In some alternative embodiments, the techniques discussed in FIG. 7A to FIG. 7E" and FIG. 8A to FIG. 8F" can be applied to a top surface of a dual damascene structure, which will be respectively discussed in FIG. 9A to FIG. 9B and FIG. 10A to FIG. 10B. Particularly, the conductive feature 105A' discussed in FIG. 9A to FIG. 9B and FIG. 10A to FIG. 10B is similar to the conductive feature 105A discussed in FIG. 6A to FIG. 6C, however, the difference resides in that the conductive feature 105A' has an upper portion 105U that is wider and can be used as wiring. In addition, the additional conductive layer 107 may be omitted in FIG. 9A to FIG. 9B and FIG. 10A to FIG. 10B. The conductive feature 105A' further includes a lower portion 105L electrically connecting between the upper portion 105U and the metal line 101M. In the embodiments of FIG. 9A to FIG. 9B and FIG. 10A to FIG. 10B, the current is flowing in Y direction on the conductive line, and change to Z direction when entering the via, so that the edges of the corrugated structure are in the status of being parallel with the direction of the current.

Figure 9B:
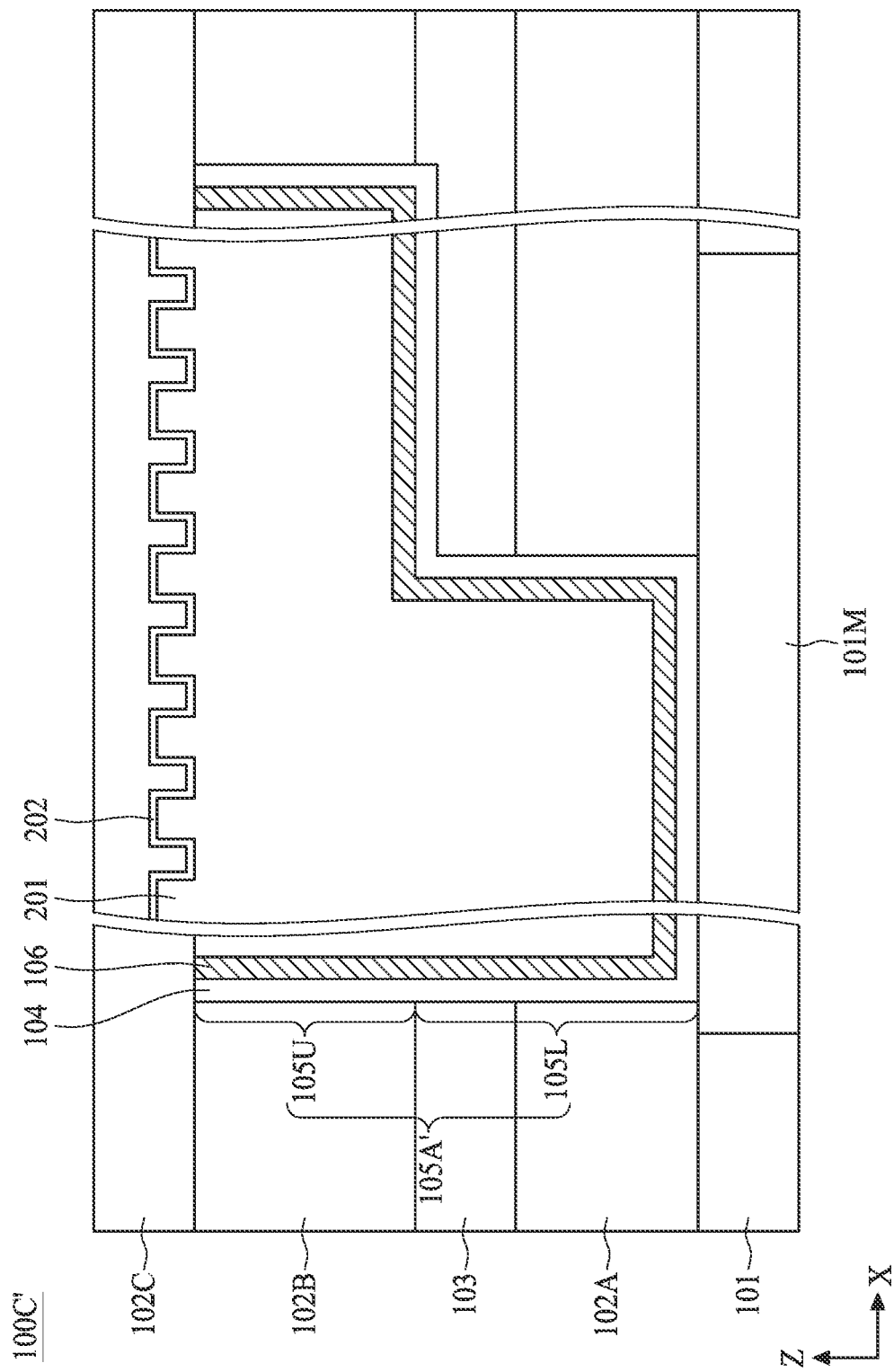

Referring to FIG. 9A to FIG. 9B, FIG. 9A to FIG. 9B are cross sections of an interconnect structure during intermediate stages of manufacturing operations, in accordance with some embodiments of the present disclosure. As shown in FIG. 9A, similar to the discussion in FIG. 7B to FIG. 7C, a photoresist 291 (e.g., can be a positive or a negative resist) is formed and patterned over a top surface 105TS of the upper portion 105U of the conductive feature 105A'. Further, an electroplating operation is performed to form a copper material layer 201M over the photoresist 291 and filling the trenches patterned therein. Further, in FIG. 9B, a lift-off operation is performed to remove the portion of the copper material layer 201M on top of the photoresist 291. The other portion of the copper material layer 201M that fills the trenches may also be consumed by a limited amount due to the shielded position in view of the adjacent higher photoresist 291. A portion of the copper material layer 201M is remained, thereby forming a copper layer 201, which is a metal feature that has protrusions arranged in repeated fashion. A profile of the copper layer 201 is in accordance with the profile of each trenches. In some embodiments, the copper layer 201 is directly stacked over the conductive feature 105A'. The details of such lift-off operation can be referred to FIG. 7D, FIG. 7D', and FIG. 7D". In addition, a capping layer 202 is further formed over the corrugated profile of the copper layer 201. In some embodiments, the capping layer 202 is made of copper-phosphorous (such as $Cu_3P$). The capping layer 202 may help alleviating diffusion issue from the copper layer 201, and further alleviating the oxidation of the copper layer 201. In addition, in the cases that further conductive features are formed over the capping layer 202, the wetting ability of the capping layer 202 can help enhancing the reliability of such additional forming operations. Further, an upper ILD layer 102C is formed over the capping layer 202. Thereby, an interconnect structure 100C' is formed.

Figure 10A:
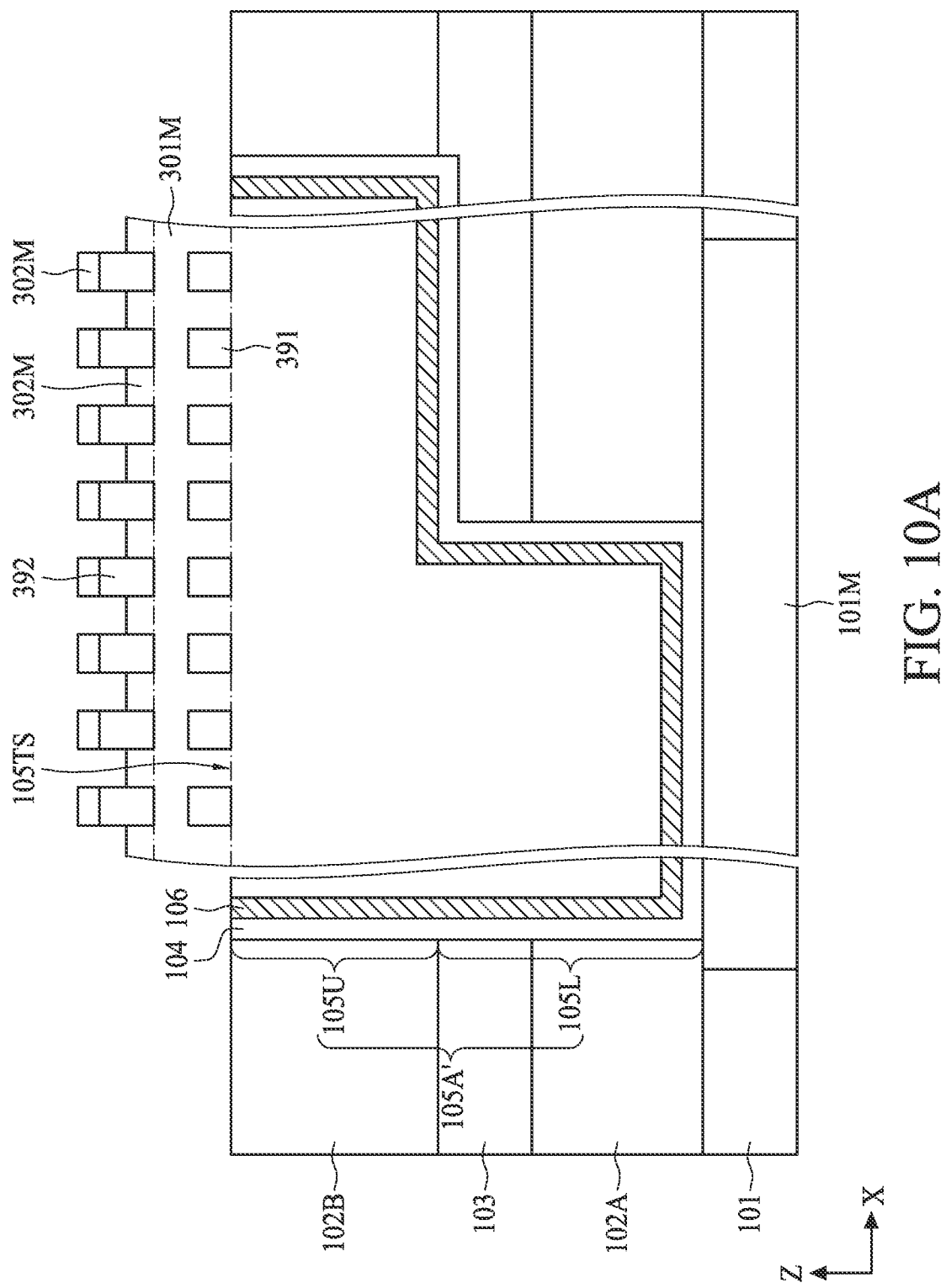
FIG. 10A to FIG. 10B are cross sections of an interconnect structure during intermediate stages of manufacturing operations, in accordance with some embodiments of the present disclosure.
Figure 10B:
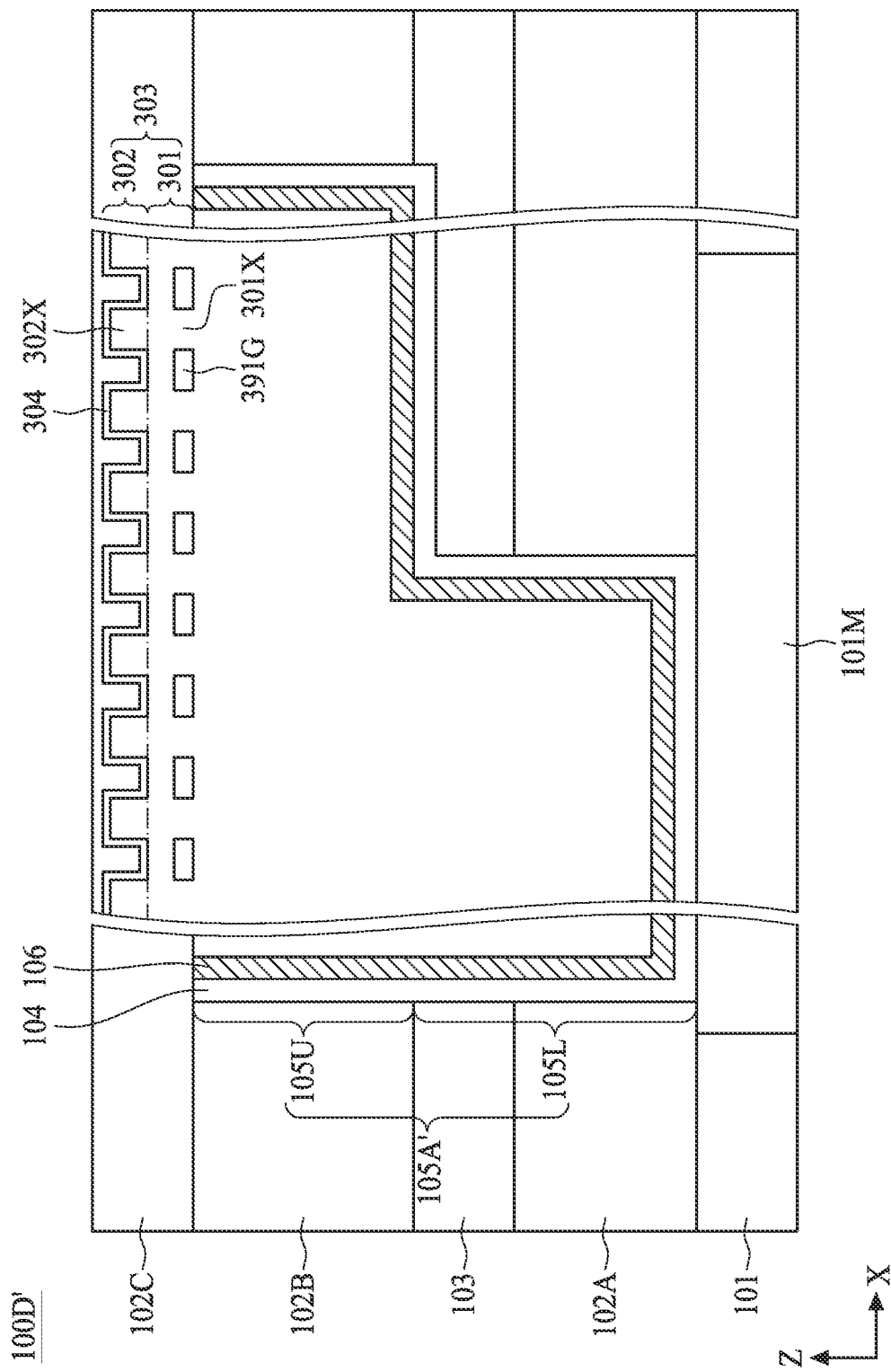

Referring to FIG. 10A to FIG. 10B, FIG. 10A to FIG. 10B are cross sections of an interconnect structure during intermediate stages of manufacturing operations, in accordance with some embodiments of the present disclosure. As shown in FIG. 10A, similar to the discussion in FIG. 8A to FIG. 8D (the details can be referred thereto), a photoresist 391 (e.g., can be a positive or a negative resist) is formed and patterned over a top surface 105TS of the upper portion 105U of the conductive feature 105A'. Subsequently, an electroplating operation is performed to form a copper material layer 301M over the first photoresist 391 and filling the trenches patterned therein. Then, a second photoresist 392 is patterned over the copper material layer 301M, wherein a plurality of trenches that exposes the underlying copper material layer 301M is formed. An electroplating operation is performed to form a copper material layer 302M over the second photoresist 392 and filling the trenches patterned therein. In FIG. 10B, similar to the discussion in FIG. 8E to FIG. 8F, a lift-off operation is performed to remove the portion of the copper material layer 302M on top of the second photoresist 392. The other portion of the copper material layer 302M that fills the trenches may also be consumed by a limited amount due to the shielded position in view of the adjacent higher second photoresist 392. In some of the embodiments, the first photoresist 391 may also be removed, thereby forming gap(s) 391G at positions that was previously filled by first photoresist 391. As a result, a remained portion of the copper material layer 301M and a remained portion of the copper material layer 302M thereby respectively become a lower portion 301 and an upper portion 302 of a conductive wiring 303 with corrugated profile on two sides. Alternatively stated, the conductive wiring 303 is a metal feature that includes a plurality of first protrusions 301X protruding downward and a plurality of second protrusions 302X protruding upward. In some embodiments, the conductive wiring 303 is directly stacked over the conductive feature 105A'. In some embodiments, the gaps 391G may effectively lower dielectric coefficient of the interconnect structure. A capping layer 304 is further formed over the conductive wiring 303. In some embodiments, the capping layer 304 is made of copper-phosphorous (such as $Cu_3P$). The capping layer 304 may help alleviating diffusion issue from the conductive wiring 303, and further alleviating the oxidation of the conductive wiring 303. Further, an upper ILD layer 102C is formed over the capping layer 304. Thereby, an interconnect structure 100D' is formed.

An embodiment for forming an interconnect structure 100B' with a diffusion barrier composite stack 309 is further discussed in FIG. 11A to FIG. 11D.

Figure 11A:
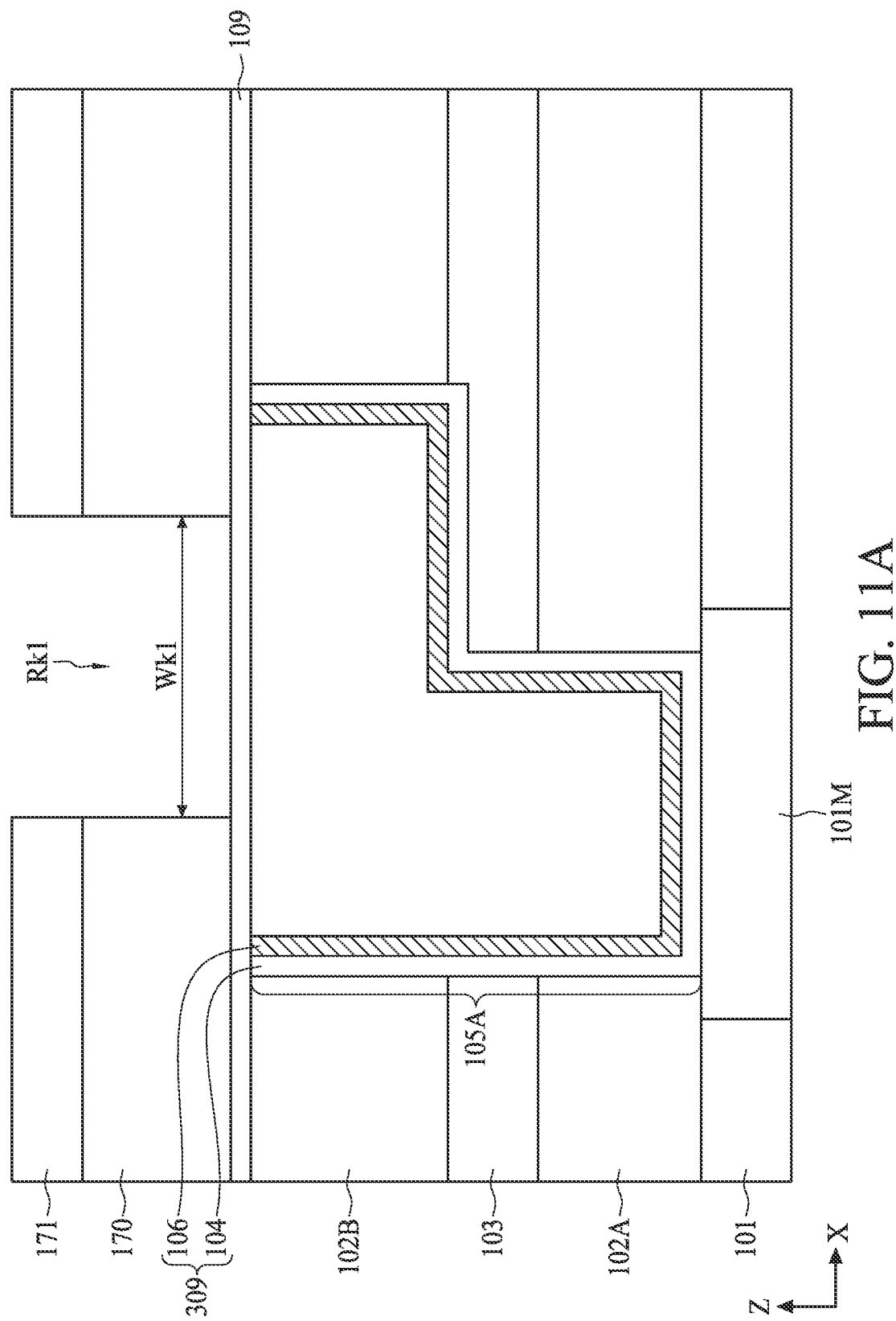
FIG. 11A to FIG. 11D are cross sections of an interconnect structure during intermediate stages of manufacturing operations, in accordance with some embodiments of the present disclosure.

Referring to FIG. 11A, FIG. 11A is a cross section of an interconnect structure during intermediate stages of manufacturing operations, in accordance with some embodiments of the present disclosure. A first conductive feature 105A can be formed by operations discussed in FIG. 1 to FIG. 5 and FIG. 6A to FIG. 6B, wherein a diffusion barrier composite stack 309, including a barrier layer 104 and a copper-phosphorous alloy layer 106, is configured to conform with a sidewall of the first conductive feature 105A. Alternatively, the first conductive feature 105A can be substituted with a conductive via without corrugated structure, which can be formed by a conventional dual damascene operation. The details of the diffusion barrier composite stack 309 can be referred to FIG. 6A to FIG. 6B. Further, an etch stop barrier layer 109 is formed over the top surface of the copper-phosphorous alloy layer 106 and the top surface of the first conductive feature 105A. The etch stop barrier layer 109 can be made of silicon nitride (SiN, which has a dielectric constant about 7) or silicon oxynitride ($SiO_xN_y$, which has a dielectric constant in a range from about 3.9 to about 7.8). Also, the silicon nitride and the silicon oxynitride may also be anti-reflective, especially when an underlying structure includes copper. An upper ILD 170 is formed over the etch stop barrier layer 109, wherein the upper ILD 170 can be made of oxides such as un-doped Silicate Glass (USG), Fluorinated Silicate Glass (FSG), phosphosilicate glass (PSG), borophosphosilicate glass (BPSG), low-k dielectric materials, $SiO_2$, $SiO_2$ doped with carbon, poly (arylether), silsesquioxane polymer, benzocyclobutene, polyimide, polyimide that contains fluoride, or the like. In some embodiments, an anti-reflective coating (ARC) (not shown) is formed over the upper ILD 170. A first photoresist 171 is patterned over the upper ILD 170. A first opening Rk1 having a first width Wk1 is formed in the upper ILD 170 by etching operation (such as plasma etching), wherein the etch stop barrier layer 109 can serve as an etch stop layer to alleviate the issue of over-etching. The first photoresist 171 (and the ARC) can be subsequently removed by ashing operation. It should be noted that the etch stop barrier layer 109 can also protect the underlying first conductive feature 105A from being significantly oxidized.

Figure 11B:
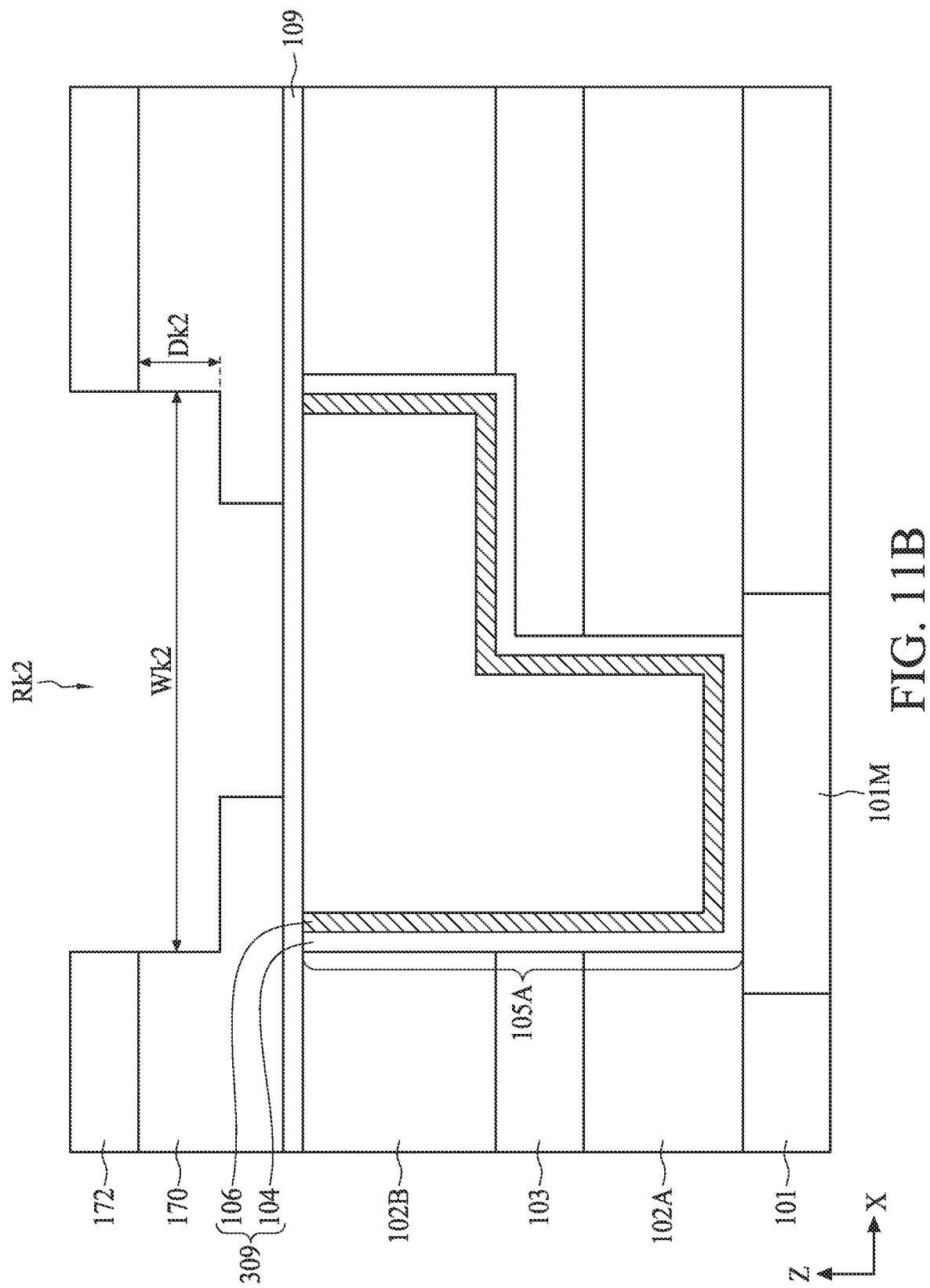

Referring to FIG. 11B, FIG. 11B is a cross section of an interconnect structure during intermediate stages of manufacturing operations, in accordance with some embodiments of the present disclosure. An ARC layer (not shown in FIG. 11B) and a second photoresist 172 is patterned over the upper ILD 170, and a second opening Rk2 having a second width Wk2 is formed in the upper ILD 170 by etching operation (such as plasma etching), wherein the etch stop barrier layer 109 can serve as an etch stop layer to alleviate the issue of over-etching. In some embodiments, the second width Wk2 is greater than the first width Wk1. A depth Dk1 of the second opening Rk2 in the upper ILD 170 may be in a range from about 50 Å to about 5000 Å. An ashing operation is performed to remove the ARC layer (not shown in FIG. 11B) and the second photoresist 172.

Figure 11C:
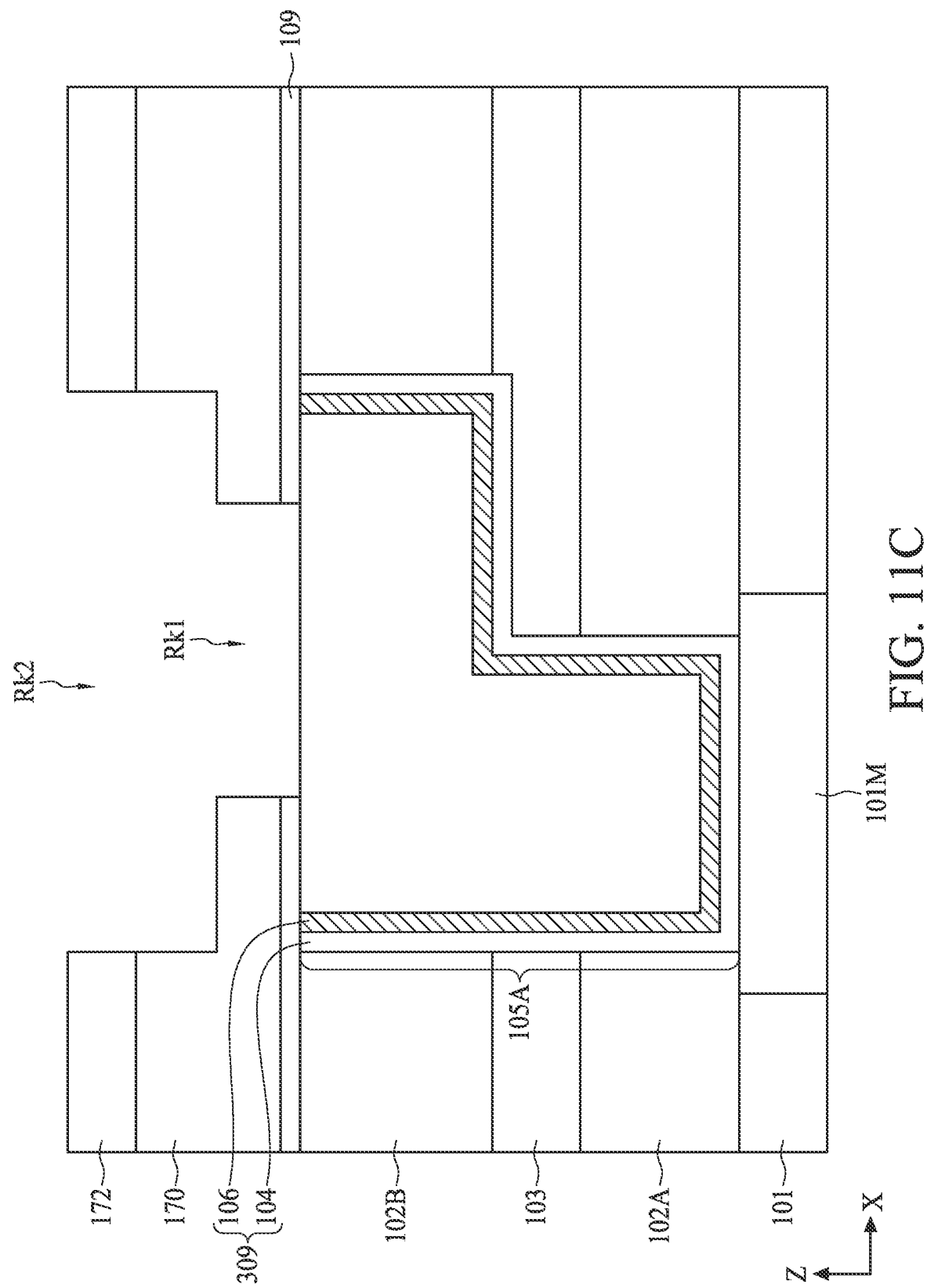

Referring to FIG. 11C, FIG. 11C is a cross section of an interconnect structure during intermediate stages of manufacturing operations, in accordance with some embodiments of the present disclosure. A portion of the etch stop barrier layer 109 is removed to expose the underlying first conductive feature 105A. In some embodiments, such removal operation includes applying hot phosphoric acid with temperature in a range from about 150 to about 200° C.

Figure 11D:
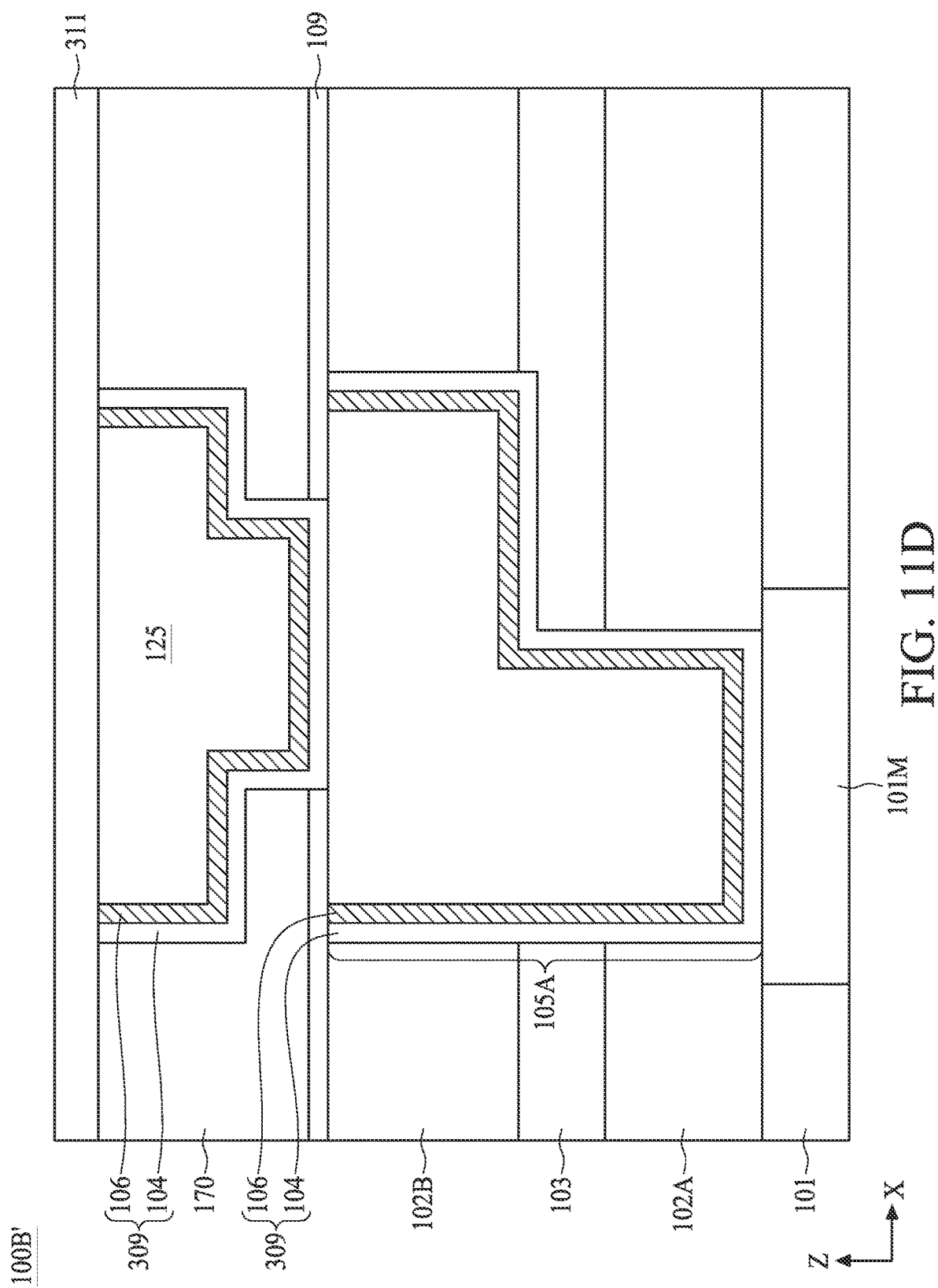

Referring to FIG. 11D, FIG. 11D is a cross section of an interconnect structure during intermediate stages of manufacturing operations, in accordance with some embodiments of the present disclosure. Similar to the operations in FIG. 6A to FIG. 6B, a diffusion barrier composite stack 309, including a barrier layer 104 and a copper-phosphorous alloy layer 106 is formed to conform to the exposed surfaces of the first opening Rk1 and the second opening Rk2 (shown in FIG. 11C). In some embodiments, the diffusion barrier composite stack 309 further extends over the upper ILD 170. A conductive feature 125 is then formed in the first opening Rk1 and the second opening Rk2, which further includes a planarization operation may stop at a top surface of the copper-phosphorous alloy layer 106. A protection layer 311 is formed over the upper ILD 170 and the conductive feature 125. The protection layer 311 can be made of silicon nitride or silicon oxynitride by sputtering or chemical vapor deposition (CVD), and may have a thickness in a range from about 10 Å to about 30 Å.

An alternative embodiment is subsequently discussed in FIG. 12.

Figure 12:
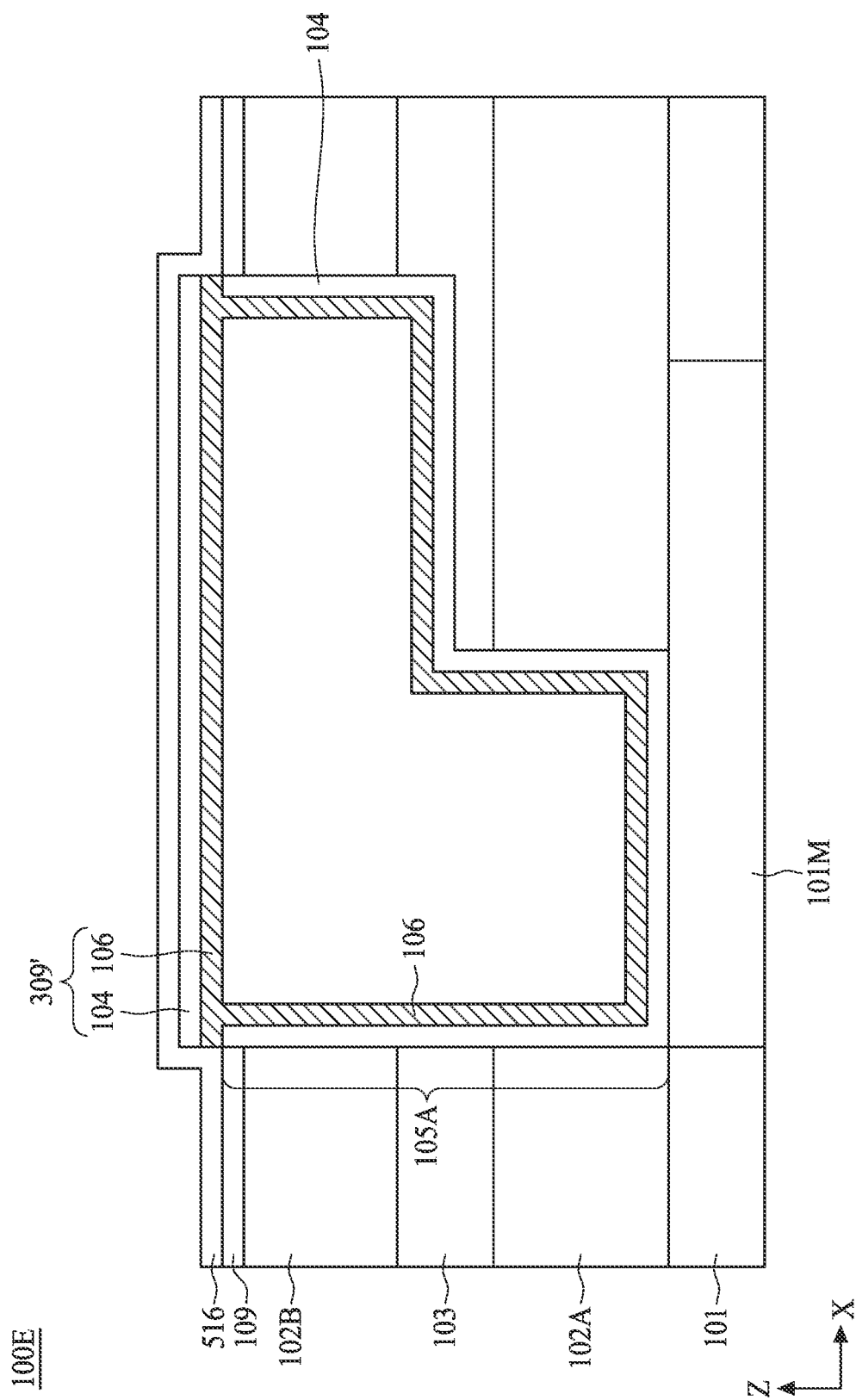
FIG. 12 is a cross section of an interconnect structure, in accordance with some embodiments of the present disclosure.

Referring to FIG. 12, FIG. 12 is a cross section of an interconnect structure during intermediate stages of manufacturing operations, in accordance with some embodiments of the present disclosure. A first conductive feature 105A can be formed by operations discussed in FIG. 1 to FIG. 5 and FIG. 6A to FIG. 6B, wherein a diffusion barrier composite stack 309, including a barrier layer 104 and a copper-phosphorous alloy layer 106, is configured to conform with a sidewall of the first conductive feature 105A. Alternatively, the first conductive feature 105A can be substituted with a conductive via without corrugated structure, which can be formed by a conventional dual damascene operation. An etch stop layer 109 can be formed over the second ILD layer 102B. A diffusion barrier composite stack 309', including a copper-phosphorous alloy layer 106 and a barrier layer 104 over the copper-phosphorous alloy layer 106, is formed over the conductive feature 105A'. In some embodiments, a material of the barrier layer 104 may be Ti, TiN, TaN, $W_2N$, W, titanium-based material, tantalum-based material, metal nitride, or other suitable material that can alleviate diffusion. A protection layer 516 is formed over the etch stop barrier layer 109 and the diffusion barrier composite stack 309', thereby the interconnect structure 100E is formed. In some embodiments, the protection layer 516 may be made of silicon nitride (SiN) or silicon oxynitride (SiOxNy). The protection layer 516 and the diffusion barrier composite stack 309' may help improving the reliability of the interconnect structure 100E due to extraordinary ability of hindering diffusion from copper layer toward adjacent structures (such as overlying ILD layers).

The present disclosure provides methods for forming interconnect structures, which can be applied in semiconductor device (such as integrated circuit, IC interposer, or the like), or integrated circuit carrier and printed circuit board (PCB), et cetera. Especially in advanced technology application (such as $5^{th}$ generation mobile networks, $6^{th}$ generation mobile networks, artificial intelligence, or the like), the issue of resistance is even more important due to skin effect, that is, electrons may accumulate at the surface of conductive wirings (especially when transmitting a high-frequency signal), thereby increasing resistance and deteriorating device performance. By configuring a first conductive feature (such as the first conductive feature 105A as discussed in FIG. 1 to FIG. 6C, an effective surface area of the conductive wirings for transmitting high-frequency signal can be substantially increased to effectively address the issues of skin effect.

In addition, the configuration of the second conductive feature 105B, as well as the configuration of a barrier layer 104 as discussed in FIG. 5 may further alleviate the issue of peeling and dish effects during CMP operation. In some embodiments, copper-phosphorous alloy (such as $Cu_3P$) is utilized as a material of the barrier layer 104. Copper-phosphorous alloy (such as $Cu_3P$) may exhibit improved ability regarding anti-corrosive, wear resistance, wettability, more condensed structure, strength, toughness, conformability, processability, et cetera. Herein the phosphorous constituent in the copper(I) phosphide can be in a range of from about 13.98% to about 14.39%, and the melting temperature is about 1020° C. Thus, the copper-phosphorous alloy exhibits improved strength and toughness even in high temperatures. In addition, the electrical conductivity and the thermal conductivity of copper-phosphorous alloy (such as $Cu_3P$) is comparative to sputtered copper. Generally, the formation of copper-phosphorous alloy (such as $Cu_3P$) by performing electroplating or electroless plating can be nicely compatible to damascene operation, dual damascene operation or other suitable operation for forming interconnect structures.

Furthermore, the incorporation of the diffusion barrier composite stack 309, which has a copper-phosphorous alloy (such as $Cu_3P$) as a wetting layer in an interconnect structure is discussed in FIG. 6A to FIG. 6C, wherein the diffusion barrier composite stack 309 can alleviate void issues and facilitate the conformability of copper layer in a high aspect ratio via. FIG. 11A to FIG. 11D also discussed an embodiment of incorporating the diffusion barrier composite stack 309 in different type of interconnect structure.

In addition, in order to further address the skin effect and the parasitic capacitance, the embodiments of FIG. 7A to FIG. 7E" with conductive wiring having an upper corrugated profile, and the embodiments of FIG. 8A to FIG. 8F" with conductive wiring having a corrugated profile on upper side and/or lower side are provided. Also, the techniques discussed in FIG. 7A to FIG. 7E" and FIG. 8A to FIG. 8F" can be applied to a top surface of a dual damascene structure, which was respectively discussed in FIG. 9A to FIG. 9B and FIG. 10A to FIG. 10B. By incorporating special lift-off techniques along with selection of properties of specific photoresist material, the corrugated profile of conductive structures can be formed in order to alleviate skin effect issues. In some embodiments, the metal features discussed in FIG. 7A to FIG. 7E", FIG. 8A to FIG. 8F", FIG. 9A to FIG. 9B and FIG. 10A to FIG. 10B (copper layer 201 discussed in FIG. 7A to FIG. 7E" and FIG. 9A to FIG. 9B, the conductive wiring 303 discussed in FIG. 8A to FIG. 8F" and FIG. 10A to FIG. 10B) can be a top metal line (e.g. uppermost metal line in a device) configured to carry high frequency signal.

Furthermore, as discussed in FIG. 12, a diffusion barrier composite stack 309' and a protection layer 516 may be selectively formed over the top surface of a conductive feature, wherein the configuration helps preventing copper diffusion toward overlying interlayer dielectric layers.

It should be appreciated by the person having ordinary skill in the art that, the interconnect structure disclosed herein can be employed to any structure in the IC industry that requires interconnection, regardless of the dimension and material composition. For one example, the interconnect structure may include one or more vertical conductive via(s), with or without corrugated feature described herein, connecting to one or more horizontal conductive line(s), with or without corrugated feature described herein, of adjacent or stacked layers in a back-end-of-line structure. The dielectric material of such back-end-of-line structure may include inorganic materials such as silicon nitride, silicon oxide, silicon oxynitride, or the like. The manufacturing method of such back-end-of-line structure may in part associate with the Damascene or Dual-Damascene operation. For another example, the interconnect structure may include one or more vertical conductive via(s), with or without corrugated feature described herein, connecting to one or more horizontal conductive line(s), with or without corrugated feature described herein, of adjacent or stacked layers in an interposer structure (active or passive). The interposer structure may include silicon (or glass, or polymer) interposer or other kinds of semiconductor and insulating interposers. The manufacturing method of such interposer structure may in part associate with silicon (or PCB) photolithography and metal deposition operations. For another example, the interconnect structure may include one or more vertical conductive via(s), with or without corrugated feature described herein, connecting to one or more horizontal conductive line(s), with or without corrugated feature described herein, of adjacent or stacked layers in a build-up film structure. The dielectric material of the build-up film structure may include organic material such as epoxy-based material, Pre-preg, FR4, ABF, or the like. The manufacturing method of such build-up film may in part associate with the lamination, spin-coating, mechanical drilling, or laser drilling operations.

Some embodiments of the present disclosure provide an interconnect structure, including a first metal line, a first interlayer dielectric (ILD) layer over the first metal line, a first conductive feature over the first metal line, wherein at least a portion of the first conductive feature is laterally surrounded by the first ILD layer, and a sidewall of the first conductive feature has a corrugated profile.

Some embodiments of the present disclosure provide an interconnect structure, including a first dielectric layer, a metal feature on the first dielectric layer, a second dielectric layer over the first dielectric layer and covering the metal feature, wherein the metal feature extends in a primary direction along a boundary between the first dielectric layer and the second dielectric layer, and includes first repeated geometrical features protruding toward a secondary direction substantially orthogonal to the primary direction, a thickness of the repeated geometrical features being smaller than a thickness of the second dielectric layer, and wherein the first dielectric layer and the second dielectric layer are composed of inorganic material.

Some embodiments of the present disclosure provide a method for forming an interconnect structure, including forming a first metal line, forming a first interlayer dielectric (ILD) layer over the first metal line, and forming a conductive feature having a corrugated profile in or over the first ILD layer, forming the conductive feature including patterning a photoresist layer to define a corrugated surface and forming a conductive material that conforms with the corrugated surface.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An interconnect structure, comprising:
   a first metal line;
   a first interlayer dielectric (ILD) layer over the first metal line;
   a first conductive feature over the first metal line, wherein at least a portion of the first conductive feature is laterally surrounded by the first ILD layer, and a sidewall of the first conductive feature has a corrugated profile, wherein the first conductive feature comprises:
      a primary portion extending along a vertical direction; and
      a plurality of secondary portions extending away from the primary portion and forming the corrugated profile, wherein a top surface of the primary portion is leveled with a top surface of a first secondary portion in the plurality of secondary portions.

2. The interconnect structure of claim 1, wherein the plurality of secondary portions extend from a top surface of the first ILD layer toward the first metal line.

3. The interconnect structure of claim 1, wherein the first ILD layer comprises a first sidewall and a second sidewall free from being parallel to the first sidewall, wherein at least a portion of the primary portion of the first conductive feature is proximal to the first sidewall of the first ILD layer, and at least a portion of the first secondary portion of the first conductive feature is proximal to the second sidewall of the first ILD layer.

4. The interconnect structure of claim 3, further comprising an etch stop layer over the first ILD layer, wherein the etch stop layer has a sidewall aligning with the second sidewall of the first ILD layer.

5. The interconnect structure of claim 2, wherein a ratio of a width of the first secondary portion over a width of the first conductive feature is in a range of from 10% to 90%.

6. The interconnect structure of claim 2, wherein the plurality of secondary portions comprise repeated protrusions.

7. The interconnect structure of claim 1, further comprising a barrier layer surrounding the first conductive feature, wherein the barrier layer conforms to the corrugated profile.

8. The interconnect structure of claim 7, further comprising a copper-phosphorous alloy layer conforming to the barrier layer and the corrugated profile of the first conductive feature.

9. The interconnect structure of claim 8, further comprising a wetting layer conforming to the barrier layer.

10. The interconnect structure of claim 1, further comprising a second conductive feature electrically connected to the first conductive feature, and the second conductive feature comprises repeated protrusions.

11. The interconnect structure of claim 10, wherein the second conductive feature is positioned on the first conductive feature.

12. The interconnect structure of claim 1, wherein a bottom surface of the primary portion is leveled with a bottom surface of the first secondary portion.

13. An interconnect structure, comprising:
   a first dielectric layer;
   a metal feature on the first dielectric layer; and
   a second dielectric layer over the first dielectric layer and covering the metal feature,
   wherein the metal feature extends in a primary direction along a boundary between the first dielectric layer and the second dielectric layer, and comprises first repeated geometrical features protruding toward a secondary direction substantially orthogonal to the boundary between the first dielectric layer and the second dielectric layer, a thickness of the first repeated geometrical features being smaller than a thickness of the second dielectric layer, and
   wherein the first dielectric layer and the second dielectric layer are composed of inorganic material.

14. The interconnect structure of claim 13, further comprising second repeated geometrical features protruding toward a tertiary direction substantially orthogonal to the primary direction, wherein adjacent two of the second repeated geometrical features define an air space.

15. The interconnect structure of claim 13, further comprising a conductive via structure projectively stacked and in physical contact with the metal feature.

16. The interconnect structure of claim 13, wherein the metal feature is a top metal line configured to carry high frequency signal.

17. A method for forming an interconnect structure, comprising:
   forming a first metal line;
   forming a first interlayer dielectric (ILD) layer over the first metal line; and
   forming a conductive feature having a corrugated profile in or over the first ILD layer, forming the conductive feature comprising:
      patterning a photoresist layer to define a corrugated surface; and
      forming a conductive material that conforms with the corrugated surface.

18. The method of claim 17, wherein the corrugated surface comprises a surface profile of the photoresist layer or a surface profile of the first ILD layer.

19. The method of claim 18, further comprising a lift-off operation after forming the conductive material that conforms to the corrugated surface.

20. The method of claim 17, wherein forming the conductive feature further comprises:
   patterning a first photoresist layer to define a first corrugated surface;
   forming a first conductive material that conforms to the first corrugated surface;

patterning a second photoresist layer to define a second corrugated surface; and forming a second conductive material that conforms to the second corrugated surface.

21. The method of claim 20, further comprising removing the first photoresist layer and the second photoresist layer in one removal operation.

22. An interconnect structure, comprising: a first metal line; a first interlayer dielectric (ILD) layer over the first metal line; and a first conductive feature over the first metal line, the first conductive feature comprises at least one outer sidewall and at least one inner sidewall from a top view perspective, the at least one inner sidewall defining a region to accommodate a portion of the first ILD layer, wherein the at least one outer sidewall and the at least one inner sidewall are arranged on a same horizontal plane.

23. The interconnect structure of claim 22, further comprising a plurality of regions defined by the at least one inner sidewall.

24. The interconnect structure of claim 23, further comprising a barrier layer covering the at least one inner sidewall in each of the plurality of regions.

25. The interconnect structure of claim 24, further comprising a copper-phosphorous alloy layer, wherein the barrier layer laterally surrounds the copper phosphorus alloy layer in each of the plurality of regions.

* * * * *